United States Patent
Huska et al.

(10) Patent No.: US 12,165,895 B2
(45) Date of Patent: *Dec. 10, 2024

(54) APPARATUSES FOR EXECUTING A DIRECT TRANSFER OF A SEMICONDUCTOR DEVICE DIE DISPOSED ON A FIRST SUBSTRATE TO A SECOND SUBSTRATE

(71) Applicant: Rohinni, Inc., Liberty Lake, WA (US)

(72) Inventors: Andrew Huska, Liberty Lake, WA (US); Justin Wendt, Post Falls, ID (US); Luke Dupin, Liberty Lake, WA (US); Cody Peterson, Hayden Lake, ID (US)

(73) Assignee: Cowles Semi, LLC, Spokane, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/233,790

(22) Filed: Aug. 14, 2023

(65) Prior Publication Data

US 2024/0038564 A1 Feb. 1, 2024

Related U.S. Application Data

(60) Continuation of application No. 17/402,987, filed on Aug. 16, 2021, now Pat. No. 11,728,195, which is a
(Continued)

(51) Int. Cl.
*H01L 21/677* (2006.01)
*H01L 21/67* (2006.01)
*H01L 21/683* (2006.01)

(52) U.S. Cl.
CPC .. *H01L 21/67781* (2013.01); *H01L 21/67265* (2013.01); *H01L 21/67706* (2013.01);
(Continued)

(58) Field of Classification Search
CPC ............. Y10T 428/25; Y10T 428/2861; Y10T 29/49826; Y10T 29/53174;
(Continued)

(56) References Cited

U.S. PATENT DOCUMENTS 3,724,068 A 4/1973 Galli
3,887,996 A 6/1975 Hartleroad et al.
(Continued)

FOREIGN PATENT DOCUMENTS

CN 1265226 A 8/2000
CN 1370306 9/2002
(Continued)

OTHER PUBLICATIONS

Chinese Office Action mailed Dec. 23, 2020 for Chinese Patent Application No. 201910706964.0, a counterpart foreign application of U.S. Pat. No. 9,633,883, 19 pages.
(Continued)

*Primary Examiner* — Thiem D Phan
(74) *Attorney, Agent, or Firm* — Lee & Hayes, P.C.

(57) ABSTRACT

An apparatus for executing a direct transfer of a semiconductor device die from a first substrate to a second substrate. The apparatus includes a first substrate conveyance mechanism movable in two axes. A micro-adjustment mechanism is coupled with the first substrate conveyance mechanism and is configured to hold the first substrate and to make positional adjustments on a scale smaller than positional adjustments caused by the first substrate conveyance mechanism. The micro-adjustment mechanism includes a micro-adjustment actuator having a distal end and a first substrate holder frame that is movable via contact with the distal end of the micro-adjustment actuator. A second frame is configured to secure the second substrate such that a transfer surface is disposed facing the semiconductor device die
(Continued)

disposed on a surface of the first substrate. A transfer mechanism is configured to press the semiconductor device die into contact with the transfer surface of the substrate.

13 Claims, 24 Drawing Sheets

Related U.S. Application Data division of application No. 16/147,456, filed on Sep. 28, 2018, now Pat. No. 11,094,571.

(52) U.S. Cl.
CPC ....... *H01L 21/6836* (2013.01); *Y10T 29/5313* (2015.01); *Y10T 29/53174* (2015.01)

(58) Field of Classification Search
CPC .......... Y10T 29/53178; Y10T 29/5313; H05K 2203/0195; H01L 21/67781
USPC .......... 29/739, 729, 740, 741, 743, 760, 832
See application file for complete search history.

(56) References Cited

U.S. PATENT DOCUMENTS

| | | | |
|---|---|---|---|
| 4,667,402 A | 5/1987 | Wilde | |
| 4,859,267 A | 8/1989 | Knoll | |
| 4,859,269 A | 8/1989 | Nishiguchi | |
| 4,906,812 A | 3/1990 | Nied et al. | |
| 5,105,255 A | 4/1992 | Shannon et al. | |
| 5,270,260 A | 12/1993 | Scheuenpflug | |
| 5,362,681 A | 11/1994 | Roberts, Jr. et al. | |
| 5,415,331 A | 5/1995 | Lin | |
| 5,670,429 A | 9/1997 | Murayama | |
| 5,951,918 A | 9/1999 | Kuwajima et al. | |
| 5,976,912 A | 11/1999 | Fukutomi et al. | |
| 6,002,180 A | 12/1999 | Akram et al. | |
| 6,080,336 A | 6/2000 | Suehiro et al. | |
| 6,085,573 A | 7/2000 | Larson | |
| 6,091,332 A | 7/2000 | Eberhardt et al. | |
| 6,171,736 B1 | 1/2001 | Hirayanagi | |
| 6,173,750 B1 | 1/2001 | Davis et al. | |
| 6,204,092 B1 * | 3/2001 | Freund | H01L 21/67132 |
| | | | 438/464 |
| 6,207,473 B1 | 3/2001 | Hirai et al. | |
| 6,228,676 B1 | 5/2001 | Glenn et al. | |
| 6,238,597 B1 | 5/2001 | Yim et al. | |
| 6,284,569 B1 | 9/2001 | Sheppard et al. | |
| 6,284,998 B1 | 9/2001 | Sinkunas et al. | |
| 6,311,950 B1 | 11/2001 | Kappel et al. | |
| 6,319,754 B1 | 11/2001 | Wang et al. | |
| 6,323,659 B1 | 11/2001 | Krahn | |
| 6,352,073 B1 | 3/2002 | Kurosawa et al. | |
| 6,353,202 B1 | 3/2002 | Grotsch et al. | |
| 6,404,131 B1 | 6/2002 | Kawano et al. | |
| 6,538,254 B1 | 3/2003 | Tomimatsu et al. | |
| 6,589,809 B1 | 7/2003 | Koopmans | |
| 6,637,905 B1 | 10/2003 | Ng et al. | |
| 6,713,714 B1 | 3/2004 | Azdasht | |
| 6,730,933 B1 | 5/2004 | Shimizu et al. | |
| 6,770,961 B2 | 8/2004 | Lee | |
| 6,889,427 B2 | 5/2005 | Yee et al. | |
| 6,961,111 B1 | 11/2005 | Kuramasu | |
| 7,060,593 B2 | 6/2006 | Kurosawa et al. | |
| 7,102,524 B2 | 9/2006 | Arneson et al. | |
| 7,192,843 B2 | 3/2007 | Kito | |
| 7,279,346 B2 | 10/2007 | Andrews et al. | |
| 7,279,347 B2 | 10/2007 | Hon et al. | |
| 7,364,983 B2 | 4/2008 | Wang et al. | |
| 7,445,688 B2 | 11/2008 | Suzuki et al. | |
| 7,510,747 B2 | 3/2009 | Choi et al. | |
| 7,560,303 B2 | 7/2009 | Wang et al. | |
| 7,623,034 B2 | 11/2009 | Ferguson et al. | |
| 7,632,587 B2 | 12/2009 | McLean et al. | |
| 7,637,714 B2 | 12/2009 | Kabeshita et al. | |
| 7,654,687 B2 | 2/2010 | Tsai et al. | |
| 7,757,742 B2 | 7/2010 | Cheung et al. | |
| 7,795,076 B2 | 9/2010 | Arneson et al. | |
| 7,857,569 B2 | 12/2010 | Hiroki et al. | |
| 7,886,438 B2 | 2/2011 | Ito et al. | |
| 7,906,787 B2 | 3/2011 | Kang | |
| 8,034,647 B2 | 10/2011 | Batres et al. | |
| 8,110,839 B2 | 2/2012 | Ing et al. | |
| 8,136,231 B2 | 3/2012 | Schiller | |
| 8,141,612 B2 | 3/2012 | Chan et al. | |
| 8,142,611 B2 | 3/2012 | Shibata et al. | |
| 8,198,176 B2 | 6/2012 | Hatakeyama et al. | |
| 8,221,583 B2 | 7/2012 | Min et al. | |
| 8,344,397 B2 | 1/2013 | Lerman et al. | |
| 8,361,840 B2 | 1/2013 | Kerr et al. | |
| 8,415,771 B1 | 4/2013 | Golda et al. | |
| 8,415,879 B2 | 4/2013 | Lowenthal et al. | |
| 8,791,530 B2 | 7/2014 | Bibl et al. | |
| 8,794,501 B2 | 8/2014 | Bibl et al. | |
| 8,835,940 B2 | 9/2014 | Hu et al. | |
| 8,865,489 B2 | 10/2014 | Rogers et al. | |
| 8,928,021 B1 | 1/2015 | Bibl et al. | |
| 8,933,433 B2 | 1/2015 | Higginson et al. | |
| 8,948,905 B2 | 2/2015 | Prakapenka et al. | |
| 8,998,068 B2 | 4/2015 | Park et al. | |
| 9,000,470 B2 | 4/2015 | Tudorica et al. | |
| 9,000,566 B2 | 4/2015 | Golda et al. | |
| 9,069,128 B2 | 6/2015 | Kuroda et al. | |
| 9,082,936 B2 | 7/2015 | Baldridge et al. | |
| 9,087,764 B2 | 7/2015 | Chan et al. | |
| 9,099,568 B2 | 8/2015 | Blanchard | |
| 9,105,714 B2 | 8/2015 | Hu et al. | |
| 9,106,056 B1 | 8/2015 | Hersee | |
| 9,111,984 B2 | 8/2015 | Sanchez et al. | |
| 9,136,161 B2 | 9/2015 | Bibl et al. | |
| 9,142,535 B2 | 9/2015 | Oraw | |
| 9,153,171 B2 | 10/2015 | Sakariya et al. | |
| 9,159,707 B2 | 10/2015 | Cope | |
| 9,166,114 B2 | 10/2015 | Hu et al. | |
| 9,166,126 B2 | 10/2015 | Donofrio et al. | |
| 9,217,541 B2 | 12/2015 | Bathurst et al. | |
| 9,224,629 B2 | 12/2015 | Golda et al. | |
| 9,229,597 B2 | 1/2016 | Oraw | |
| 9,236,815 B2 | 1/2016 | Golda et al. | |
| 9,255,001 B2 | 2/2016 | Golda et al. | |
| 9,288,899 B2 | 3/2016 | Golda et al. | |
| 9,296,111 B2 | 3/2016 | Bibl et al. | |
| 9,308,649 B2 | 4/2016 | Golda et al. | |
| 9,314,930 B2 | 4/2016 | Golda et al. | |
| 9,318,475 B2 | 4/2016 | Bibl et al. | |
| 9,324,692 B2 | 4/2016 | Lowenthal et al. | |
| 9,324,693 B2 | 4/2016 | Oraw et al. | |
| 9,368,549 B1 | 6/2016 | Oraw et al. | |
| 9,370,864 B2 | 6/2016 | Bibl et al. | |
| 9,379,092 B2 | 6/2016 | Hu et al. | |
| 9,391,042 B2 | 7/2016 | Golda et al. | |
| 9,418,979 B2 | 8/2016 | Karlicek, Jr. et al. | |
| 9,425,151 B2 | 8/2016 | Golda et al. | |
| 9,450,043 B2 | 9/2016 | Nuzzo et al. | |
| 9,490,407 B2 | 11/2016 | Ray et al. | |
| 9,508,694 B2 | 11/2016 | Oraw et al. | |
| 9,570,427 B2 | 2/2017 | Bibl et al. | |
| 9,583,466 B2 | 2/2017 | McGroddy et al. | |
| 9,583,533 B2 | 2/2017 | Hu et al. | |
| 9,595,638 B2 | 3/2017 | Ahn et al. | |
| 9,633,883 B2 | 4/2017 | Huska et al. | |
| 9,666,764 B2 | 5/2017 | Bergmann et al. | |
| 9,871,023 B2 | 1/2018 | Huska et al. | |
| 9,897,266 B2 | 2/2018 | Moon et al. | |
| 10,141,215 B2 | 11/2018 | Wendt et al. | |
| 10,297,478 B2 * | 5/2019 | Peterson | H01L 24/16 |
| 10,373,937 B2 | 8/2019 | Huska et al. | |
| 10,615,152 B2 | 4/2020 | Huska et al. | |
| 11,094,571 B2 | 8/2021 | Huska et al. | |
| 11,183,478 B2 | 11/2021 | Huska et al. | |
| 2001/0040620 A1 | 11/2001 | Wakisaka et al. | |
| 2001/0047225 A1 | 11/2001 | Shimoike et al. | |
| 2002/0019074 A1 | 2/2002 | Nakazawa et al. | |

(56) References Cited

U.S. PATENT DOCUMENTS

| | | |
|---|---|---|
| 2002/0043923 A1 | 4/2002 | Natori |
| 2002/0069952 A1 | 6/2002 | Kurosawa |
| 2002/0102760 A1 | 8/2002 | Gottfried |
| 2002/0149092 A1 | 10/2002 | Lee |
| 2003/0140486 A1 | 7/2003 | Chen et al. |
| 2003/0153099 A1 | 8/2003 | Jiang et al. |
| 2003/0230799 A1 | 12/2003 | Yee et al. |
| 2004/0020037 A1 | 2/2004 | Arneson et al. |
| 2004/0020039 A1 | 2/2004 | Arneson et al. |
| 2004/0020040 A1 | 2/2004 | Arneson et al. |
| 2004/0239861 A1 | 12/2004 | Uchida |
| 2004/0250417 A1 | 12/2004 | Arneson et al. |
| 2005/0007516 A1 | 1/2005 | Hong et al. |
| 2005/0009244 A1 | 1/2005 | Shiobara et al. |
| 2005/0015970 A1 | 1/2005 | Arneson et al. |
| 2005/0057906 A1 | 3/2005 | Nakatani et al. |
| 2005/0101052 A1 | 5/2005 | Kobayashi et al. |
| 2005/0115602 A1 | 6/2005 | Senta et al. |
| 2005/0155792 A1 | 7/2005 | Ito et al. |
| 2005/0170613 A1 | 8/2005 | Murata et al. |
| 2005/0237765 A1 | 10/2005 | Suehiro et al. |
| 2005/0253161 A1 | 11/2005 | Horio et al. |
| 2005/0282355 A1 | 12/2005 | Edwards et al. |
| 2006/0002146 A1 | 1/2006 | Baba |
| 2006/0003491 A1 | 1/2006 | Kim et al. |
| 2006/0076690 A1 | 4/2006 | Khandros et al. |
| 2006/0084239 A1 | 4/2006 | Nagai et al. |
| 2006/0145125 A1 | 7/2006 | Kuwajima et al. |
| 2006/0166466 A1 | 7/2006 | Maki et al. |
| 2006/0180344 A1 | 8/2006 | Ito et al. |
| 2006/0181600 A1 | 8/2006 | Bourdelais et al. |
| 2006/0225273 A1 | 10/2006 | Arneson et al. |
| 2007/0076433 A1 | 4/2007 | Kinoshita et al. |
| 2007/0086211 A1 | 4/2007 | Beeson et al. |
| 2007/0087279 A1 | 4/2007 | Otsuka |
| 2007/0095791 A1 | 5/2007 | Shinozaki et al. |
| 2007/0128306 A1 | 6/2007 | Cheung |
| 2007/0131016 A1 | 6/2007 | Addison et al. |
| 2007/0138494 A1 | 6/2007 | Pugh et al. |
| 2007/0152577 A1 | 7/2007 | Cho et al. |
| 2007/0164260 A1 | 7/2007 | Kuwajima |
| 2007/0171651 A1 | 7/2007 | Park et al. |
| 2007/0263190 A1 | 11/2007 | De Boeij et al. |
| 2008/0005895 A1 | 1/2008 | Aoyama et al. |
| 2008/0032484 A1 | 2/2008 | Diep et al. |
| 2008/0060750 A1 | 3/2008 | Wang et al. |
| 2008/0118681 A1 | 5/2008 | Ueno |
| 2008/0124842 A1 | 5/2008 | Wang et al. |
| 2008/0145968 A1 | 6/2008 | Hiew et al. |
| 2008/0185972 A1 | 8/2008 | Ito |
| 2008/0266872 A1 | 10/2008 | Chang |
| 2008/0267745 A1 | 10/2008 | Schiller |
| 2009/0030312 A1 | 1/2009 | Hadjicostis |
| 2009/0032295 A1 | 2/2009 | Okajima et al. |
| 2009/0039376 A1 | 2/2009 | Uemoto et al. |
| 2009/0065588 A1 | 3/2009 | Aoki et al. |
| 2009/0090468 A1 | 4/2009 | Murayama |
| 2009/0095963 A1 | 4/2009 | Daniels |
| 2009/0096413 A1 | 4/2009 | Partovi et al. |
| 2009/0155026 A1 | 6/2009 | Alberti et al. |
| 2009/0217522 A1 | 9/2009 | Ito et al. |
| 2009/0283220 A1 | 11/2009 | Chen |
| 2010/0044845 A1 | 2/2010 | Funaya et al. |
| 2010/0073597 A1 | 3/2010 | Bierhuizen et al. |
| 2010/0075459 A1 | 3/2010 | Kerr et al. |
| 2010/0178722 A1 | 7/2010 | de Graff et al. |
| 2010/0200898 A1 | 8/2010 | Lin et al. |
| 2010/0246152 A1 | 9/2010 | Lin et al. |
| 2010/0311227 A1 | 12/2010 | Hatakeyama et al. |
| 2011/0034912 A1 | 2/2011 | de Graff et al. |
| 2011/0089443 A1 | 4/2011 | Hsu |
| 2011/0120761 A1 | 5/2011 | Kawai |
| 2011/0123796 A1 | 5/2011 | Auman et al. |
| 2011/0175518 A1 | 7/2011 | Reed et al. |
| 2011/0180137 A1 | 7/2011 | Iwamuro et al. |
| 2011/0180138 A1 | 7/2011 | Adachi et al. |
| 2011/0209751 A1 | 9/2011 | Nojiri et al. |
| 2011/0232082 A1 | 9/2011 | Kim et al. |
| 2011/0277831 A1 | 11/2011 | Yoshida et al. |
| 2011/0315956 A1 | 12/2011 | Tischler et al. |
| 2011/0317417 A1 | 12/2011 | Gourlay |
| 2012/0044441 A1 | 2/2012 | Shigeta et al. |
| 2012/0049204 A1 | 3/2012 | Lai |
| 2012/0070570 A1 | 3/2012 | Kim et al. |
| 2012/0092389 A1 | 4/2012 | Okuyama |
| 2012/0127754 A1 | 5/2012 | Lin et al. |
| 2012/0156814 A1 | 6/2012 | Hsieh et al. |
| 2012/0157804 A1 | 6/2012 | Rogers et al. |
| 2012/0165759 A1 | 6/2012 | Rogers et al. |
| 2012/0193662 A1 | 8/2012 | Donofrio et al. |
| 2012/0224111 A1 | 9/2012 | Ohshima |
| 2012/0247817 A1 | 10/2012 | Hommura et al. |
| 2012/0292086 A1 | 11/2012 | Auman et al. |
| 2012/0320581 A1 | 12/2012 | Rogers et al. |
| 2013/0037838 A1 | 2/2013 | Speier et al. |
| 2013/0041235 A1 | 2/2013 | Rogers et al. |
| 2013/0056749 A1 | 3/2013 | Tischler et al. |
| 2013/0062637 A1 | 3/2013 | Reed et al. |
| 2013/0119538 A1 | 5/2013 | McCarthy |
| 2013/0208026 A1 | 8/2013 | Suzuki et al. |
| 2013/0264592 A1 | 10/2013 | Bergmann et al. |
| 2013/0271959 A1 | 10/2013 | Woodgate et al. |
| 2013/0294006 A1 | 11/2013 | Kang et al. |
| 2013/0302969 A1 | 11/2013 | Priewasser |
| 2013/0309792 A1 | 11/2013 | Tischler et al. |
| 2013/0316487 A1 | 11/2013 | de Graff et al. |
| 2014/0008017 A1 | 1/2014 | Rie le |
| 2014/0017822 A1 | 1/2014 | Sakai et al. |
| 2014/0028953 A1 | 1/2014 | Kubota et al. |
| 2014/0062316 A1 | 3/2014 | Tischler et al. |
| 2014/0065741 A1 | 3/2014 | Chern et al. |
| 2014/0071413 A1 | 3/2014 | Takakuwa |
| 2014/0091337 A1 | 4/2014 | Ooyabu et al. |
| 2014/0094878 A1 | 4/2014 | Gossler et al. |
| 2014/0098557 A1 | 4/2014 | Veerasamy |
| 2014/0104850 A1 | 4/2014 | Yamamoto et al. |
| 2014/0110859 A1 | 4/2014 | Rafferty et al. |
| 2014/0120640 A1 | 5/2014 | Shieh et al. |
| 2014/0130340 A1 | 5/2014 | Li et al. |
| 2014/0142740 A1 | 5/2014 | Prakapenka et al. |
| 2014/0158885 A1 | 6/2014 | Noji et al. |
| 2014/0159072 A1 | 6/2014 | Ooyabu et al. |
| 2014/0167611 A1 | 6/2014 | Tischler et al. |
| 2014/0199635 A1 | 7/2014 | Hirano et al. |
| 2014/0264407 A1 | 9/2014 | Tischler et al. |
| 2014/0303452 A1 | 10/2014 | Ghaffari |
| 2014/0339495 A1 | 11/2014 | Bibl et al. |
| 2014/0355251 A1 | 12/2014 | Kahrs et al. |
| 2014/0367711 A1 | 12/2014 | Bibl et al. |
| 2015/0023023 A1 | 1/2015 | Livesay et al. |
| 2015/0034989 A1 | 2/2015 | Namiki et al. |
| 2015/0037517 A1 | 2/2015 | Buriak et al. |
| 2015/0054003 A1 | 2/2015 | Oraw |
| 2015/0114572 A1 | 4/2015 | Sanchez et al. |
| 2015/0204490 A1 | 7/2015 | Zheng et al. |
| 2015/0262729 A1 | 9/2015 | Aoki et al. |
| 2015/0303359 A1 | 10/2015 | Liu et al. |
| 2015/0308632 A1 | 10/2015 | Ueno et al. |
| 2015/0332635 A1 | 11/2015 | Lau et al. |
| 2015/0364633 A1 | 12/2015 | Hosomi et al. |
| 2015/0370130 A1 | 12/2015 | Lin |
| 2015/0371585 A1 | 12/2015 | Bower et al. |
| 2016/0026846 A1 | 1/2016 | Lin et al. |
| 2016/0064196 A1 | 3/2016 | Okita et al. |
| 2016/0066789 A1 | 3/2016 | Rogers et al. |
| 2016/0079112 A1 | 3/2016 | Itonaga et al. |
| 2016/0155656 A1 | 6/2016 | Matsumura |
| 2016/0172562 A1 | 6/2016 | Voutsas |
| 2016/0211415 A1 | 7/2016 | Huang et al. |
| 2016/0218264 A1 | 7/2016 | Tischler et al. |
| 2016/0233269 A1 | 8/2016 | Choi et al. |
| 2016/0267836 A1 | 9/2016 | Meersman et al. |
| 2016/0275205 A1 | 9/2016 | Lehavi et al. |
| 2016/0276195 A1 | 9/2016 | Huska et al. |

(56) References Cited

U.S. PATENT DOCUMENTS

| | | |
|---|---|---|
| 2016/0276205 A1 | 9/2016 | Huska et al. |
| 2017/0005077 A1 | 1/2017 | Kim et al. |
| 2017/0053901 A1 | 2/2017 | Huska et al. |
| 2017/0062400 A1 | 3/2017 | Li et al. |
| 2017/0062683 A1 | 3/2017 | Chen et al. |
| 2017/0140959 A1 | 5/2017 | Huska et al. |
| 2017/0140967 A1 | 5/2017 | Huska et al. |
| 2017/0150602 A1 | 5/2017 | Johnston et al. |
| 2017/0188427 A1 | 6/2017 | Cok et al. |
| 2017/0194171 A1 | 7/2017 | Peterson et al. |
| 2017/0256523 A1 | 9/2017 | Huska et al. |
| 2017/0256524 A1 | 9/2017 | Huska et al. |
| 2017/0269430 A1 | 9/2017 | Peterson et al. |
| 2017/0287748 A1 | 10/2017 | Hwang et al. |
| 2017/0365586 A1 | 12/2017 | Huska et al. |
| 2018/0040665 A1 | 2/2018 | Ohmae et al. |
| 2018/0045379 A1 | 2/2018 | Jiang |
| 2018/0053752 A1 | 2/2018 | Huska et al. |
| 2018/0122673 A1 | 5/2018 | Wendt et al. |
| 2018/0141163 A1 | 5/2018 | Wendt et al. |
| 2018/0174871 A1 | 6/2018 | Lee et al. |
| 2018/0204749 A1 | 7/2018 | Huska et al. |
| 2018/0226376 A1 | 8/2018 | Huska et al. |
| 2018/0233495 A1 | 8/2018 | Peterson et al. |
| 2018/0248090 A1 | 8/2018 | Huska et al. |
| 2018/0261579 A1 | 9/2018 | Huska et al. |
| 2018/0261580 A1 | 9/2018 | Huska et al. |
| 2018/0261581 A1 | 9/2018 | Huska et al. |
| 2018/0269086 A1 | 9/2018 | Huska et al. |
| 2018/0286838 A1 | 10/2018 | Huska et al. |
| 2018/0301439 A1 | 10/2018 | Peterson et al. |
| 2019/0096727 A1 | 3/2019 | Wendt et al. |
| 2019/0237445 A1 | 8/2019 | Huska et al. |
| 2019/0348405 A1 | 11/2019 | Peterson et al. |
| 2019/0378748 A1 | 12/2019 | Peterson et al. |
| 2020/0105566 A1 | 4/2020 | Huska et al. |
| 2020/0118862 A1 | 4/2020 | Peterson et al. |
| 2020/0168587 A1 | 5/2020 | Huska et al. |
| 2020/0235081 A1 | 7/2020 | Huska et al. |
| 2020/0243491 A1 | 7/2020 | Peterson et al. |
| 2020/0251453 A1 | 8/2020 | Huska et al. |
| 2021/0375656 A1 | 12/2021 | Huska et al. |

FOREIGN PATENT DOCUMENTS

| | | |
|---|---|---|
| CN | 1453636 A | 11/2003 |
| CN | 1875455 | 12/2006 |
| CN | 101295037 | 10/2008 |
| CN | 101308225 | 11/2008 |
| CN | 101320244 | 12/2008 |
| CN | 101410226 A | 4/2009 |
| CN | 101441419 A | 5/2009 |
| CN | 101821834 A | 9/2010 |
| CN | 102472790 A | 5/2012 |
| CN | 103210483 A | 7/2013 |
| CN | 103745912 A | 4/2014 |
| CN | 103843125 A | 6/2014 |
| CN | 104007642 A | 8/2014 |
| CN | 104205289 A | 12/2014 |
| CN | 105278160 | 1/2016 |
| CN | 107078066 A | 8/2017 |
| EP | 0375293 | 6/1990 |
| EP | 2426398 | 3/2012 |
| EP | 3427306 A1 | 1/2019 |
| JP | H0750337 B2 | 1/1993 |
| JP | 10294493 | 11/1998 |
| JP | 2000114204 A | 4/2000 |
| JP | 2000340585 A | 12/2000 |
| JP | 2001110699 A | 4/2001 |
| JP | 2002151739 A | 5/2002 |
| JP | 2002184836 A | 6/2002 |
| JP | 2003289084 A | 10/2003 |
| JP | 2004186352 A | 7/2004 |
| JP | 2005327923 | 11/2005 |
| JP | 2005535149 A | 11/2005 |
| JP | 2006203023 A | 8/2006 |
| JP | 2006332417 A | 12/2006 |
| JP | 2006332468 A | 12/2006 |
| JP | 2007173849 A | 7/2007 |
| JP | 2007193197 A | 8/2007 |
| JP | 2007194571 | 8/2007 |
| JP | 2009101762 | 5/2009 |
| JP | 2010087359 | 4/2010 |
| JP | 2010161155 | 7/2010 |
| JP | 2012015318 | 1/2012 |
| JP | 2012156473 | 8/2012 |
| JP | 2012195350 A | 10/2012 |
| JP | 2013118244 A | 6/2013 |
| JP | 2015035532 A | 2/2015 |
| JP | 2015513213 A | 4/2015 |
| JP | 2016001735 A | 1/2016 |
| JP | 2016029740 A | 3/2016 |
| KR | 20040086183 A | 10/2004 |

OTHER PUBLICATIONS

The Chinese Office Action mailed on Jun. 2, 2021, for Chinese Patent Application No. 201980027164.4, a counterpart foreign application of the U.S. Pat. No. 10,410,905, 5 pages.

The Chinese Office Action mailed on Jun. 20, 2021 for Chinese Patent Application No. 201780027031.8, a counterpart foreign application of the U.S. Pat. No. 9,678,383, 7 pages.

Chinese Office Action mailed Feb. 26, 2021 for Chinese Patent Application No. 201780027031.8, a counterpart foreign application of U.S. Pat. No. 9,678,383, 20 pages.

Chinese Office Action mailed Apr. 26, 2021 for Chinese Patent Application No. 201980027670.3, a counterpart foreign application of U.S. Appl. No. 16/147,456, 9 pages.

Chinese Re-Examination mailed Jun. 7, 2021 for Chinese Patent Application No. 201680016956.8 a foreign counterpart to U.S. Pat. No. 9,633,883, 8 pages.

Chinese Office Action mailed Nov. 29, 2022 for Chinese Patent Application No. 201780077698.9, a foreign counterpart to U.S. Pat. No. 10,141,215, 29 pages.

First Chinese Office Action mailed Dec. 23, 2021 for Chinese Patent Application No. 201910706964.0, a counterpart foreign application of U.S. Pat. No. 9,633,883, 13 pages.

Chinese Office Action mailed Dec. 29, 2020 for Chinese Patent Application No. 201680016956.8, a counterpart foreign application of U.S. Pat. No. 9,633,883, 5 pages.

The Chinese Office Actioon mailed on Mar. 11, 2020 for Chinese Patent Application No. 201680016956.8, a counterpart of U.S. Pat. No. 9,633,883, 5 pages.

Chinese Office Action mailed Mar. 26, 2021 for Chinese Patent Application No. 201910706964.0, a foreign counterpart to U.S. Pat. No. 9,633,883, 31 pages.

Chinese Office Action mailed Jun. 29, 2021 for Chinese Patent Application No. 201910706964.0, a counterpart foreign application of U.S. Pat. No. 9,633,883, 19 pages.

Chinese Re-Examination mailed Jun. 7, 2021 for Chinese Patent Application No. 201910706964.0, a foreign counterpart to U.S. Pat. No. 9,633,883, 8 pages.

The Chinese Office Action mailed on Jul. 14, 2020 for Chinese Patent Application No. 201780027031.8, a counterpart foreign application of the U.S. Pat. No. 9,678,383, 10 pages.

Chinese Office Action mailed Jul. 31, 2023 for Chinese Patent Application No. 201780027031.8, a foreign counterpart to U.S. Pat. No. 9,678,383, 31 pages.

Chinese Office Action mailed Aug. 27, 2021 for Chinese Application No. 201680016956.8, a foreign counterpart to U.S. Pat. No. 9,633,883, 12 pages.

Chinese Office Action mailed Aug. 4, 2020 for Chinese Patent Application No. 201680016956.8, a counterpart foreign application of U.S. Pat. No. 9,633,883, 8 pages.

Chinese Office Action mailed Sep. 27, 2023 for Chinese Patent Application No. 201780027031.8, a foreign counterpart to U.S. Pat. No. 9,678,383, 38 pages.

(56) References Cited

OTHER PUBLICATIONS

Chinese Office Action mailed Jun. 7, 2021 for Chinese Patent Application No. 201680016956.8, a counterpart foreign application of U.S. Pat. No. 9,633,883, 8 pages.
The Chinese Office Action mailed on Oct. 9, 2018, for Chinese Patent Application No. 201580037905.9, a counterpart foreign applicaiton of U.S. Appl. No. 15/316,505, 9 Pages.
The Chinese Office Action mailed on Jul. 12, 2019 for Chinese Patent Application No. 201780027031.8, a counterpart of U.S. Pat. No. 9,678,383, x pages.
The Chinese Office Action mailed on Aug. 28, 2019 for Chinese Patent Application No. 201680016956.8, a counterpart of U.S. Pat. No. 9,633,883, x pages.
The CN Search Report mailed Aug. 9, 2019 for CN application No. 201910706964.0, 2 pages.
CN Search Report mailed May 26, 2021 for CN Patent Application No. 201980027164.4, 1 page.
CN Search Report mailed Dec. 15, 2020 for CN Patent Application No. 201910706964.0, 2 pages.
Supplemental CN Search Report mailed Mar. 19, 2021 for CN Patent Application No. 201910706964.0, 2 pages.
CN Search Report mailed Apr. 20, 2021 for CN Patent Application No. 201980027670.3, 2 pages.
CN Supplemental Search Report mailed Jun. 21, 2021 for CN Patent Application No. 201910706964.0, 2 pages.
The CN Search Report mailed Jul. 10, 2020 for CN application No. 201910706964.0, 2 pages.
The CN Search Report mailed Jul. 10, 2020 for CN application No. 201680016956,8, 1 page.
The CN Search Report mailed Jul. 26, 2020 for CN application No. 201910706964.0, 2 pages.
CN Search Report mailed Jul. 3, 2020 for CN Patent Application No. 201780027031.8, 1 page.
CN Search Report mailed Jul. 9, 2019 for CN Patent Application No. 201780027031.8, 2 pages.
The CN Search Report mailed Aug. 9, 2019 for CN application No. 201680016956,8, 1 page.
"Capillaries 1572& 1572N Series", Gaisef precision bonding tools, coorstek.com, Nov. 23, 2016, 1 page.

European Office Action mailed Dec. 14, 2022 for European Patent Application No. 19804301.0, 8 pages.
The European Office Action mailed on Oct. 5, 2020 for European Patent Application No. 17767669.9, a counterpart of U.S. Pat. No. 9,678,383, 5 pages.
European Office Action mailed Feb. 16, 2022 for European Patent Application No. 17767669.9, a foreign counterpart to U.S. Pat. No. 9,678,383, 4 pages.
European Office Action mailed Jun. 15, 2021 for European Patent Application No. 17767669.9, a foreign counterpart to U.S. Pat. No. 9,678,383, 5 pages.
The European Office Action mailed on Sep. 9, 2019 for European Patent Application No. 16769455.3, counterpart foreing application of the U.S. Appl. No. 14/939,896, 8 pages.
The Extended European Search Report mailed Feb. 2, 2018 for European Patent Application No. 15803526.1, 6 pages.
The Extended European Search Report mailed on Sep. 19, 2018 for European Application No. 16769455.3, 9 pages.
The Extended European Search Report mailed Feb. 12, 2018 for European Patent Application No. 15803526.1, 6 pages.
The Extended European Search Report mailed on Oct. 10, 2019 for European Patent Application No. 17767669.9, 7 pages.
The Extended European Search Report mailed on Dec. 2, 2020 for European Patent Application No. 20196959.9, 14 pages.
Extended European Search Report mailed Dec. 23, 2021 for European Patent Application No. 19804301.0, 8 pages.
Extended European Search Report mailed May 10, 2022 for European Patent Application No. 19865538.3, a foreign counterpart to U.S. Pat. No. 11,094,571, 6 pages.
The Extended European Search Report mailed on May 29, 2020 for European Patent Application No. 17873931.4, 14 pages.
The Extended European Search Report mailed on May 4, 2020 for European Patent Application No. 17867498.2, 12 pages.
Japanese Office Action mailed Sep. 1, 2020 for Japanese Patent Application No. 2017-549243, a counterpart foreign application of U.S. Pat. No. 9,633,883, 28 pages.
Office Action for Korean Application No. 10-2021-7007215, Dated Aug. 29, 2024, 22 pages.

* cited by examiner

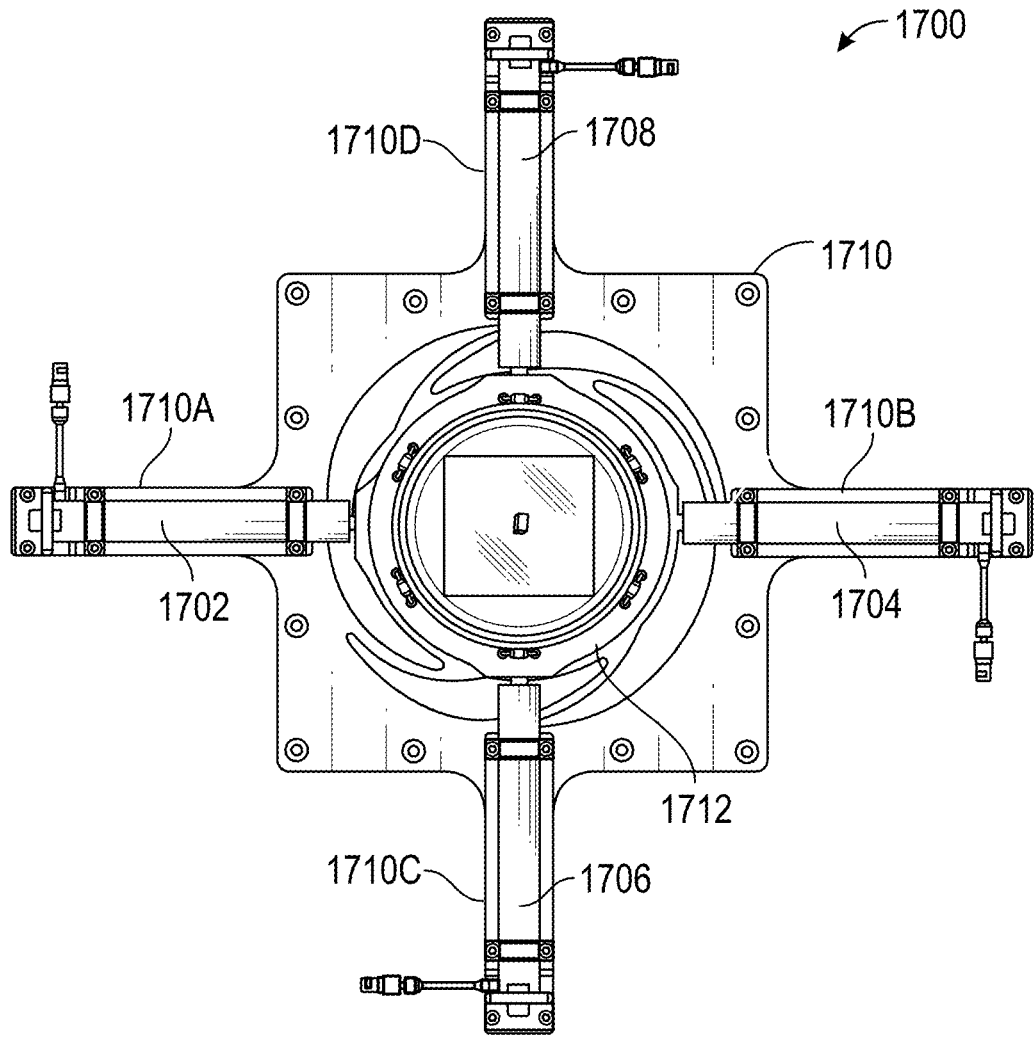
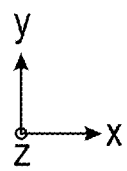
FIG. 17

APPARATUSES FOR EXECUTING A DIRECT TRANSFER OF A SEMICONDUCTOR DEVICE DIE DISPOSED ON A FIRST SUBSTRATE TO A SECOND SUBSTRATE

CROSS REFERENCE TO RELATED PATENT APPLICATIONS

This application claims priority to, and is a divisional application of, U.S. patent application Ser. No. 16/147,456, filed on Sep. 28, 2018, entitled "Method and Apparatus to Increase Transfer Speed of Semiconductor Devices with Micro-Adjustment," now issued as U.S. Pat. No. 11,094,571. Further, this application incorporates by reference U.S. patent application Ser. No. 14/939,896, filed on Nov. 12, 2014, entitled "Apparatus for Transfer of Semiconductor Devices," now issued as U.S. Pat. No. 9,633,883; U.S. patent application Ser. No. 15/343,055, filed on Nov. 3, 2016, entitled "Compliant Needle for Direct Transfer of Semiconductor Devices," now issued as U.S. Pat. No. 10,141,215; U.S. patent application Ser. No. 15/360,471, filed on Nov. 23, 2016, entitled "Top-Side Laser for Direct Transfer of Semiconductor Devices," now issued as U.S. Pat. No. 10,471,545; U.S. patent application Ser. No. 15/360,645, filed on Nov. 23, 2016, entitled "Pattern Array Direct Transfer Apparatus and Method Therefor," now issued as U.S. Pat. No. 10,504,767; U.S. patent application Ser. No. 15/409,409, filed on Jan. 18, 2017, entitled "Flexible Support Substrate for Transfer of Semiconductor Devices," now issued as U.S. Pat. No. 10,625,588; and U.S. patent application Ser. No. 15/978,094, filed on May 12, 2018, entitled "Method and Apparatus for Multiple Direct Transfers of Semiconductor Devices, now issued as U.S. Pat. No. 10,410,905.

BACKGROUND

Semiconductor devices are electrical components that utilize semiconductor material, such as silicon, germanium, gallium arsenide, and the like. Semiconductor devices are typically manufactured as single discrete devices or as integrated circuits (ICs). Examples of single discrete devices include electrically-actuatable elements such as light-emitting diodes (LEDs), diodes, transistors, resistors, capacitors, fuses, and the like.

The fabrication of semiconductor devices typically involves an intricate manufacturing process with a myriad of steps. The end-product of the fabrication is a "packaged" semiconductor device. The "packaged" modifier refers to the enclosure and protective features built into the final product as well as the interface that enables the device in the package to be incorporated into an ultimate circuit.

The conventional fabrication process for semiconductor devices starts with handling a semiconductor wafer. The wafer is diced into a multitude of "unpackaged" semiconductor devices. The "unpackaged" modifier refers to an unenclosed semiconductor device without protective features. Herein, unpackaged semiconductor devices may be called semiconductor device die, or just "die" for simplicity. A single semiconductor wafer may be diced to create die of various sizes, so as to form upwards of more than 100,000 or even 1,000,000 die from the semiconductor wafer (depending on the starting size of the semiconductor), and each die has a certain quality. The unpackaged die are then "packaged" via a conventional fabrication process discussed briefly below. The actions between the wafer handling and the packaging may be referred to as "die preparation."

In some instances, the die preparation may include sorting the die via a "pick and place process," whereby diced die are picked up individually and sorted into bins. The sorting may be based on the forward voltage capacity of the die, the average power of the die, and/or the wavelength of the die.

Typically, the packaging involves mounting a die into a plastic or ceramic package (e.g., mold or enclosure). The packaging also includes connecting the die contacts to pins/wires for interfacing/interconnecting with ultimate circuitry. The packaging of the semiconductor device is typically completed by sealing the die to protect it from the environment (e.g., dust).

A product manufacturer then places packaged semiconductor devices in product circuitry. Due to the packaging, the devices are ready to be "plugged in" to the circuit assembly of the product being manufactured. Additionally, while the packaging of the devices protects them from elements that might degrade or destroy the devices, the packaged devices are inherently larger (e.g., in some cases, around 10 times the thickness and 10 times the area, resulting in 100 times the volume) than the die found inside the package. Thus, the resulting circuit assembly cannot be any thinner than the packaging of the semiconductor devices.

As mentioned previously, a single semiconductor wafer may be diced to create more than 100,000 or even 1,000,000 die from the semiconductor wafer. As such, efficiency is a primary concern when transferring thousands, if not millions, of die. In transferring these die, there are often parameters of a die transfer that a manufacturer may not have control over for the sake of efficiency and/or speed. For example, if a die is transferred at a relatively high speed, the high speed transfer process may cause vibrations to travel throughout the semiconductor substrate. In other aspects, even when configured to perform transfers at high speed, starting and stopping the conveying mechanism that locates the die for transfer can costly in terms of efficiency. Conventional transfer mechanisms and methods do not provide the ability to control and/or improve these parameters and others without decreasing the efficiency of the transfer process.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different figures indicates similar or identical items. Furthermore, the drawings may be considered as providing an approximate depiction of the relative sizes of the individual components within individual figures. However, the drawings are not to scale, and the relative sizes of the individual components, both within individual figures and between the different figures, may vary from what is depicted. In particular, some of the figures may depict components as a certain size or shape, while other figures may depict the same components on a larger scale or differently shaped for the sake of clarity.

FIG. 17 illustrates a bottom view of a micro-adjustment assembly having four micro-adjustment actuators according to an embodiment of the instant disclosure.

DETAILED DESCRIPTION

Figure 1:
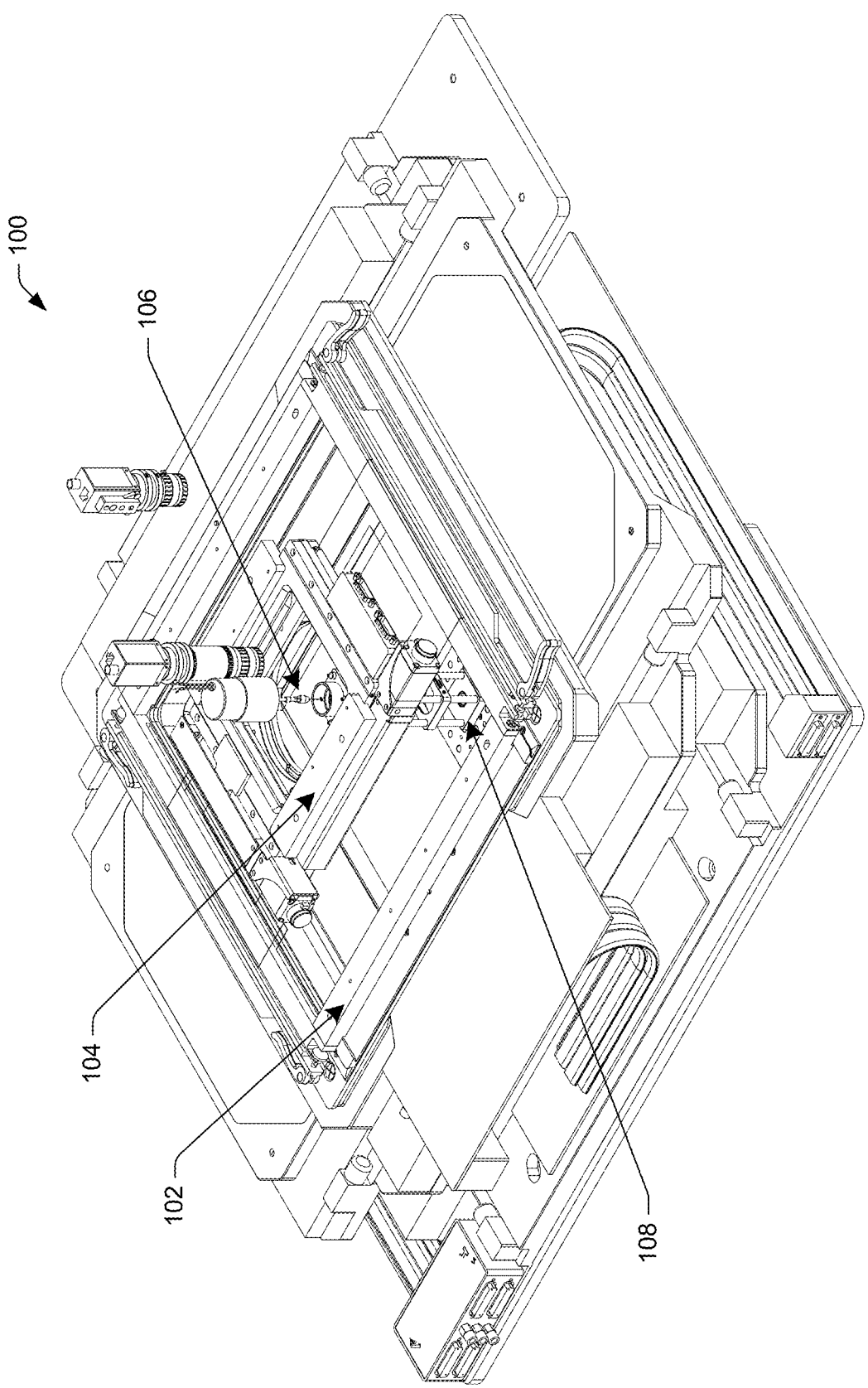
FIG. 1 illustrates an isometric view of an embodiment of a direct transfer apparatus.

This disclosure is directed to a machine that directly transfers and affixes semiconductor device die to a circuit and to the process for achieving the same, as well as to the circuit having die affixed thereto (as the output product). In an embodiment, the machine functions to transfer unpackaged die directly from a substrate such as a "wafer tape" to a support substrate, such as a circuit substrate. The direct transfer of unpackaged die may significantly reduce the thickness of an end product compared to a similar product produced by conventional means, as well as the amount of time and/or cost to manufacture the support substrate.

For the purpose of this description, the term "substrate" refers to any substance on which, or to which, a process or action occurs. Further, the term "product" refers to the desired output from a process or action, regardless of the state of completion. Thus, a support substrate refers to any substance on which, or to which, a process or action is caused to occur for a desired output.

In an embodiment, the machine may secure a support substrate for receiving "unpackaged" die, such as LEDs, transferred from the wafer tape, for example. In an effort to reduce the dimensions of the products using the die, the die are very small and thin, for example, a die may be about 50 microns (μm) thick. Due to the relatively small size of the die, the machine includes components that function to precisely align both the wafer tape carrying the die and the support substrate to ensure accurate placement and/or avoid product material waste. In an embodiment, the components that align the support substrate and the die on the wafer tape may include a set of frames in which the wafer tape and the support substrate are secured respectively and conveyed individually to a position of alignment such that a specific die on the wafer tape is transferred to a specific spot on the support substrate.

The frame that conveys the support substrate may travel in various directions, including in-plane horizontal, vertical, and/or rotational directions for various axes of alignment, or even out-of-plane directions that would permit transfer to a curved surface. The frame that conveys the wafer tape may travel in various directions also. A system of gears, tracks, motors, and/or other elements may be used to secure and convey the frames carrying the support substrate and the wafer tape respectively to align the support substrate with the wafer tape in order to place a die on the correct position of the support substrate. Each frame system may also be moved to an extraction position in order to facilitate extraction of the wafer tape and the support substrate upon completion of the transfer process. It is also to be appreciated that any or all of the first substrate, second substrate, and transfer mechanism may be movable with respect to each other to facilitate the most efficient alignment of components based on the particular embodiment.

In some aspects, the components that align the support substrate and the die on the wafer tape include one or more adjustment mechanisms that convey the wafer tape in small distances (e.g., 5 microns to 50 microns, or 1 micron to 1000 microns, or 0.5 micron to 5000 microns, etc.) to fine-adjust the desired location of the transfer die transfer location to die transfer location. These small conveyances (hereafter micro-adjustments) can counteract locational inaccuracies of the frame that conveys the wafer tape due to vibration caused by starting and stopping conveyance of the frames (coarse adjustments of the conveyance mechanism(s)) in rapid succession. The inertial vibration noise can vary depending on velocity, unit mass, deceleration, etc. A micro-adjustment occurs rapidly (e.g., about 0.5 ms from start to end of the micro-adjustment) to counteract the vibration prior to die transfer. Additionally, after conveying the tape to a transfer location and transferring of the die, subsequent micro adjustments may be made to align additional transfer locations and transfer die prior to the next coarse adjustment.

In an embodiment, the machine further includes a transfer mechanism for transferring the die directly from the wafer tape to the support substrate without "packaging" the die. The transfer mechanism may be disposed vertically above the wafer tape so as to press down on the die via the wafer tape toward the support substrate. This process of pressing down on the die may cause the die to peel off of the wafer tape, starting at the sides of the die until the die separate from the wafer tape to be attached to the support substrate. That is, by reducing the adhesion force between the die and the wafer tape, and by increasing the adhesion force between the die and the support substrate, the die may be transferred.

In some embodiments, the transfer mechanism may include an elongated rod, such as a pin or needle that may be cyclically actuated against the wafer tape to push the wafer tape from a top side. Additionally, and/or alternatively, the transfer mechanism may include a plurality of needles that may be individually actuated against the wafer tape. The needle, or needles, may be sized so as to be no wider than a width of the die being transferred. Although in other instances, the width of the needle may be wider than a width of the die, or any other dimension. When the end of the needle contacts the wafer tape, the wafer tape may experience a local deflection at the area between the die and the wafer tape. Inasmuch as the deflection is highly localized and rapidly performed, the portion of the wafer tape that does not receive pressure from the needle may begin to flex away from the surface of the die. This partial separation may thus cause the die to lose sufficient contact with the wafer tape, so as to be released from the wafer tape. Moreover, in an embodiment, the deflection of the wafer tape may be so minimal, as to maintain an entirety of the surface area of the die in contact with the wafer tape, while still causing the opposing surface of the die to extend beyond a plane of extension of the corresponding surface of the adjacent die to avoid unintentional transfer of the adjacent die.

Alternatively, or additionally, the machine may further include a fixing mechanism for affixing the separated, "unpackaged" die to the support substrate. In an embodiment, the support substrate may have thereon a circuit trace to which the die are transferred and affixed. The fixing mechanism may include a device that emits energy, such as a laser, to melt/soften the material of the circuit trace on the support substrate. Moreover, in an embodiment, the laser may be used to activate/harden the material of the circuit trace. Thus, the fixing mechanism may be actuated before, and/or after the die is in contact with the material of the circuit trace. Accordingly, upon actuation of the transfer mechanism to release a die onto the support substrate, the energy emitting device may also be activated so as to prepare the trace material to receive the die. The activation of the energy emitting device may further enhance the release and capture of the die from the wafer tape so as to begin formation of a semiconductor product on the support substrate.

In some embodiments, as the frame holding the wafer tape is conveyed from location to location, the conveyance mechanism holding the wafer frame may move to the transfer location, and after coming to an abrupt stop, perform a micro-adjustment that fine-tunes the transfer location and/or removes system vibrations. The system then transfers the die via the fixing mechanism as described above.

In other embodiments, the conveyance mechanism may not come to a complete stop before transfer of the die from the wafer tape to the support substrate. In some aspects, the system may vary the velocity of conveyance mechanism as it approaches the desired transfer location, while in other aspects the conveyance mechanism may maintain a constant velocity as it passes though desired transfer locations. At a calculatable moment in time with respect to the transfer position, the system may actuate the micro-actuation mechanism in the one or more axes of travel, at 180 degrees from the direction of travel. The velocity of the micro-actuation matches the velocity of travel of the frame such that the position of the die being transferred is motionless with respect to the target position on the support. That is, the relative velocity of the transfer elements (e.g., conveyance mechanisms and transfer mechanism) becomes zero because of the opposite-direction actuation of the micro-adjustment mechanism. At the instant that the die is motionless with respect to the target position, the transfer mechanism pushes the die off of the wafer tape into position on the substrate support, and the fixing mechanism fixes the die as described herein. Because the conveyance mechanism never completely stops, manufacturing efficiencies are gained from time saved waiting for system vibrations of the coarse conveyance mechanisms to settle at each transfer location.

First Example Embodiment of a Direct Transfer Apparatus

FIG. 1 illustrates an embodiment of an apparatus 100 that may be used to directly transfer unpackaged semiconductor components (or "die") from a wafer tape to a support substrate. The wafer tape may also be referred to herein as the semiconductor device die substrate, or simply a die substrate. The apparatus 100 may include a support substrate conveyance mechanism 102 and a wafer tape conveyance mechanism 104. Each of the support substrate conveyance mechanism 102 and the wafer tape conveyance mechanism 104 may include a frame system or other means to secure the respective substrates to be conveyed to desired alignment positions with respect to each other. The apparatus 100 may further include a transfer mechanism 106, which, as shown, may be disposed vertically above the wafer tape conveyance mechanism 104. In an embodiment, the transfer mechanism 106 may be located so as to nearly contact the wafer tape. Additionally, the apparatus 100 may include a fixing mechanism 108. The fixing mechanism 108 may be disposed vertically beneath the support substrate conveyance mechanism 102 in alignment with the transfer mechanism 106 at a transfer position, where a die may be placed on the support substrate. As discussed below, FIGS. 2A and 2B illustrate example details of the apparatus 100.

Figure 2A:
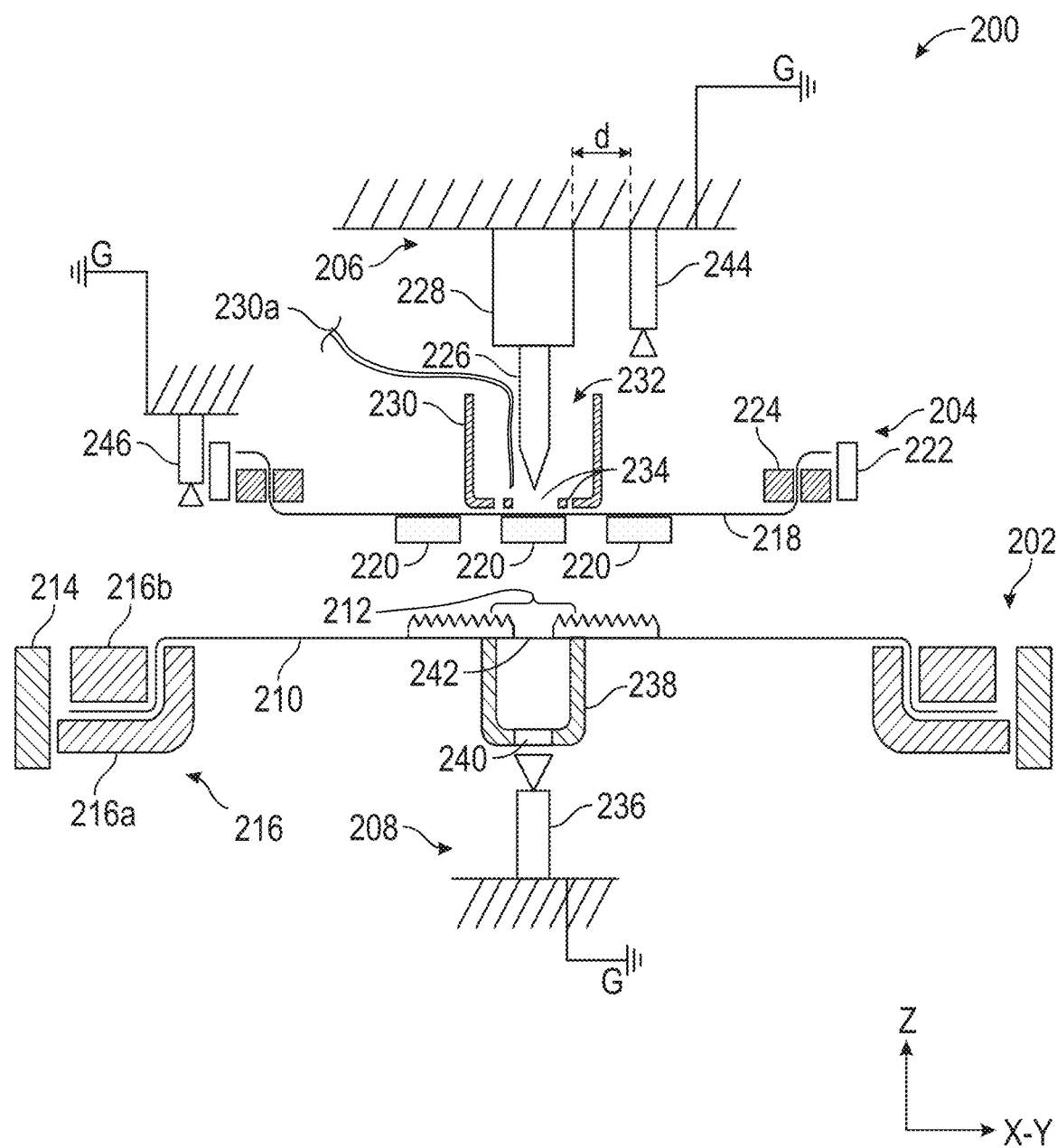
FIG. 2A represents a schematic view of an embodiment of a direct transfer apparatus in a pre-transfer position.
Figure 2B:
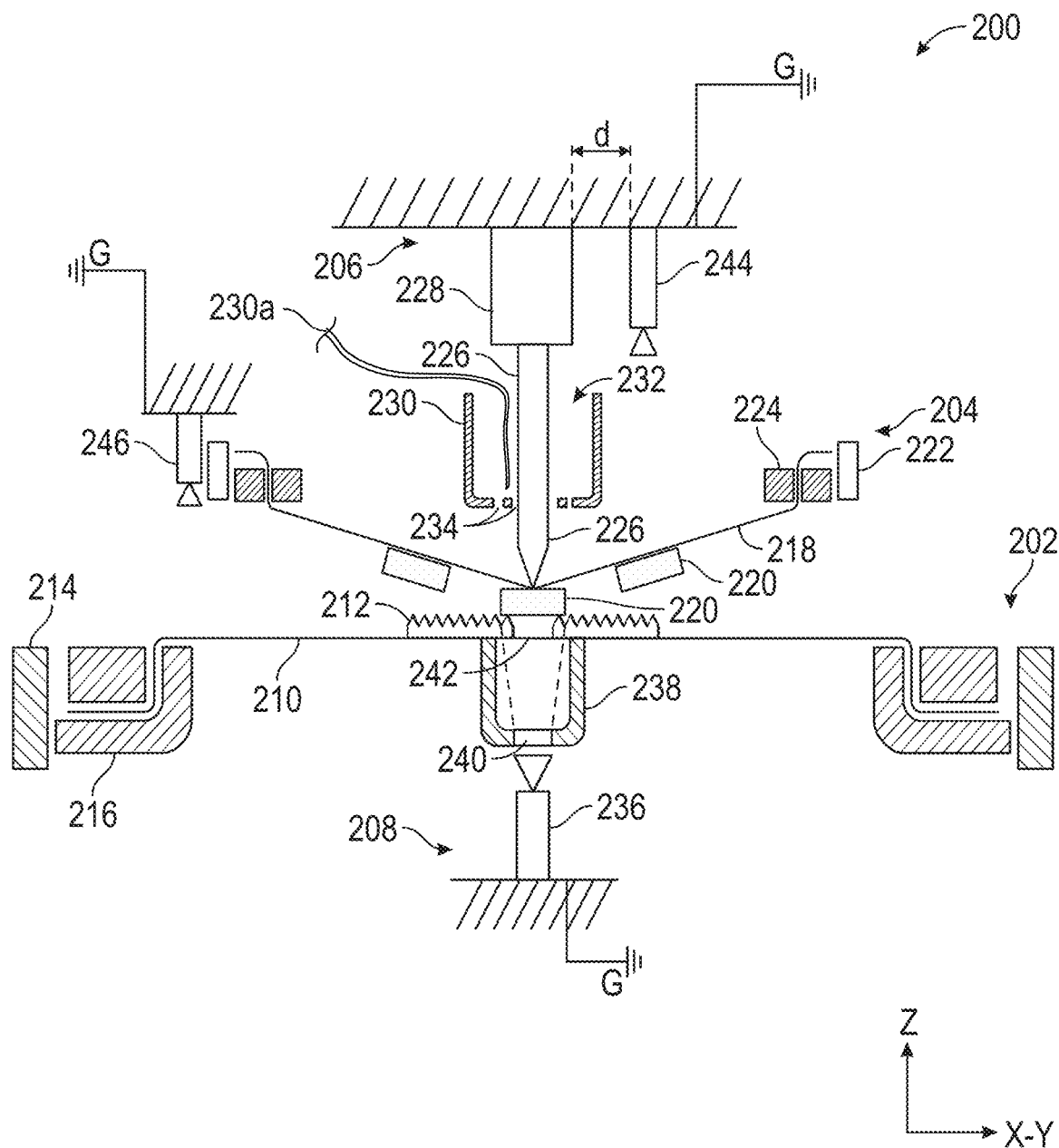
FIG. 2B represents a schematic view of an embodiment of a direct transfer apparatus in a transfer position.

Inasmuch as FIGS. 2A and 2B depict different stages of the transfer operation, while referring to the same elements and features of apparatus 200, the following discussion of specific features may refer interchangeably to either or both of FIGS. 2A and 2B, except where explicitly indicated. In particular, FIGS. 2A and 2B illustrate an embodiment of an apparatus 200, including a support substrate conveyance mechanism 202, a wafer tape conveyance mechanism 204, a transfer mechanism 206, and a fixing mechanism 208. The support substrate conveyance mechanism 202 may be disposed adjacent to the wafer tape conveyance mechanism 204. For example, as illustrated, the support substrate conveyance mechanism 202 may extend in a substantially horizontal direction and may be disposed vertically beneath the wafer tape conveyance mechanism 204 so as to take advantage of any effect that gravity may have in the transfer process. Alternatively, the support substrate conveyance mechanism 202 may be oriented so as to extend transversely to a horizontal plane.

During a transfer operation, the conveyance mechanisms 202, 204 may be positioned such that a space between a surface of a support substrate carried by the support substrate conveyance mechanism 202 and a surface of a wafer tape carried by the wafer tape conveyance mechanism 204 may be more or less than 1 mm, depending on various other aspects of the apparatus 200, including the amount of deflection that occurs by components during the transfer operation, as described herein below. In an embodiment, the respective opposing surfaces of the wafer tape and the support substrate may be the most prominent structures in comparison to the supporting structures of the conveyance mechanisms 202, 204. That is, in order to avoid a collision between components of the machine and products thereon, which might be caused by movable parts (e.g., the conveyance mechanisms 202, 204), a distance between the respective surfaces of the wafer tape and support substrate may be less than a distance between either of the surfaces and any other opposing structural component.

As depicted, and in an embodiment, the transfer mechanism 206 may be disposed vertically above the wafer tape conveyance mechanism 204, and the fixing mechanism 208 may be disposed vertically beneath the support substrate conveyance mechanism 202. It is contemplated that in some embodiments, one or both of the transfer mechanism 206 and the fixing mechanism 208 may be oriented in different positions than the positions illustrated in FIGS. 2A and 2B. For example, the transfer mechanism 206 may be disposed so as to extend at an acute angle with respect to a horizontal plane. In another embodiment, the fixing mechanism 208 may be oriented to emit energy during the transfer process from the same direction of actuation as the transfer mechanism 206, or alternatively, from any orientation and position from which the fixing mechanism 208 is able to participate in the transfer process.

The support substrate conveyance mechanism 202 may be used to secure a support substrate 210. Herein, the term "support substrate" may include, but is not limited to: a wafer tape (for example, to presort the die and create sorted die sheets for future use); a paper or polymer substrate formed as a sheet or other non-planar shape, where the polymer—translucent or otherwise—may be selected from any suitable polymers, including, but not limited to, a silicone, an acrylic, a polyester, a polycarbonate, etc.; a circuit board (such as a printed circuit board (PCB)); a string or thread circuit, which may include a pair of conductive wires or "threads" extending in parallel; and a cloth material of cotton, nylon, rayon, leather, etc. The choice of material of the support substrate may include durable materials, flexible materials, rigid materials, and other materials with which the transfer process is successful and which maintain suitability for the end use of the support substrate. The support substrate 210 may be formed solely or at least partially of conductive material such that the support substrate 210 acts as a conductive circuit for forming a product. The potential types of support substrate may further include items, such as glass bottles, vehicle windows, or sheets of glass.

In an embodiment as depicted in FIGS. 2A and 2B, the support substrate 210 may include a circuit trace 212 disposed thereon. The circuit trace 212, as depicted, may include a pair of adjacent trace lines spaced apart by a trace spacing, or gap so as to accommodate a distance between electrical contact terminals (not shown) on the die being transferred. Thus, the trace spacing, or gap between the adjacent trace lines of the circuit trace 212 may be sized according to the size of the die being transferred to ensure proper connectivity and subsequent activation of the die. For example, the circuit trace 212 may have a trace spacing, or gap ranging from about 75 to 200 microns, about 100 to 175 microns, or about 125 to 150 microns.

The circuit trace 212 may be formed from a conductive ink disposed via screen printing, inkjet printing, laser printing, manual printing, or other printing means. Further, the circuit trace 212 may be pre-cured and semi-dry or dry to provide additional stability, while still being activatable for die conductivity purposes. A wet conductive ink may also be used to form the circuit trace 212, or a combination of wet and dry ink may be used for the circuit trace 212. Alternatively, or additionally, the circuit trace 212 may be pre-formed as a wire trace, or photo-etched, or from molten material formed into a circuit pattern and subsequently adhered, embedded, or otherwise secured to the support substrate 210.

The material of the circuit trace 212 may include, but is not limited to, silver, copper, gold, carbon, conductive polymers, etc. In an embodiment, the circuit trace 212 may include a silver-coated copper particle. A thickness of the circuit trace 212 may vary depending on the type of material used, the intended function and appropriate strength or flexibility to achieve that function, the energy capacity, the size of the LED, etc. For example, a thickness of the circuit trace may range from about 5 microns to 20 microns, from about 7 microns to 15 microns, or from about 10 microns to 12 microns.

Accordingly, in one non-limiting example, the support substrate 210 may be a flexible, translucent polyester sheet having a desired circuit pattern screen printed thereon using a silver-based conductive ink material to form the circuit trace 212.

The support substrate conveyance mechanism 202 may include a support substrate conveyor frame 214 for securing a support substrate holder frame 216. The structure of the support substrate holder frame 216 may vary significantly depending on the type and properties (e.g., shape, size, elasticity, etc.) of the support substrate being used. Inasmuch as the support substrate 210 may be a flexible material, support substrate 210 may be held under tension in the support substrate holder frame 216, so as to create a more rigid surface upon which a transfer operation, discussed herein below, is performed. In the above example, the rigidity created by the tension in the support substrate 210 may increase the placement accuracy when transferring components.

In an embodiment, using a durable or more rigid material for the support substrate 210, naturally provides a firm surface for component placement accuracy. In contrast, when the support substrate 210 is allowed to sag, wrinkles and/or other discontinuities may form in the support substrate 210 and interfere with the pre-set pattern of the circuit trace 212, to the extent that the transfer operation may be unsuccessful.

While the means of holding the support substrate 210 may vary greatly, FIG. 2A illustrates an embodiment of a support substrate holder frame 216 including a first portion 216a having a concave shape and a second portion 216b having a convex counter shape that corresponds in shape to the concave shape. In the depicted example, tension is created for the support substrate 210 by inserting an outer perimeter of the support substrate 210 between the first portion 216a and the second portion 216b to thereby clamp the support substrate 210 tightly.

The support substrate conveyor frame 214 may be conveyed in at least three directions—two directions in the horizontal plane and vertically as well. The conveyance may be accomplished via a system of motors, rails, and gears (none of which are shown). As such, the support substrate holder frame 216 may be conveyed to and held in a specific position as directed and/or programmed and controlled by a user of the apparatus 200.

The wafer tape conveyance mechanism 204 may be implemented to secure a wafer tape 218 having die 220 (i.e., semiconductor device die) thereon. The wafer tape 218 may be conveyed in multiple directions to the specific transfer positions for the transfer operation via a wafer tape conveyor frame 222. Similar to the support substrate conveyor frame 214, the wafer tape conveyor frame 222 may include a system of motors, rails, and gears (none of which are shown).

The unpackaged semiconductor die 220 for transfer may be extremely small. Indeed, the height of the die 220 may range from 12.5 to 200 microns, or from 25 to 100 microns, or from 50 to 80 microns.

Due to the micro size of the die, when the wafer tape 218 has been conveyed to the appropriate transfer position, a gap spacing between the wafer tape 218 and the support substrate 210 may range from about 0.25 mm to 1.50 mm, or about 0.50 mm to 1.25 mm, or about 0.75 mm to 1.00 mm, for example. A minimum gap spacing may depend on factors including: a thickness of the die being transferred, a stiffness of the wafer tape involved, an amount of deflection of the wafer tape needed to provide adequate capture and release of the die, a proximity of the adjacent die, etc. As the distance between the wafer tape 218 and the support substrate 210 decreases, a speed of the transfer operation may also decrease due to the reduced cycle time (discussed further herein) of the transfer operation. Such a decrease in the duration of a transfer operation may therefore increase a rate of die transfers. For example, the die transfer rate may range from about 6-250 die placed per second.

Furthermore, the wafer tape conveyor frame 222 may secure a wafer tape holder frame 224, which may stretch and hold the wafer tape 218 under tension. As illustrated in FIG. 2A, the wafer tape 218 may be secured in the wafer tape holder frame 224 via clamping a perimeter of the wafer tape 218 between adjacent components of the wafer tape holder frame 224. Such clamping assists in maintaining the tension and stretched characteristic of the wafer tape 218, thereby increasing the success rate of the transfer operation. In view of the varying properties of different types/brands/qualities of wafer tapes available, a particular wafer tape may be selected for use based on an ability to consistently remain at a desired tension during a transfer process. In an embodiment, the needle actuation performance profile (discussed further herein below) may change depending on the tension of the wafer tape 218.

The material used for the wafer tape 218 may include a material having elastic properties, such as a rubber or silicone, for example. Furthermore, inasmuch as temperature of the environment and the wafer tape 218 itself may contribute to potential damage to the wafer tape 218 during the transfer process, a material having properties that are resistant to temperature fluctuation may be advantageous. Additionally, in an embodiment, the wafer tape 218 may be stretched slightly so as to create a separation or gap between individual die 220 to assist in the transfer operation. A surface of the wafer tape 218 may include a sticky substance via which the die 220 may be removably adhered to the wafer tape 218.

The die 220 on the wafer tape 218 may include die that were individually cut from a solid semiconductor wafer and then placed onto the wafer tape 218 to secure the die. In such a situation, the die may have been pre-sorted and explicitly organized on the wafer tape 218, in order, for example, to assist in the transfer operation. In particular, the die 220 may be arranged sequentially as to the expected order of transfer to the support substrate 210. Such pre-arrangement of the die 220 on the wafer tape 218 may reduce the amount of travel that would otherwise occur between the support substrate conveyance mechanism 202 and the wafer tape conveyance mechanism 204. Additionally, or alternatively, the die on the wafer tape 218 may have been pre-sorted to include only die having substantially equivalent performance properties. In this case, efficiency of the supply chain may be increased and thus, travel time of the wafer tape conveyance mechanism 204 may be reduced to a minimum.

In an embodiment, materials used for the die may include, but is not limited to, silicon carbide, gallium nitride, a coated silicon oxide, etc. Furthermore, sapphire or silicon may be used as a die as well. Additionally, as indicated above, a "die" may be representative herein of an electrically actuatable element generally.

In some embodiments, the wafer tape 218 may include die that are not pre-sorted, but rather are formed by simply cutting a semiconductor directly on wafer tape, and then leaving the die on the wafer tape without "picking and placing" to sort the die depending on the respective performance quality of the die. In such a situation, the die on the wafer tape may be mapped to describe the exact relative locations of the different quality die. Therefore, in an embodiment, it may be unnecessary to use wafer tape having pre-sorted die. In such a case, the amount of time and travel for the wafer tape conveyance mechanism 204 to move between particular die for each sequential transfer operation may increase. This may be caused in part by the varying quality of the die dispersed within the area of the semiconductor, which means that a die of a specific quality for the next transfer operation may not be immediately adjacent to the previously transferred die. Thus, the wafer tape conveyance mechanism 204 may move the wafer tape 218 further to align an appropriate die of a specific quality for transfer than would be necessary for a wafer tape 218 containing die of substantially equivalent quality.

In further regard to the die 220 on the wafer tape 218, in an embodiment, a data map of the die 220 may be provided with the wafer tape 218. The data map may include a digital file providing information that describes the specific quality and location of each die on the wafer tape 218. The data map file may be input into a processing system in communication with the apparatus 200, whereby the apparatus 200 may be controlled/programmed to seek the correct die 220 on the wafer tape 218 for transfer to the support substrate 210.

A transfer operation is performed, in part, via the transfer mechanism 206, which is a die separation device for assisting in separation of die from the wafer tape 218. The actuation of the transfer mechanism 206 may cause one or more die 220 to be released from the wafer tape 218 and to be captured by the support substrate 210. In an embodiment, the transfer mechanism 206 may operate by pressing an elongated rod, such as a pin or a needle 226 into a top surface of the wafer tape 218 against a die 220. The needle 226 may be connected to a needle actuator 228. The needle actuator 228 may include a motor connected to the needle 226 to drive the needle 226 toward the wafer tape 218 at predetermined/programmed times.

In view of the function of the needle 226, the needle 226 may include a material that is sufficiently durable to withstand repetitive, rapid, minor impacts while minimizing potential harm to the die 220 upon impact. For example, the needle 226 may include a metal, a ceramic, a plastic, etc.

Additionally, a tip of the needle 226 may have a particular shape profile, which may affect the ability of the needle to function repetitively without frequently breaking either the tip or damaging the wafer tape 218 or the die 220. The profile shape of the tip of the needle is discussed in greater detail below with respect to FIG. 3.

In a transfer operation, the needle 226 may be aligned with a die 220, as depicted in FIG. 2A, and the needle actuator may move the needle 226 to push against an adjacent side of the wafer tape 218 at a position in which the die 220 is aligned on the opposing side of the wafer tape 218, as depicted in FIG. 2B. The pressure from the needle 226 may cause the wafer tape 218 to deflect so as to extend the die 220 to a position closer to the support substrate 210 than adjacent die 220, which are not being transferred. As indicated above, the amount of deflection may vary depending several factors, such as the thickness of the die and circuit trace. For example, where a die 220 is about 50 microns thick and circuit trace 212 is about 10 microns thick, an amount of deflection of the wafer tape 218 may be about 75 microns. Thus, the die 220 may be pressed via the needle 226 toward the support substrate 210 to the extent that the electrical contact terminals (not shown) of the die are able to bond with the circuit trace 212, at which point, the transfer operation proceeds to completion and the die 220 is released from the wafer tape 218.

To the extent that the transfer process may include a rapidly repeated set of steps including a cyclical actuation of the needle 226 pressing upon a die 220, a method of the process is described in detail herein below with respect to FIG. 8. Further, the stroke profile of the actuation of the needle 226 (within the context of the transfer process) is discussed in more detail hereafter with respect to FIG. 4.

Turning back to FIGS. 2A and 2B, in an embodiment, the transfer mechanism 206 may further include a needle retraction support 230, (also known as a pepper pot). In an embodiment, the support 230 may include a structure having a hollowed space wherein the needle 226 may be accommodated by passing into the space via an opening 232 in a first end of the support 230. The support 230 may further include at least one opening 234 on a second opposing end of the support 230. Moreover, the support may include multiple perforations near opening 234. The at least one opening 234 may be sized with respect to a diameter of the needle 226 to accommodate passage of the needle 226 therethrough so as to press on the wafer tape 218 during the transfer process.

Additionally, in an embodiment, the support 230 may be disposed adjacent to the upper surface of the wafer tape 218. As such, when the needle 226 is retracted from pressing on the wafer tape 218 during a transfer operation, a base surface of the support 230 (having the at least one opening 234 therein) may come into contact with the upper surface of the wafer tape 218, thereby preventing upward deflection of the wafer tape 218. This upward deflection may be caused in the event where the needle 226 pierces at least partially into the wafer tape 218, and while retracting, the wafer tape is stuck to the tip of the needle 226. Thus, the support 230 may reduce the time it takes to move to the next die 220. A wall perimeter shape of the support 230 may be cylindrical or any other shape that may be accommodated in the apparatus 200. Accordingly, the support 230 may be disposed between the needle 226 and an upper surface of the wafer tape 218.

With respect to the effect of temperature on the integrity of the wafer tape 218, it is contemplated that a temperature of support 230 may be adjusted so as to regulate the temperature of the needle 226 and the wafer tape 218, at least near the point of the transfer operation. Accordingly, the temperature of the support 230 may be heated or cooled, and a material of the support 230 may be selected to maximize thermal conductivity. For example, the support 230 may be formed of aluminum, or another relatively high thermal conductivity metal or comparable material, whereby the temperature may be regulated to maintain consistent results of the transfer operations. In an embodiment, air may be circulated within the support 230 to assist in regulating the temperature of a local portion of the wafer tape 218. Additionally, or alternatively, a fiber optic cable 230a may be inserted into the needle retraction support 230, and may further be against the needle 226 to assist in temperature regulation of the wafer tape 218 and/or the needle 226.

As indicated above, fixing mechanism 208 may assist in affixing the die 220 to the circuit trace 212 on a surface of the support substrate 210. FIG. 2B illustrates the apparatus 200 in a transfer stage, where the die 220 is pushed against the circuit trace 212. In an embodiment, fixing mechanism 208 may include an energy-emitting device 236 including, but not limited to: a laser, electromagnetic radiation, pressure vibration, ultrasonic welding, etc. In an embodiment, the use of pressure vibration for the energy-emitting device 236 may function by emitting a vibratory energy force so as to cause disruption of the molecules within the circuit trace against those of the electrical contact terminals so as to form a bond via the vibratory pressure. Furthermore, in an embodiment, the fixing mechanism 208 may be omitted entirely, and a transfer of one or more die to a circuit substrate may occur via other means, including adhesive strength or bonding potential.

In a non-limiting example, as depicted in FIG. 2B, a laser may be implemented as the energy-emitting device 236. During a transfer operation, laser 236 may be activated to emit a specific wavelength and intensity of light energy directed at the die 220 being transferred. The wavelength of the light of the laser 236 may be selected specifically based on the absorption of that wavelength of light with respect to the material of the circuit trace 212 without significantly affecting the material of the support substrate 210. For example, a laser having an operational wavelength of 808 nm, and operating at 5 W may be readily absorbed by silver, but not by polyester. As such, the laser beam may pass through the substrate of polyester and affect the silver of a circuit trace. Alternatively, the wavelength of laser may match the absorption of the circuit trace and the material of the substrate. The focus area of the laser 236 (indicated by the dashed lines emanating vertically from the laser 236 in FIG. 2B toward the support substrate 210) may be sized according to the size of the LED, such as for example, a 300 micron wide area.

Upon actuation of a predetermined controlled pulse duration of the laser 236, the circuit trace 212 may begin to cure (and/or melt or soften) to an extent that a fusing bond may form between the material of the circuit trace 212 and the electrical contact terminals (not shown) on the die 220. This bond further assists in separating the unpackaged die 220 from the wafer tape 218, as well as simultaneously affixing the die 220 to the support substrate 210. Additionally, the laser 236 may cause some heat transfer on the wafer tape 218, thereby reducing adhesion of the die 220 to the wafer tape 218 and thus assisting in the transfer operation.

In other instances, die may be released and fixed to the support substrates in many ways, including using a laser having a predetermined wavelength or a focused light (e.g., IR, UV, broadband/multispectral) for heating/activating circuit traces to thereby cure an epoxy or phase change bond materials, or for deactivating/releasing a die from wafer tape, or for initiating some combination of reactions. Additionally, or alternatively, a specific wavelength laser or light may be used to pass through one layer of the system and interact with another layer. Furthermore, a vacuum may be implemented to pull a die from the wafer tape, and air pressure may be implemented to push the die onto a support substrate, potentially including a rotary head between the die wafer tape and the support substrate. In yet another instance, ultrasonic vibration may be combined with pressure to cause the die to bond to the circuit traces.

Similar to the needle retraction support 230, the fixing mechanism may also include a support substrate support 238, which may be disposed between the laser 236 and the bottom surface of the support substrate 210. The support 238 may include an opening 240 at a base end thereof and an opening 242 at an upper end thereof. For example, the support 238 may be formed as a ring or hollow cylinder. The support may further include structure to secure a lens (not shown) to assist in directing the laser. The laser 236 emits the light through the openings 240, 242 to reach the support substrate 210. Furthermore, the upper end of the sidewalls of the support 238 may be disposed in direct contact with or closely adjacent to the bottom surface of the support substrate 210. Positioned as such, the support 238 may help to prevent damage from occurring to the support substrate 210 during the stroke of the needle 226 at the time of a transfer operation. In an embodiment, during the transfer operation, the portion of the bottom surface of the support substrate 210 that is aligned with the support 238 may contact the support 238, which thereby provides resistance against the incoming motion of the die 220 being pressed by the needle 226. Moreover, the support 238 may be movable in a direction of the vertical axis to be able to adjust a height thereof so as to raise and lower support 238 as necessary, including to a height of the support substrate 210.

In addition to the above features, apparatus 200 may further include a first sensor 244, from which apparatus 200 receives information regarding the die 220 on the wafer tape 218. In order to determine which die is to be used in the transfer operation, the wafer tape 218 may have a bar code (not shown) or other identifier, which is read or otherwise detected. The identifier may provide die map data to the apparatus 200 via the first sensor 244.

As shown in FIGS. 2A and 2B, the first sensor 244 may be positioned near the transfer mechanism 206 (or the needle 226 specifically), spaced apart from the transfer mechanism 206 by a distance d, which may range from about 1-5 inches, so as to enhance the accuracy of location detection. In an alternative embodiment, first sensor 244 may be disposed adjacent the tip of the needle 226 in order to sense the exact position of the die 220 in real time. During the transfer process, the wafer tape 218 may be punctured and or further stretched over time, which may alter the previously mapped, and thus expected, locations of the die 220 on the wafer tape 218. As such, small changes in the stretching of the wafer tape 218 could add up to significant errors in alignment of the die 220 being transferred. Thus, real time sensing may be implemented to assist in accurate die location.

In an embodiment, the first sensor 244 may be able to identify the precise location and type of die 220 that is being sensed. This information may be used to provide instructions to the wafer tape conveyor frame 222 indicating the exact location to which the wafer tape 218 should be conveyed in order to perform the transfer operation. Sensor 244 may be one of many types of sensors, or a combination of sensor types to better perform multiple functions. Sensor 244 may include but is not limited to: a laser range finder, or an optical sensor, such as a non-limiting example of a high-definition optical camera having micro photography capabilities.

Moreover, in an embodiment, a second sensor 246 may also be included in apparatus 200. The second sensor 246 may be disposed with respect to the support substrate 210 so as to detect the precise position of the circuit trace 212 on the support substrate 210. This information may then be used to determine any positional adjustment needed to align the support substrate 210 between the transfer mechanism 206 and the fixing mechanism 208 so that the next transfer operation occurs in the correct location on the circuit trace 212. This information may further be relayed to the apparatus 200 to coordinate conveying the support substrate 210 to a correct position, while simultaneously conveying instructions to the wafer tape conveyor frame 222. A variety of sensors are also contemplated for sensor 246 including optical sensors, such as one non-limiting example of a high-definition optical camera having micro photography capabilities.

FIGS. 2A and 2B further illustrate that the first sensor 244, the second sensor 246, and the laser 236 may be grounded. In an embodiment, the first sensor 244, the second sensor 246, and the laser 236 may all be grounded to the same ground (G), or alternatively, to a different ground (G).

Depending on the type of sensor used for the first and second sensors 244, 246, the first or second sensors may further be able to test the functionality of transferred die. Alternatively, an additional tester sensor (not shown) may be incorporated into the structure of apparatus 200 to test individual die before removing the support substrate 210 from the apparatus 200.

Furthermore, in some examples, multiple independently-actuatable needles and/or lasers may be implemented in a machine in order to transfer and fix multiple die at a given time. The multiple needles and/or lasers may be independently movable within a three-dimensional space. Multiple die transfers may be done synchronously (multiple needles going down at the same time), or concurrently but not necessarily synchronously (e.g., one needle going down while the other is going up, which arrangement may balance better the components and minimize vibration). Control of the multiple needles and/or lasers may be coordinated to avoid collisions between the plurality of components. Moreover, in other examples, the multiple needles and/or lasers may be arranged in fixed positions relative to each other.

Example Needle Tip Profile

Figure 3:
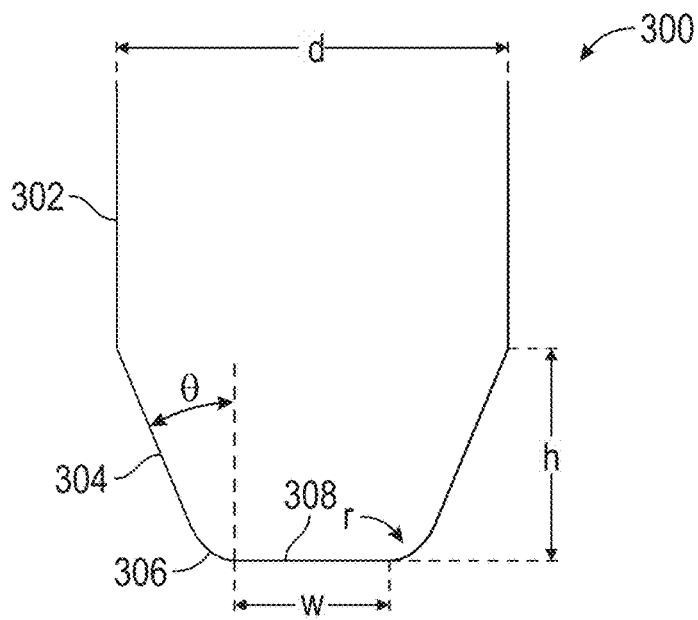
FIG. 3 illustrates an embodiment of a shape profile of the end of a needle of a direct transfer mechanism.

As mentioned above, a profile shape of the tip 300 of a needle is discussed with respect to FIG. 3, which shows a schematic example profile shape of the tip 300. In an embodiment, the tip 300 may be defined as the end of the needle, including sidewalls 302 adjoining tapered portion 304, corner 306, and base end 308, which may extend transversely to the opposing side of the needle. The specific size and shape of the tip 300 may vary according to factors of the transfer process such as, for example, the size of the die 220 being transferred and the speed and the impact force, of a transfer operation. For example, the angle θ seen in FIG. 3, as measured between a longitudinal direction of the central axis of the needle and the tapered portion 304 may range from about 10 to 15°; the radius r of the corner 306 may range from about 15 to 50+ microns; the width w of the base end 308 may range from about 0 to 100+ microns, where w may be less than or equal to the width of the die 220 being transferred; the height h of the tapered portion 304 may range from about 1 to 2 mm, where h may be greater than a distance traveled by needle during a stroke of a transfer operation; and the diameter d of the needle 226 may be approximately 1 mm.

Other needle tip profiles are contemplated and may have different advantages depending on various factors associated with the transfer operation. For example, the needle tip 300 may be more blunt to mirror the width of the die or more pointed so as to press in a smaller area of the wafer tape. In an embodiment, the transfer mechanism 206 may implement two or more needles. In such an instance, the two or more needles may have a substantially similar needle profile or they may have substantially different needle profiles. For example, the transfer mechanism 206 may include one or more needles 226 that have a needle tip profile as described and depicted with regard to FIG. 3. The transfer mechanism may further include one or more needles 226 that have a substantially different needle tip profile (i.e., wider than the depicted and described needle tip profile or narrower than the depicted and described needle tip profile). In an embodiment, the needle profile may not include any tapering to a point such that the needle 226 includes a constant width along an entire length of the needle 226.

Example Needle Actuation Performance Profile

Figure 4:
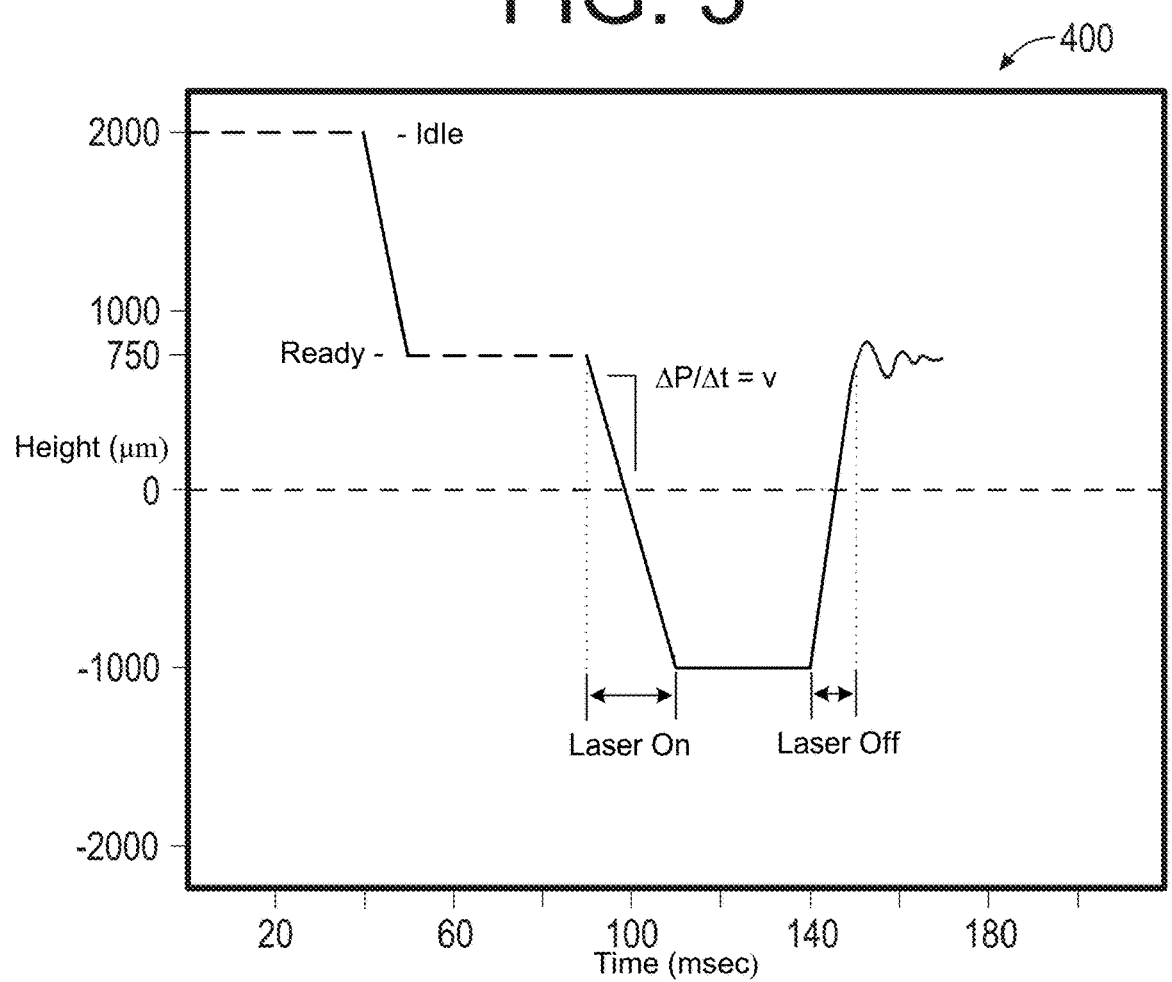
FIG. 4 illustrates an embodiment of a needle actuation stroke profile.

Illustrated in FIG. 4 is an embodiment of a needle actuation performance profile. That is, FIG. 4 depicts an example of the stroke pattern performed during a transfer operation by displaying the height of the needle tip with respect to the plane of the wafer tape 218 as it varies with time. As such, the "0" position in FIG. 4 may be the upper surface of the wafer tape 218. Further, inasmuch as the idle time of the needle and the ready time of the needle may vary depending on the programmed process or the varying duration of time between transferring a first die and the time it takes to reach a second die for transfer, the dashed lines shown at the idle and ready phases of the stroke pattern indicate that the time is approximate, but may be longer or shorter in duration. Moreover, it is to be understood that the solid lines shown for use of the laser are example times for an embodiment illustrated herewith, however, the actual duration of laser on and off time may vary depending on the materials used in forming the circuit (such as the material choice of the circuit trace), the type of support substrate, the desired effect (pre-melting circuit trace, partial bond, complete bond, etc.), the distance of the laser from the bond point (i.e., the upper surface of the support substrate), the size of the die being transferred, and the power/intensity/wavelength of the laser, etc. Accordingly, the following description of the profile shown in FIG. 4 may be an example embodiment of a needle profile.

In an embodiment, prior to a transfer operation, a fully retracted needle tip may be idle at approximately 2000 μm above the surface of the wafer tape. After a varying amount of time, the needle tip may descend rapidly to rest in the ready state at approximately 750 μm above the surface of the wafer tape. After another undetermined amount of time at the ready state, the needle tip may descend again to contact the die and press the wafer tape with the die down to a height of approximately −1000 μm, where at the die may be transferred to the support substrate. The dotted vertical line at the start of the laser on section indicates that the laser may come on at some point between the beginning of the descent from the ready phase and the bottom of the stroke of the needle tip. For example, the laser may turn on at approximately 50% of the way through the descent. In an embodiment, by turning the laser on early, for example before the needle begins to descend, the circuit trace may begin to soften prior to contact with the die so as to form a stronger bond, or additionally, the die wafer may be affected or prepared during this time. The phase in which the laser turns on may last approximately 20 ms ("milliseconds"). At the bottom of the stroke, where the laser is on, that phase may be a bonding phase between the die and the support substrate. This bonding phase may allow the circuit trace to attach to the die contacts, which stiffens quickly after the laser is turned off. As such, the die may be bonded to the support substrate. The bonding phase may last approximately 30 ms. Thereafter, the laser may be turned off and the needle may ascend to the ready phase rapidly. Conversely, the laser may be turned off before the needle begins to ascend, or at some point during the ascent of the needle tip back to the ready phase, the laser may be turned off. After the ascent of the needle tip to the ready phase, the height of the needle tip may overshoot and bounce back under the height of the ready phase somewhat buoyantly. While some of the buoyancy may be attributed to the speed at which the needle tip ascends to the ready phase, the speed and the buoyancy may be intentional in order to assist in retracting a tip of the needle from a surface of the wafer tape in the case where the needle has pierced the wafer tape and may be stuck therein.

As depicted in FIG. 4, the timing in which the laser is turned off may be longer than the timing in which the laser is turned on, where a slower speed of the descent may assist in preventing damage to the die, and as mentioned above, the rapid rate of ascent may assist in extracting the needle tip from the wafer tape more effectively. Nevertheless, as previously stated, the timing shown on FIG. 4 is approximate, particularly with respect to the idle and ready periods. Therefore, the numerical values assigned along the bottom edge of the FIG. 4 are for reference and should not be taken literally, except when otherwise stated.

Example Support Substrate

Figure 5:
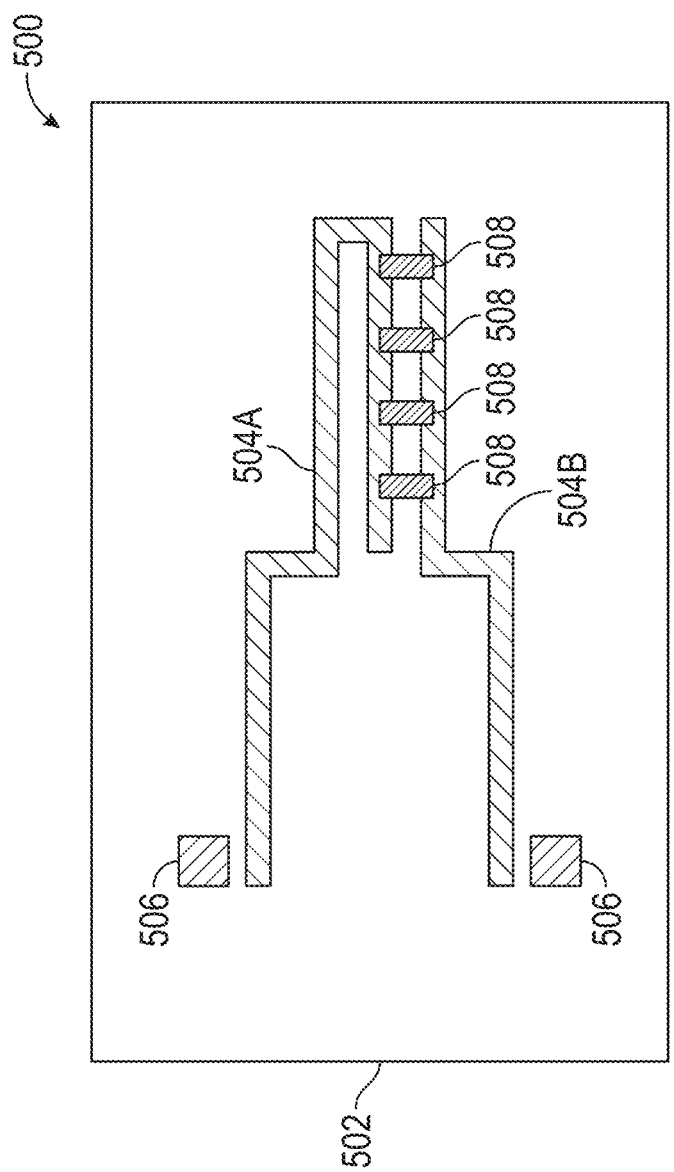
FIG. 5 illustrates a plan view of an embodiment of a support substrate having a circuit trace thereon.

FIG. 5 illustrates an example embodiment of a processed support substrate 500. A support substrate 502 may include a first portion of a circuit trace 504A, which may perform as a negative or positive power terminal when power is applied thereto. A second portion of the circuit trace 504B may extend adjacent to the first portion of the circuit trace 504A, and may act as a corresponding positive or negative power terminal when power is applied thereto.

As similarly described above with respect to the wafer tape, in order to determine where to convey the support substrate 502 to perform the transfer operation, the support substrate 502 may have a bar code (not shown) or other identifier, which is read or otherwise detected. The identifier may provide circuit trace data to the apparatus. The support substrate 502 may further include datum points 506. Datum points 506 may be visual indicators for sensing by the support substrate sensor (for example, second sensor 246 in FIG. 2) to locate the first and second portions of the circuit trace 504A, 504B. Once the datum points 506 are sensed, a shape and relative position of the first and second portions of the circuit trace 504A, 504B with respect to the datum points 506 may be determined based on preprogrammed information. Using the sensed information in connection with the preprogrammed information, the support substrate conveyance mechanism may convey the support substrate 502 to the proper alignment position for the transfer operation.

Additionally, die 508 are depicted in FIG. 5 as straddling between the first and second portions of the circuit trace 504A, 504B. In this manner, the electrical contact terminals (not shown) of the die 508 may be bonded to the support substrate 502 during a transfer operation. Accordingly, power may be applied to run between the first and second portions of the circuit trace 504A, 504B, and thereby powering die 508. For example, the die may be unpackaged LEDs that were directly transferred from a wafer tape to the circuit trace on the support substrate 502. Thereafter, the support substrate 502 may be processed for completion of the support substrate 502 and used in a circuit or other final product. Further, other components of a circuit may be added by the same or other means of transfer to create a complete circuit, and may include control logic to control LEDs as one or more groups in some static or programmable or adaptable fashion.

Simplified Example Direct Transfer System

Figure 6:
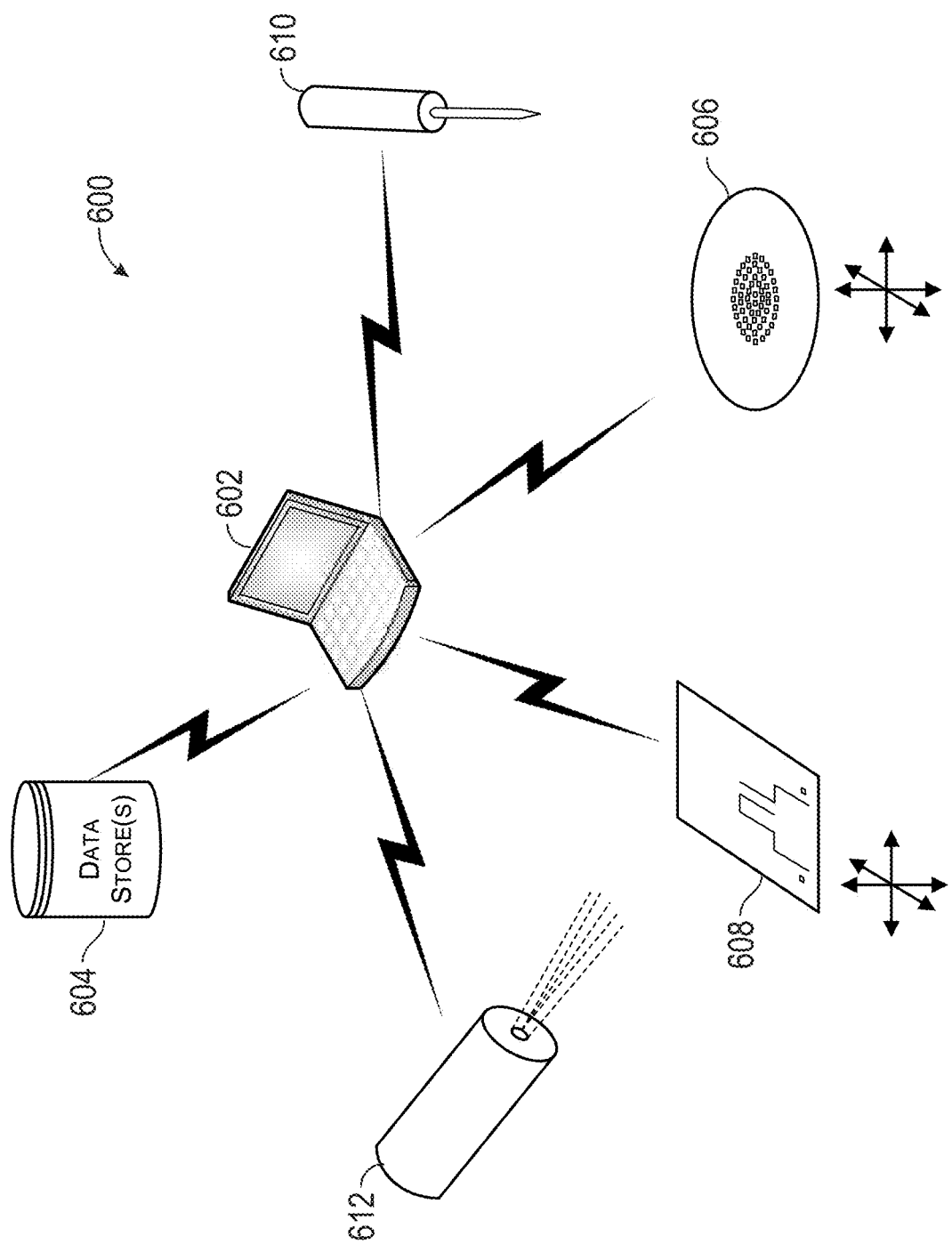
FIG. 6 illustrates a schematic view of an embodiment of elements of a direct die transfer system.

A simplified example of an embodiment of a direct transfer system 600 is illustrated in FIG. 6. The transfer system 600 may include a personal computer (PC) 602 (or server, data input device, user interface, etc.), a data store 604, a wafer tape mechanism 606, a support substrate mechanism 608, a transfer mechanism 610, and a fixing mechanism 612. Inasmuch as a more detailed description of the wafer tape mechanism 606, the support substrate mechanism 608, the transfer mechanism 610, and the fixing mechanism 612 has been given heretofore, specific details about these mechanisms is not repeated here. However, a brief description of how the wafer tape mechanism 606, the support substrate mechanism 608, the transfer mechanism 610, and the fixing mechanism 612 relate to interactions between the PC 602 and the data store 604 is described hereafter.

In an embodiment, the PC 602 communicates with data store 604 to receive information and data useful in the transfer process of directly transferring die from a wafer tape in wafer tape mechanism 606 using the transfer mechanism 610 on to a support substrate in the support substrate mechanism 608 whereat the die may be fixed upon the support substrate via actuation of a laser or other energy-emitting device located in the fixing mechanism 612. PC 602 may also serve as a receiver, compiler, organizer, and controller of data being relayed to and from each of the wafer tape mechanism 606, the support substrate mechanism 608, the transfer mechanism 610, and the fixing mechanism 612. PC 602 may further receive directed information from a user of the transfer system 600.

Note that, while FIG. 6 depicts directional movement capability arrows adjacent to the wafer tape mechanism 606 and the support substrate mechanism 608, those arrows merely indicate general directions for mobility, however, it is contemplated that both the wafer tape mechanism 606 and the support substrate mechanism 608 may also be able to move in other directions including rotation in plane, pitch, roll, and yaw, for example.

Figure 7:
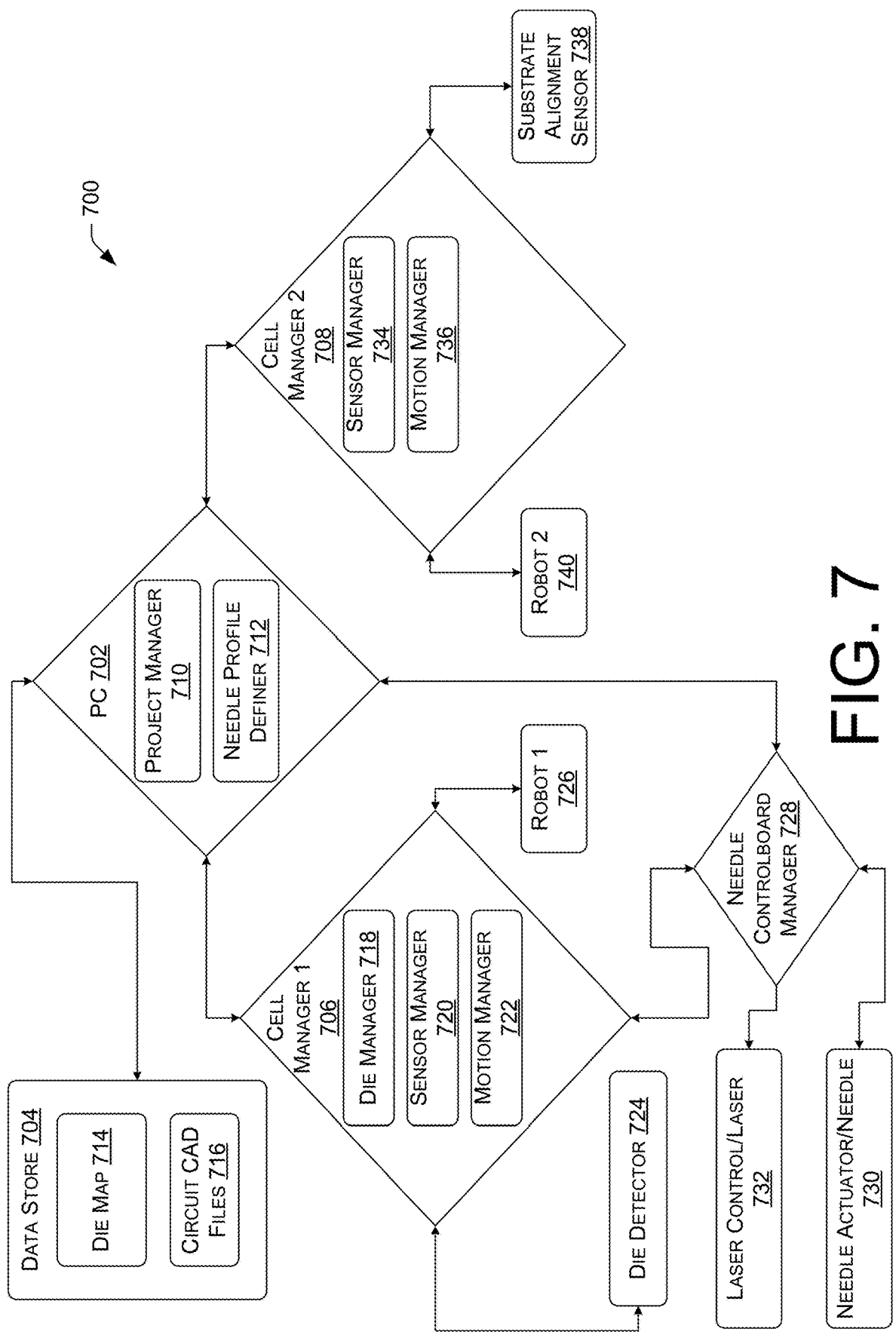
FIG. 7 illustrates a schematic view of an embodiment of a circuitry path between machine hardware and controllers of a direct die transfer system.

Additional details of the interaction of the components of the transfer system 600 are described with respect to FIG. 7 below.

Detailed Example Direct Transfer System

A schematic of the communication pathways between the respective elements of a transfer system 700 may be described as follows.

The direct transfer system may include a personal computer (PC) 702 (or server, data input device, user interface, etc.), which may receive communication from, and provide communication to a data store 704. The PC 702 may further communicate with a first cell manager 706 (illustrated as "Cell Manager 1") and a second cell manager 708 (illustrated as "Cell Manager 2"). Therefore, the PC 702 may control and synchronize the instructions between the first cell manager 706 and the second cell manager 708.

PC 702 may include processors and memory components with which instructions may be executed to perform various functions with respect to the first and second cell managers 706, 708, as well as data store 704. In an embodiment, PC 702 may include a project manager 710 and a needle profile definer 712.

Project manager 710 may receive input from the first and second cell managers 706, 708 and data store 704 to organize the direct transfer process and maintain smooth functioning with respect to orientation and alignment of the support substrate with respect to the wafer tape and the die thereon.

Needle profile definer 712 may contain data regarding the needle stroke performance profile, which may be used to instruct the transfer mechanism regarding the desired needle stroke performance according to the specific die on the loaded wafer tape and the pattern of the circuit trace on the support substrate. Additional details of the needle profile definer 712 are discussed further herein below.

Turning back to data store 704, data store 704 may include memory containing data such as a die map 714, which may be specific to the wafer tape loaded in the wafer tape mechanism. As explained previously, a die map may describe the relative locations of each die on the wafer tape and the quality thereof for the purpose of providing a pre-organized description of the location of specific die. Further, data store 704 may also include memory containing circuit CAD files 716. Circuit CAD files 716 may contain data regarding a specific circuit trace pattern on the loaded support substrate.

Project manager 710 may receive the die map 714 and circuit CAD files 716 from the data store 704, and may relay the respective information to the first and second cell managers 706, 708, respectively.

In an embodiment, the first cell manager 706 may use the die map 714 from data store 704 via a die manager 718. More specifically, die manager 718 may compare die map 714 with the information received by a sensor manager 720, and based thereon, may provide instructions to a motion manager 722 regarding the location of a particular die. Sensor manager 720 may receive data regarding the actual location of die on the wafer tape from a die detector 724. Sensor manager 720 may also instruct the die detector 724 to look for a particular die in a particular location according to die map 714. The die detector 724 may include a sensor such as the second sensor 244 in FIGS. 2A and 2B. Based on the received data of the actual location (either a confirmation or an update regarding a shift in position) of the die on the wafer tape, the motion manager 722 may instruct a first robot 726 (illustrated as "Robot 1") to convey the wafer tape to an alignment position with the needle of the transfer mechanism.

Upon reaching the instructed location, the first robot 726 may communicate the completion of its movement to a needle controlboard manager 728. Additionally, the needle control board manager 728 may directly communicate with the PC 702 to coordinate the execution of the transfer operation. At the time of the execution of the transfer operation, the PC 702 may instruct the needle control board manager 728 to activate the needle actuator/needle 730, thereby causing the needle to perform a stroke in accordance with the loaded needle profile in the needle profile definer 712. The needle controlboard manager 728 may also activate the laser control/laser 732, thereby causing the laser to emit a beam toward the support substrate as the needle presses down a die via the wafer tape to execute the transfer operation. As indicated above, the activation of the laser control/laser 732 may occur prior to, simultaneously, during, or after activation, or even a complete actuation, of the needle stroke.

Accordingly, the first cell manager 706 may pass through a plurality of states including: determining where to tell the first robot 726 to go; telling the first robot 726 to go to the determined location; turning on the needle; activating the fixing device; and resetting.

Prior to execution of the transfer operation, the project manager 710 may relay the data of the circuit CAD files 716 to the second cell manager 708. The second cell manager 708 may include a sensor manager 734 and a motion manager 736. Using the circuit CAD files 716, the sensor manager 734 may instruct the substrate alignment sensor 738 to find the datum points on the support substrate and thereby detect and orient the support substrate according to the location of the circuit trace thereon. The sensor manager 734 may receive confirmation or updated location information of the circuit trace pattern on the support substrate. The sensor manager 734 may coordinate with the motion manager 736 to provide instructions to a second robot 740 (illustrated as "Robot 2") to convey the support substrate to an alignment position (i.e., a transfer fixing position) for execution of the transfer operation. Thus, the circuit CAD files 716 may assist the project manager 710 in aligning the support substrate with respect to the wafer tape such that the die may be accurately transferred to the circuit trace thereon.

Accordingly, the second cell manager 708 may pass through a plurality of states including: determining where to tell the second robot 740 to go; telling the second robot 740 to go to the determined location; and resetting.

It is understood that additional and alternative communication pathways between all or fewer than all of the various components of the transfer system 700 described above are possible.

Example Direct Transfer Method

Figure 8:
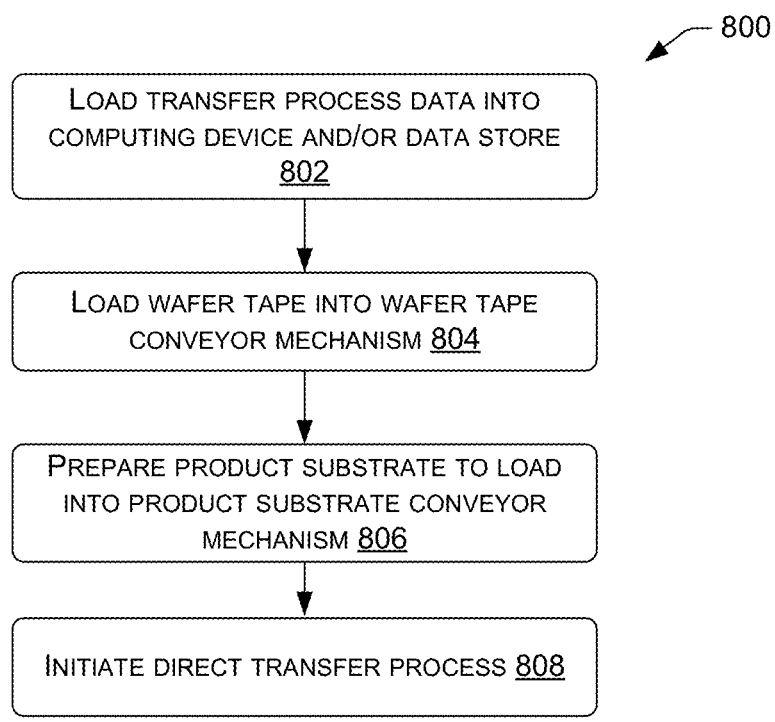
FIG. 8 illustrates a method of a direct die transfer process according to an embodiment of this application.

A method 800 of executing a direct transfer process, in which one or more die is directly transferred from a wafer tape to a support substrate, is illustrated in FIG. 8. The steps of the method 800 described herein may not be in any particular order and as such may be executed in any satisfactory order to achieve a desired product state. The method 800 may include a step of loading transfer process data into a PC and/or a data store 802. The transfer process data may include data such as die map data, circuit CAD files data, and needle profile data.

A step of loading a wafer tape into a wafer tape conveyor mechanism 804 may also be included in method 800. Loading the wafer tape into the wafer tape conveyor mechanism may include controlling the wafer tape conveyor mechanism to move to a load position, which is also known as an extract position. The wafer tape may be secured in the wafer tape conveyor mechanism in the load position. The wafer tape may be loaded so that the die of the semiconductor are facing downward toward the support substrate conveyor mechanism.

The method 800 may further include a step of preparing the support substrate to load into the support substrate conveyor mechanism 806. Preparing the support substrate may include a step of screen printing a circuit trace on the support substrate according to the pattern of the CAD files being loaded into the PC or data store. Additionally, datum points may be printed onto the circuit substrate in order to assist in the transfer process. The support substrate conveyor mechanism may be controlled to move to a load position, which is also known as an extraction position, whereat the support substrate may be loaded into the support substrate conveyor mechanism. The support substrate may be loaded so that the circuit trace faces toward the die on the wafer. In an embodiment, for example, the support substrate may be delivered and placed in the load position by a conveyor (not shown) or other automated mechanism, such as in the style of an assembly line. Alternatively, the support substrate may be manually loaded by an operator.

Once the support substrate is properly loaded into the support substrate conveyor mechanism in the wafer tape is properly loaded into the wafer tape conveyor mechanism, a program to control the direct transfer of the die from the wafer tape to the circuit trace of the support substrate may be executed via the PC to commence the direct transfer operation 808. The details of the direct transfer operation are described below.

Example Direct Transfer Operation Method

Figure 9:
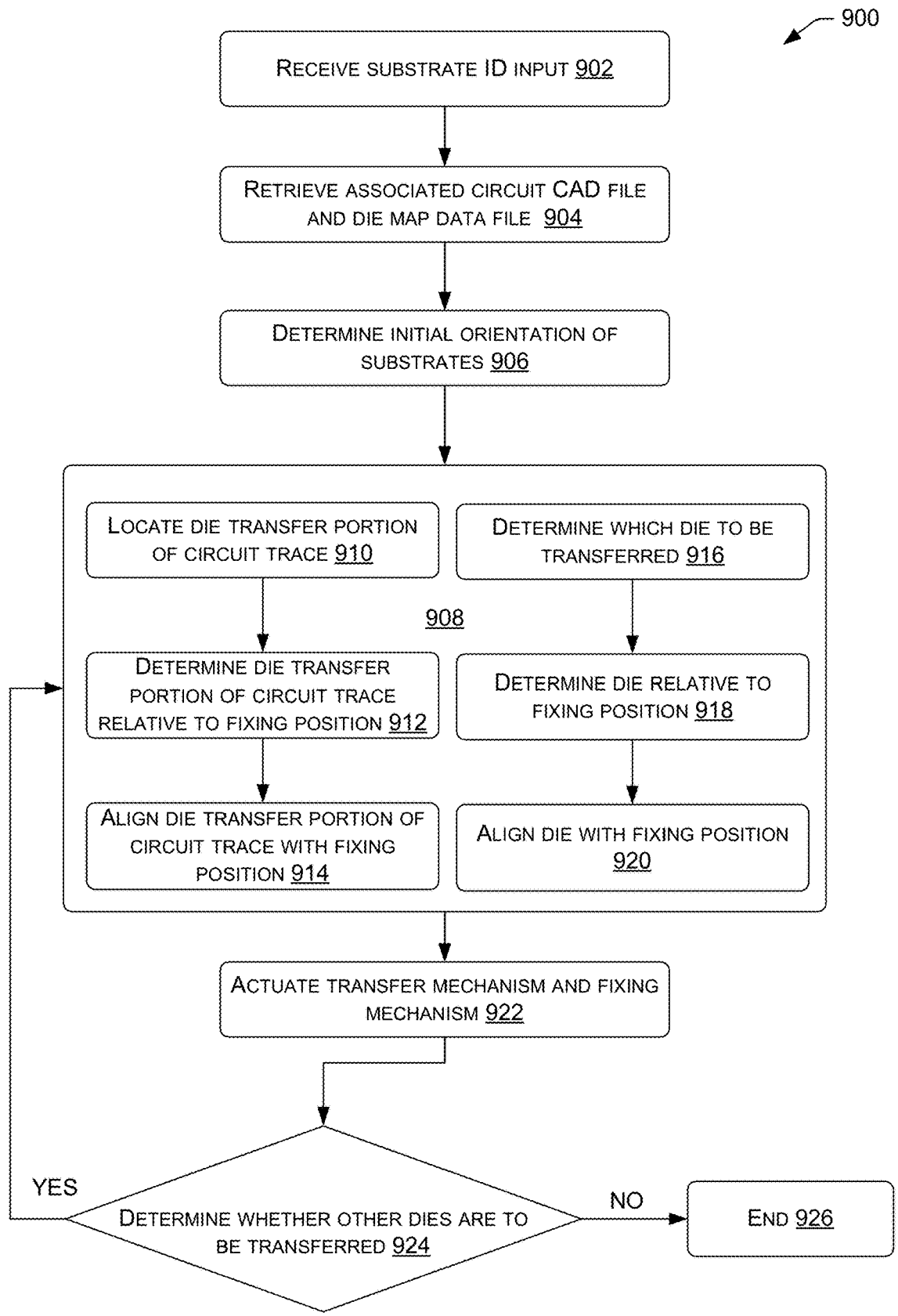
FIG. 9 illustrates a method of a direct die transfer operation according to an embodiment of this application.

A method 900 of the direct transfer operation of causing die to be transferred directly from the wafer tape (or other substrate holding die, also called a "die substrate" for simplified description of FIG. 9) to the support substrate is illustrated in FIG. 9. The steps of the method 900 described herein may not be in any particular order and as such may be executed in any satisfactory order to achieve a desired product state.

In order to determine which die to place on the support substrate and where to place the die on the support substrate, the PC may receive input regarding the identification of the support substrate and the identification of the die substrate containing the die to be transferred 902. This input may be entered manually by a user, or the PC may send a request to the cell managers in control, respectively, of the support substrate alignment sensor and the die detector. The request may instruct the sensor to scan the loaded substrate for an identification marker, such as a barcode or QR code; and/or the request may instruct the detector to scan the loaded die substrate for an identification marker, such as a barcode or QR code.

Using the support substrate identification input, the PC may query the data store or other memory to match the respective identification markers of the support substrate and the die substrate and retrieve the associated data files 904. In particular, the PC may retrieve a circuit CAD file associated with the support substrate that describes the pattern of the circuit trace on the support substrate. The circuit CAD file may further contain data such as the number of, relative positions of, and respective quality requirement of, the die to be transferred to the circuit trace. Likewise, the PC may retrieve a die map data file associated with the die substrate that provides a map of the relative locations of the specific die on the die substrate.

In the process of executing a transfer of a die to the support substrate, the PC may determine the initial orientation of the support substrate and the die substrate relative to the transfer mechanism and the fixing mechanism. Within step 906, the PC may instruct the substrate alignment sensor to locate datum points on the support substrate. As discussed above, the datum points may be used as reference markers for determining the relative location and orientation of the circuit trace on the support substrate. Further, the PC may instruct the die detector to locate one or more reference points on the die substrate to determine the outlay of the die.

Once the initial orientation of the support substrate and die substrate are determined, the PC may instruct the respective support substrate and die substrate conveyance mechanisms to orient the support substrate and die substrate, respectively, into a position of alignment with the transfer mechanism and the fixing mechanism.

The alignment step 908 may include determining the location of the portion of the circuit trace to which a die is to be transferred 910, and where the portion is located relative to the transfer fixing position 912. The transfer fixing position may be considered to be the point of alignment between the transfer mechanism and the fixing mechanism. Based on the data determined in steps 910 and 912, the PC may instruct the support substrate conveyance mechanism to convey the support substrate so as to align the portion of the circuit trace to which a die is to be transferred with the transfer fixing position 914.

The alignment step 908 may further include determining which die on the die substrate will be transferred 916, and where the die is located relative to the transfer fixing position 918. Based on the data determined in steps 916 and 918, the PC may instruct the wafer tape conveyance mechanism to convey the die substrate so as to align the die to be transferred with the transfer fixing position 920.

Once the die to be transferred from the die substrate and the portion of the circuit trace to which a die is to be transferred are aligned with the transfer mechanism and the fixing mechanism, the needle and the fixing device (e.g., laser) may be actuated 922 to effectuate the transfer of the die from the die substrate to the support substrate.

After a die is transferred, the PC may determine whether additional die are to be transferred 924. In the case where another die is to be transferred, the PC may revert to step 908 and realign the product and die substrates accordingly for a subsequent transfer operation. In the case where there will not be another die transferred, the transfer process is ended 926.

Example Direct Transfer Conveyor/Assembly Line System

Figure 10:
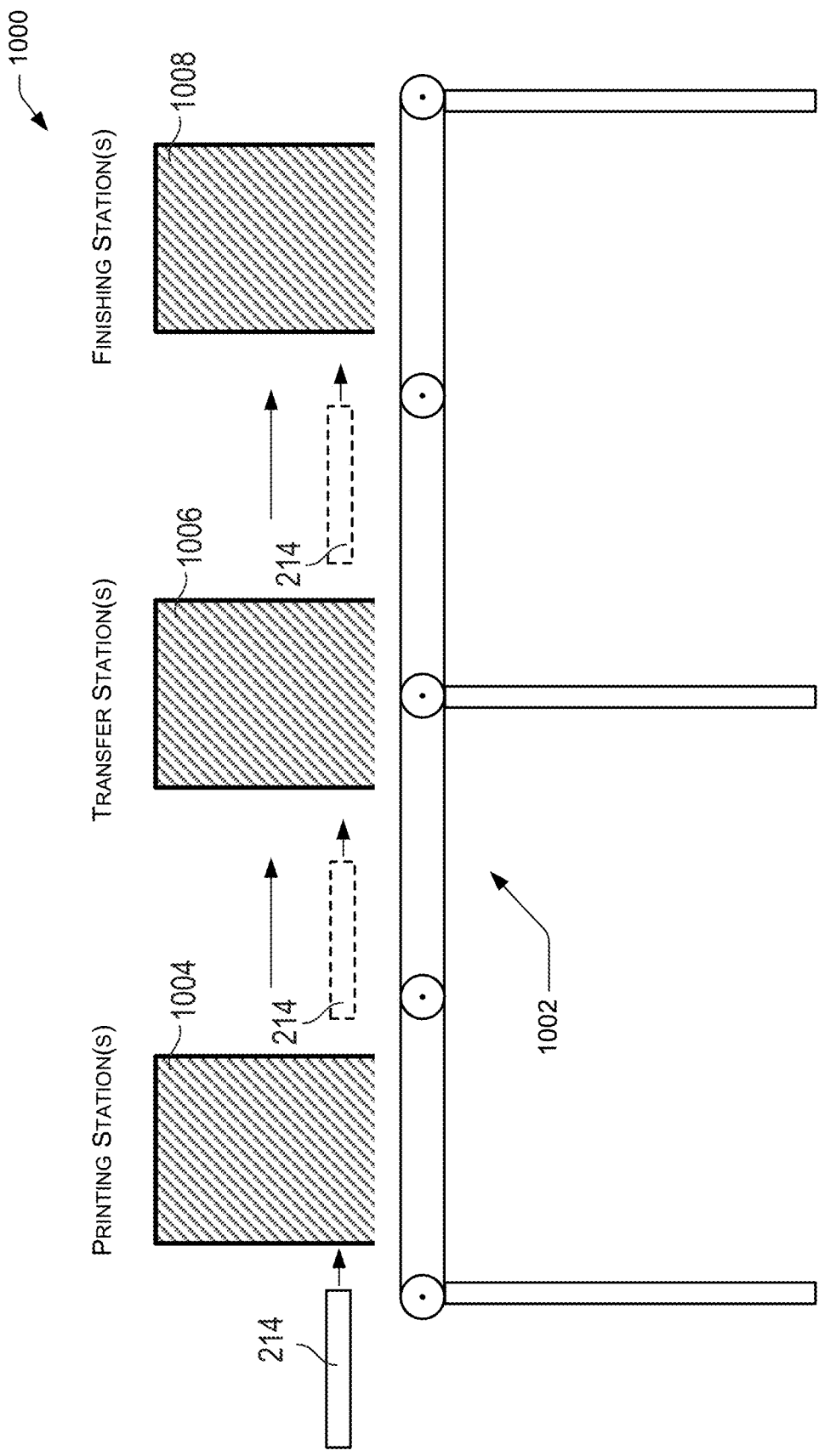
FIG. 10 illustrates an embodiment of a direct transfer apparatus and process implementing a conveyor system.

In an embodiment described with respect to FIG. 10, several of the components of the direct transfer apparatus described above may be implemented in a conveyor/assembly line system 1000 (hereinafter "conveyor system"). In particular, FIGS. 2A and 2B depict the support substrate 210 being held by the support substrate conveyor frame 214 and tensioned by the support substrate holder frame 216. As an alternative to securing a support substrate conveyor frame 214 in a confined area via a system of motors, rails, and gear as indicated with respect to apparatus 200, FIG. 10 illustrates the support substrate conveyor frame 214 being conveyed through the conveyor system 1000 in which the support substrate goes through an assembly line style process. As the actual means of conveyance between operations being performed on the support substrate being conveyed, the conveyor system 1000 may include a series of tracks, rollers, and belts 1002 and/or other handling devices to sequentially convey a plurality of support substrate conveyor frames 214, each holding a support substrate.

In an embodiment, operation stations of the conveyor system 1000 may include one or more printing stations 1004. As blank support substrates are conveyed to the printing station(s) 1004, a circuit trace may be printed thereon. In the case that there are multiple printing stations 1004, the multiple printing stations 1004 may be arranged serially, and may be configured to perform one or more printing operations each so as to form a complete circuit trace.

Additionally, in the conveyor system 1000, the support substrate conveyor frame 214 may be conveyed to one or more die transfer stations 1006. In the event that there are multiple die transfer stations 1006, the multiple die transfer stations 1006 may be arranged serially, and may be configured to perform one or more die transfers each. At the transfer station(s), the support substrates may have one or more die transferred and affixed thereto via a transfer operation using one or more of the direct transfer apparatus embodiments described herein. For example, each transfer station 1006 may include a wafer tape conveyance mechanism, a transfer mechanism, and a fixing mechanism. In an embodiment, a circuit trace may have been previously prepared on the support substrate, and as such, the support substrate may be conveyed directly to the one or more transfer stations 1006.

In the transfer stations 1006, the wafer tape conveyance mechanism, the transfer mechanism, and the fixing mechanism may be aligned with respect to the conveyed support substrate conveyor frame 214 upon entering the station. In this situation, the transfer station 1006 components may repeatedly perform the same transfer operation in the same relative position on each support substrate as the plurality of support substrates are conveyed through the conveyor system 1000.

Moreover, the conveyor system 1000 may further include one or more finishing stations 1008 to which the support substrate may be conveyed to have final processing performed. The type, amount, and duration of the final processing may depend on the features of the product and the properties of the materials used to make the product. For example, the support substrate may receive additional curing time, a protective coating, additional components, etc., at the finishing station(s) 1008.

Second Example Embodiment of a Direct Transfer Apparatus

Figure 11:
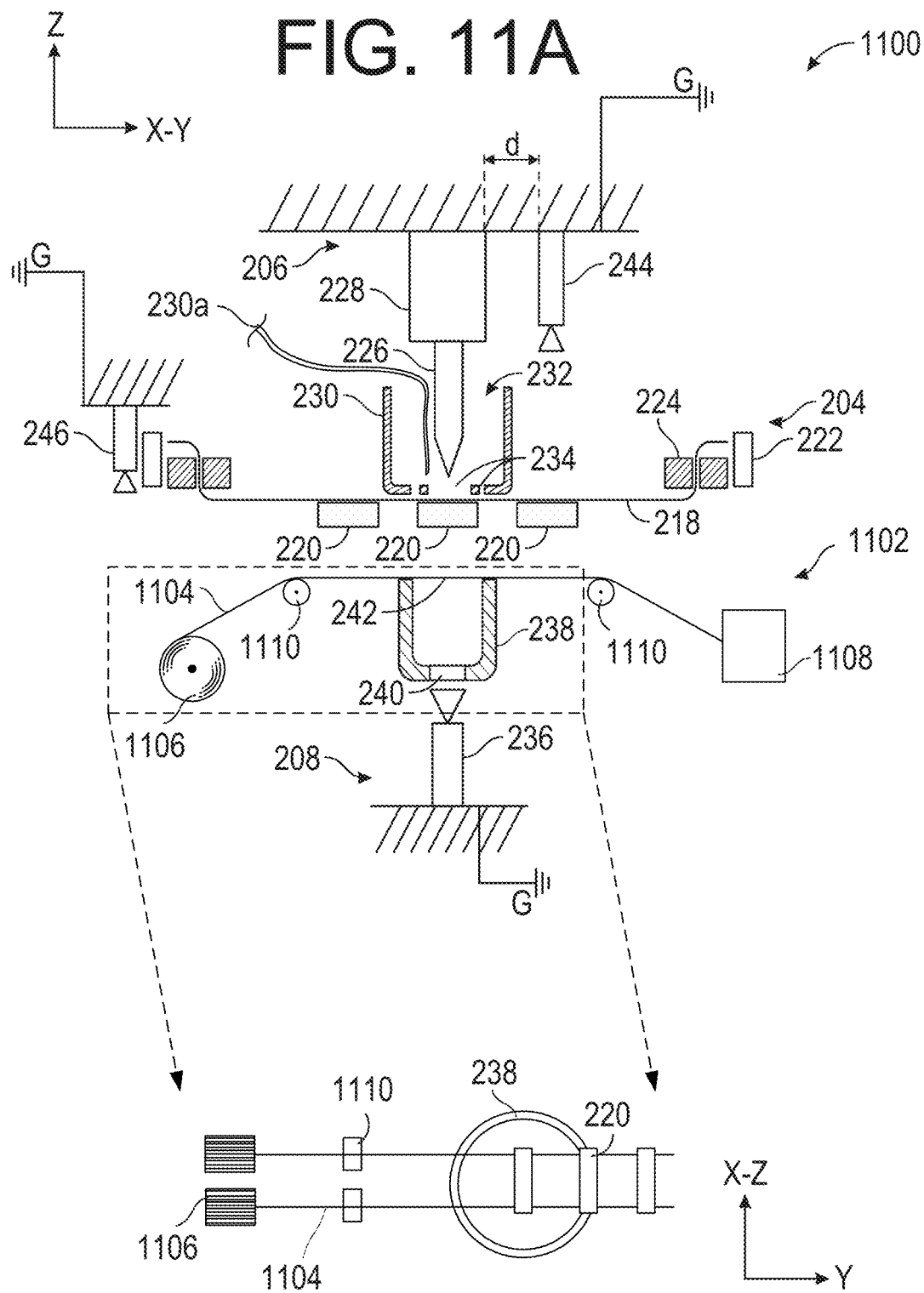
FIG. 11A illustrates a schematic view of another embodiment of a direct transfer apparatus in a pre-transfer position.
FIG. 11B illustrates a schematic top view of the support substrate conveyance mechanism post-transfer operation of the embodiment in FIG. 11A.

In another embodiment of a direct transfer apparatus, as seen in FIGS. 11A and 11B, a "light string" may be formed. While many of the features of apparatus 1100 may remain substantially similar to those of apparatus 200 of FIGS. 2A and 2B, support substrate conveyance mechanism 1102, as depicted in FIGS. 11A and 11B, may be configured to convey a support substrate 1104 that is different than the support substrate 210. Specifically, in FIGS. 2A and 2B, the support substrate conveyance mechanism 202 includes the support substrate conveyor frame 214 and the tensioner frame 216, which secure the sheet-like support substrate 218 under tension. In the embodiment of FIGS. 11A and 11B, however, the support substrate conveyance mechanism 1102 may include a support substrate reel system.

The support substrate reel system may include one or two circuit trace reels 1106 that are wound with a "string circuit," which may include a pair of adjacently wound conductive strings or wires as the support substrate 1104. In an instance with only one reel, the reel 1106 may be located on a first side of the transfer position, and the pair of conductive strings (1104) may be wound around the single reel 1106. Alternatively, there may be two circuit trace reels 1106 located on the first side of the transfer position, where each reel 1106 contains a single strand of the string circuit and the strands are then brought together to pass through the transfer position.

Regardless of whether one reel 1106 or two reels 1106 are implemented, the die transfer process of forming the string circuit may be substantially similar in each case. In particular, the conductive strings of the support substrate 1104 may be threaded from the reel(s) 1106 across the transfer position and may be fed into a finishing device 1108. In an embodiment, the finishing device 1108 may be: a coating device to receive a protective coating, for example, of a translucent or transparent plastic; or a curing apparatus, which may finish curing the string circuit as a part of final processing of the product. Additionally, or alternatively, the circuit string may be fed onto another reel, which may wind up the string circuit thereon before final processing of the string circuit. As the conductive strings of the support substrate 1104 are pulled through the transfer position, the transfer mechanism 206 may be actuated to perform a needle stroke (as described above) to transfer die 220 to the conductive strings of the support substrate 1104 so that electrical contact terminals of the die 220 are placed, respectively, on the adjacent strings, and the fixing mechanism 208 may be actuated to affix the die 220 in position.

Furthermore, apparatus 1100 may include tensioning rollers 1110 on which the conductive strings of the support substrate 1104 may be supported and further tensioned against. Thus, the tensioning rollers 1110 may assist in maintaining tension in the formed string circuit so as to enhance the die transfer accuracy.

In FIG. 11B, die 220 are depicted as having been transferred to the conductive strings of the support substrate 1104, thereby uniting (to some extent) the conductive strings of the support substrate 1104 and forming a string circuit.

Third Example Embodiment of a Direct Transfer Apparatus

Figure 12:
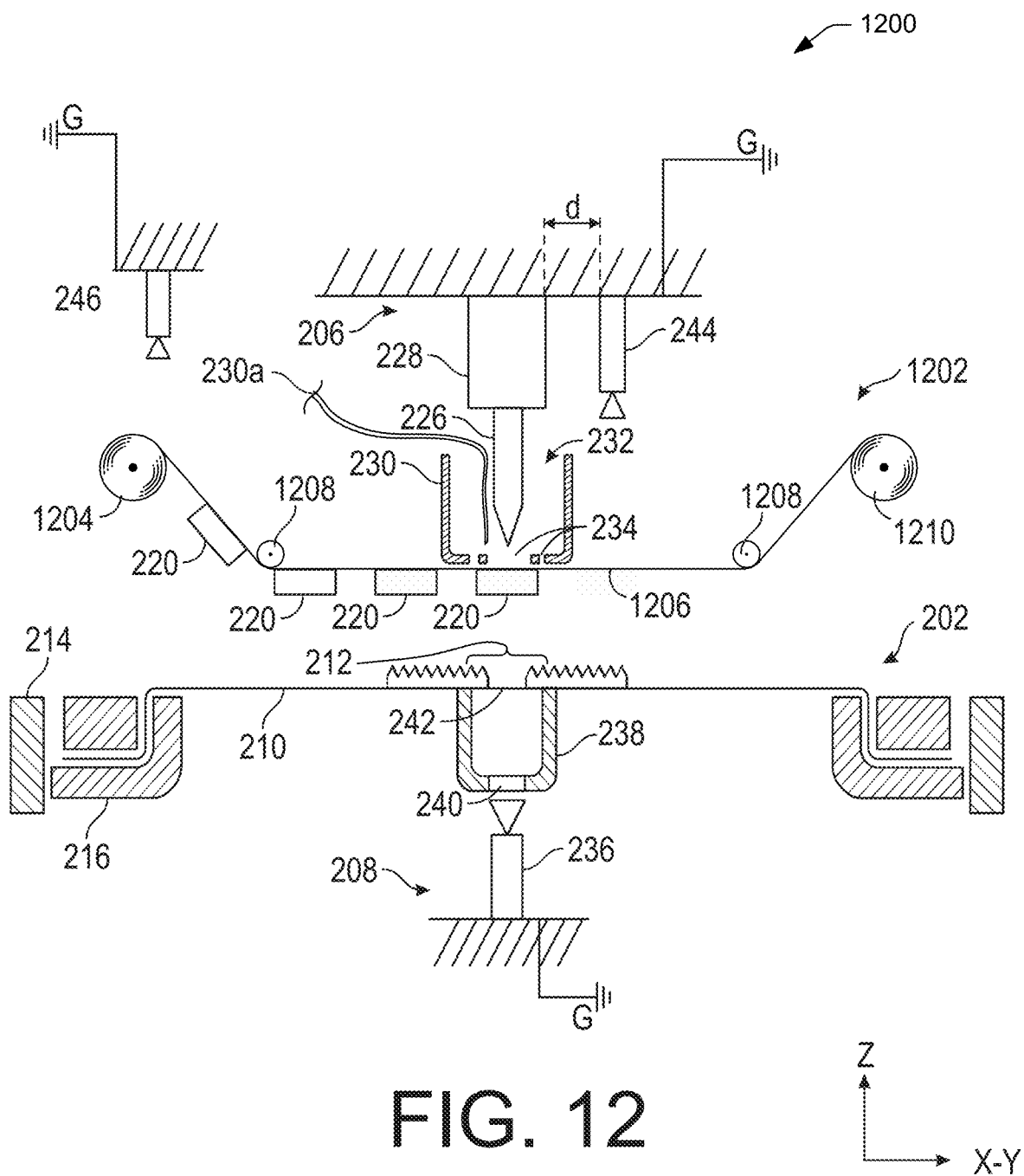
FIG. 12 illustrates a schematic view of another embodiment of a direct transfer apparatus in a pre-transfer position.

In an additional embodiment of a direct transfer apparatus, as seen in FIG. 12, apparatus 1200 may include a wafer tape conveyance mechanism 1202. In particular, in lieu of the wafer tape conveyor frame 222 and the wafer tape holder frame 224 shown in FIGS. 2A and 2B, the wafer tape conveyance mechanism 1202 may include a system of one or more reels 1204 to convey die 220 through the transfer position of the apparatus 1200 to transfer die to a single substrate. In particular, each reel 1204 may include a die substrate 1206 formed as a narrow, continuous, elongated strip having die 220 attached consecutively along the length of the strip.

In the case where a single reel 1204 is used, a transfer operation may include conveying the support substrate 210 via the support substrate conveyance mechanism 202 substantially as described above, using motors, tracks, and gears. However, the wafer tape conveyance mechanism 1202 may include a substantially static mechanism, in that, while the die 220 may be fed continuously through the transfer position by unrolling the die substrate 1206 from reel 1204, the reel 1204 itself main remain in a fixed position. In an embodiment, the tension of the die substrate 1206 may be maintained for stability purposes by tensioning rollers 1208, and/or a tensioning reel 1210, which may be disposed on a side of the apparatus 1200 opposite the reel 1204. The tensioning reel 1210 may roll up the die substrate 1206 after the die have been transferred. Alternatively, the tension may be maintained by any other suitable means to secure the die substrate 1206 so as to assist in pulling it through the transfer position after each transfer operation to cycle through the die 220.

In an embodiment where multiple reels 1204 are used, each reel 1204 may be disposed laterally adjacent to other reels 1204. Each reel 1204 may be paired with a specific transfer mechanism 206 and a specific fixing mechanism 208. In this case, each respective set of transfer mechanisms and fixing mechanisms may be arranged with respect to the support substrate 210 such that multiple die may be placed in multiple locations on the same support substrate 210 simultaneously. For example, in an embodiment, the respective transfer positions (i.e., the alignment between a transfer mechanism and a corresponding fixing mechanism) may be in a line, offset, or staggered so as to accommodate various circuit trace patterns.

Regardless of whether one reel 1204 or a plurality of reels 1204 are implemented, the die transfer operation may be relatively similar to the transfer operation as described above with respect to the first example embodiment of the apparatus 200. For instance, the support substrate 210 may be conveyed to a transfer position (die fixing position) in the same manner as described above via the support substrate conveyance mechanism 202, the transfer mechanism(s) 206 may perform a needle stroke to transfer the die 220 from the die substrate 1206 to the support substrate 210, and the fixing mechanism 208 may be actuated to assist in affixing the die 220 to the support substrate 210.

Note that in an embodiment with a plurality of reels 1204, a circuit trace pattern may be such that not every transfer mechanism may need to be actuated simultaneously. Accordingly, multiple transfer mechanisms may be actuated intermittently as the support substrate is conveyed to various positions for transfer.

Fourth Example Embodiment of a Direct Transfer Apparatus

Figure 13:
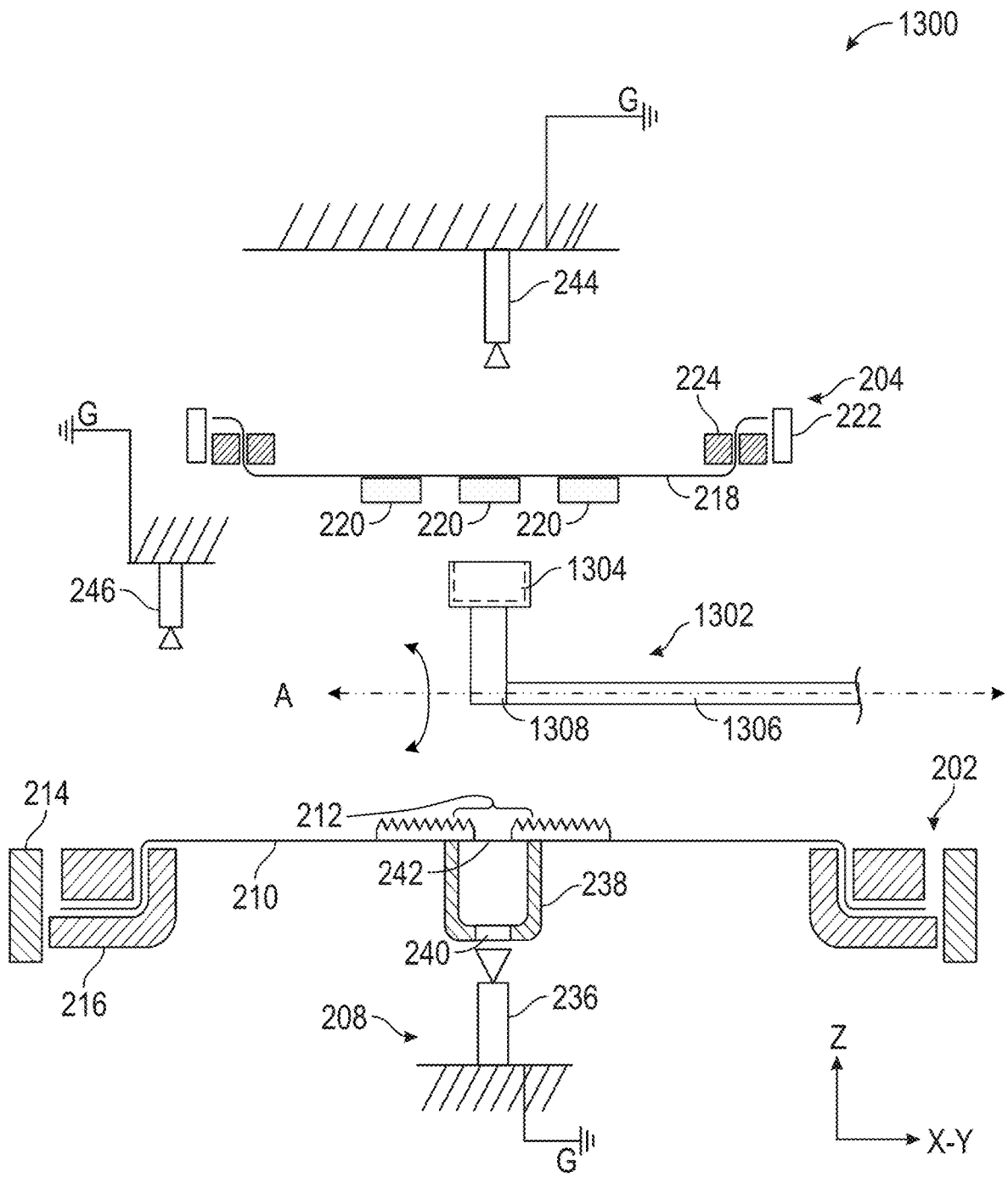
FIG. 13 illustrates a schematic view of another embodiment of a direct transfer apparatus in a pre-transfer position.

FIG. 13 depicts an embodiment of a direct transfer apparatus 1300. As in FIGS. 2A and 2B, the support substrate conveyance mechanism 202 may be disposed adjacent to the wafer tape conveyance mechanism 204. However, there is a space between the conveyance mechanisms 202, 204 in which a transfer mechanism 1302 may be disposed to effectuate the transfer of the die 220 from the wafer tape 218 to the support substrate 210.

The transfer mechanism 1302 may include a collet 1304 that picks the die 220, one or more at a time, from the wafer tape 218 and rotates about an axis A that extends through arm 1306. For example, FIG. 13 depicts the wafer tape 218 facing the support substrate 210 such that the collet 1304 may pivot 180 degrees about pivot point 1308 (see directional pivot arrows) between the die-carrying surface of the wafer tape 218 and the transfer surface of the support substrate 210. That is, the direction of extension of the collet 1304 pivots in a plane that is orthogonal to the surface or plane of transfer of both the wafer tape 218 and the support substrate 210. Alternatively, in some embodiments, the arm structure of the collet may be arranged to pivot between two parallel surfaces, and the arm of the collet may pivot along parallel plane. Thus, when facing the wafer tape 218, the collet 1304 may pick the die 220 and then immediately pivot to the surface of the support substrate 210 to be in line with the fixing mechanism 208. The collet 1304 then releases the die 220 so as to transfer the die 220 to be affixed to the circuit trace 212 on the support substrate 210.

In an embodiment, the transfer mechanism 1302 may include two or more collets (not shown) extending from the arm in different directions. In such an embodiment, the collets may be indexed rotatingly 360 degrees through the collet stop locations and picking and transferring a die every time a collet passes the wafer tape 218.

Additionally, the one or more collets 1304 may pick and release the die 220 from the wafer tape using positive and negative vacuum pressure through the collet 1304.

Figure 14:
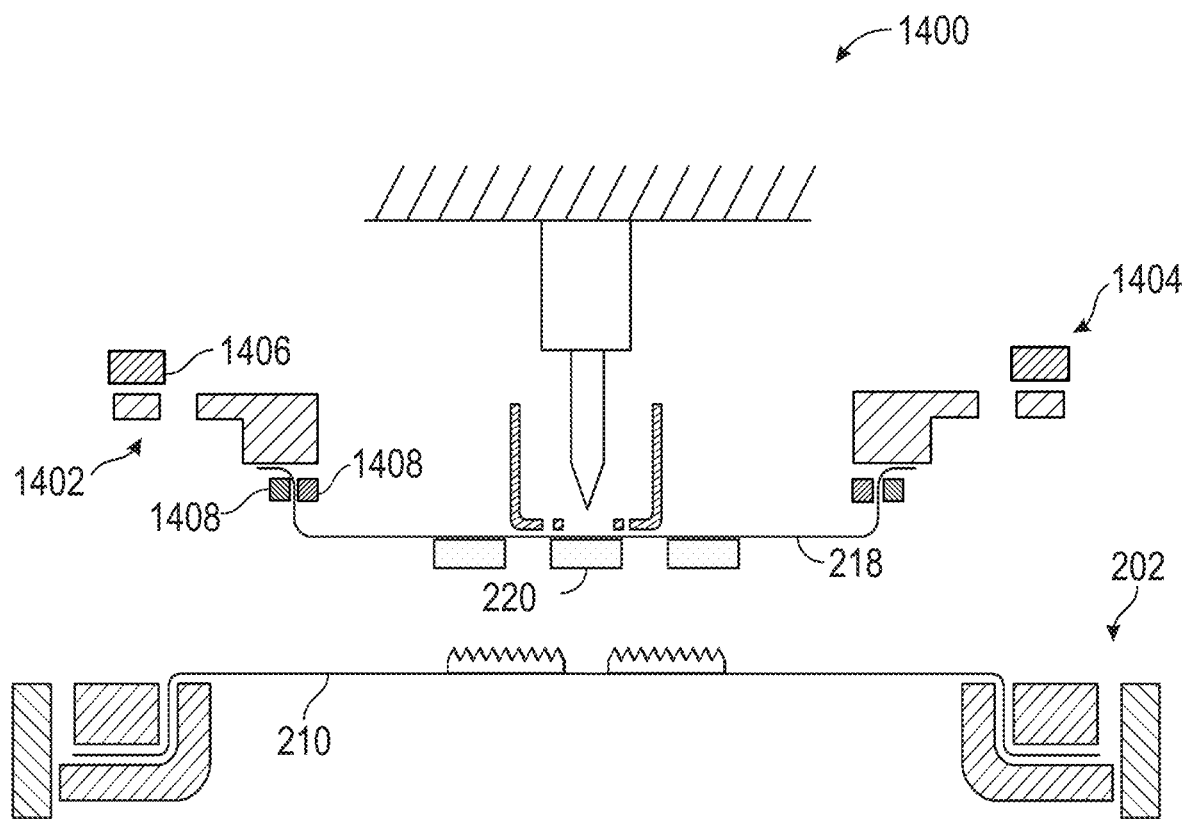
FIG. 14 illustrates a schematic view of an embodiment of a direct transfer apparatus, in a pre-transfer position, with a micro-adjustment assembly implemented according to an embodiment of the instant disclosure.

First Example Embodiment of a Direct Transfer Apparatus Having a Micro-Adjustment Assembly Illustrated in FIG. 14 is an embodiment of a direct transfer apparatus 1400. In the embodiment depicted, a micro-adjustment mechanism 1402 is attached to a wafer tape conveyance mechanism 1404, which may assist in the direct transfer of semiconductor device die 220 from a wafer tape 218 to a support substrate 210. While many features of the transfer apparatus 1400 may remain substantially similar to those of apparatus 200 in FIGS. 2A and 2B, some distinctions are discussed herein below with respect to FIGS. 14-18 including the implementation of the micro-adjustment mechanism 1402 that makes micro adjustments (e.g., 5 microns to 50 microns, or 1 micron to 1000 microns, or 0.5 micron to 5000 microns, etc.) to the orientation and/or position of wafer tape 218 and die 220 during the die transfer process.

As an overview, the transfer apparatus 1400 may include the support substrate conveyance mechanism 202 (also depicted with respect to FIGS. 2A and 2B), and wafer tape conveyance mechanism 1404. The wafer tape conveyance mechanism 1404 is, in general, functionally similar to the wafer tape conveyance mechanism 204, as it includes a wafer tape conveyor frame 1406 and a wafer tape holder frame 1408. In general, support substrate conveyance mechanism 202 and the wafer tape conveyance mechanism 1404 may be discussed herein as mechanisms that provide "coarse movement," as they are generally moved for larger movements (relative to micro movements) between successive die transfer locations. However, as indicated above, the wafer tape conveyance mechanism 1404 in the embodiment of FIG. 14 includes micro-adjustment mechanism 1402, discussed in detail below. While the mechanisms that provide coarse movements may still be used to adjust between transfer locations on a smaller scale as needed, including a micro distance, it is considered that the coarse movement mechanisms are better suited for larger, macro movements (e.g., ~1-2 mm or greater). Thus, the implementation of a micro-adjustment mechanism in connection with a coarse movement conveyance mechanism may be advantageous for several situations. For example, a micro adjustment may be made in addition to a coarse movement when the coarse movement conveyance mechanism has overshot a transfer location, undershot a transfer location, or is shuddering near a transfer location due to stopping from a coarse movement, such that a transfer alignment is slightly off, e.g., on a micro scale.

The micro-adjustment mechanism 1402, in conjunction with cell manager 706 (FIG. 7), may perform real-time micro-adjustments that align and/or more closely align the support substrate 210 and the die 220 during the die transfer process. In an embodiment, the transfer apparatus 1400 may perform micro-adjustments for different purposes, including compensating for vibrational movement after stopping a moving component, and/or for the purpose of speeding overall die transfer operations in which the motion speed of conveyance mechanisms 202, 1404 is slowed before a subsequent die transfer (instead of a full stop at each transfer operation).

For example, in one aspect, the micro-adjustment mechanism 1402 corrects positional errors caused by vibration from starting and/or stopping conveyance of the wafer tape conveyor frame 1406. The die transfer rate may range from about 6-450 die or more placed per second. In general, as the transfer rate increases, the mechanical complexity and weight of the conveyance apparatus may increase as well. The increases in the speed of moving masses and the increases in transfer rate may collectively add system component vibrations when those masses accelerate quickly and then come to an abrupt stop. The settling time required to dissipate the vibrations may create time-related inefficiencies in die transfer. In an embodiment, micro-adjustment of the wafer tape holder frame 1408 may increase system efficiency by counteracting vibrations, which affect the relative position of the die, to reduce or eliminate settling time of the wafer tape conveyance mechanism 1404.

In an embodiment, micro-adjustments may be made to increase system efficiency by allowing the wafer tape conveyance mechanism 1404 to remain continually in motion and transfer the die 220 to the support substrate 210 while the wafer tape holder frame 1408 is still in motion, without repeated starts and stops as the wafer tape conveyance mechanism 1404 travels from one transfer location to the next transfer location.

Figure 15A:
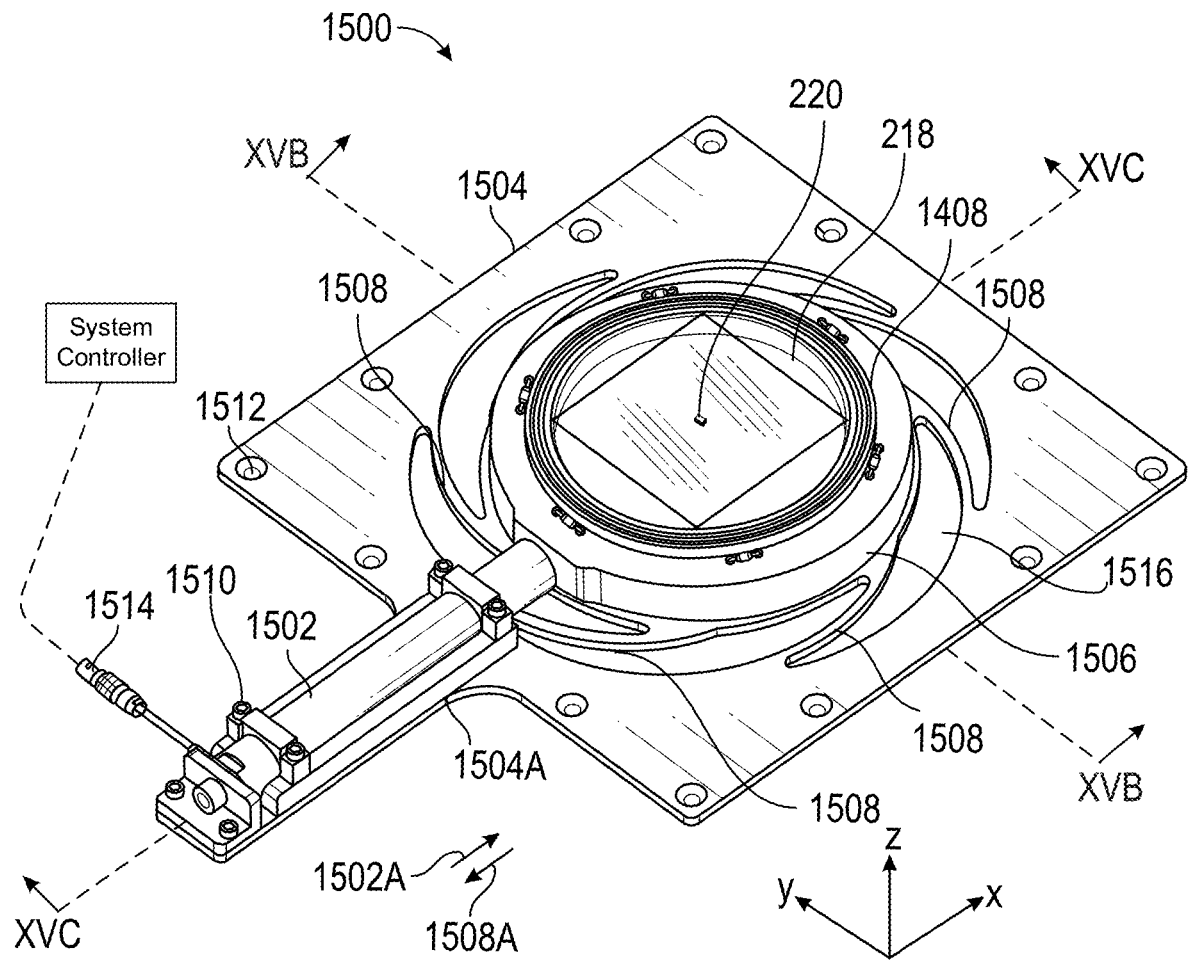
FIG. 15A illustrates an isometric view of a micro-adjustment assembly according to an embodiment of the instant disclosure.

Considering the structure of the apparatus, FIG. 15A depicts an isometric view of a micro-adjustment mechanism 1500 (hereafter "microadjust mechanism 1500"), according to one embodiment. The microadjust mechanism 1500 may include an actuator 1502, an actuator flange 1504 having a support arm 1504A against which the actuator 1502 may be secured, a wafer support block 1506 on which to secure wafer tape holder frame 1408 for holding wafer tape 218, and one or more spring members 1508 connecting the wafer support block 1506 to the actuator flange 1504. In an embodiment not shown, the actuator flange 1504 may be in direct or indirect connection with the wafer tape holder frame 1408. The microadjust mechanism 1500 may be securely fastened to the wafer tape conveyor frame 1406 (as depicted in FIG. 14) such that the microadjust mechanism 1500 moves with the wafer tape conveyor frame 1406 and makes small independent adjustments to the position of the wafer tape 218.

According to one embodiment, the actuator 1502 may include an elongated rod that may be mounted on the actuator flange 1504 with an actuator bracket assembly 1510. The actuator bracket assembly 1510 may include one or more fastening means such as, for example, a socket head cap screw, latch, clip, weld, etc. The microadjust mechanism 1500 may include a plurality of through holes 1512 located in the actuator flange 1504 for attaching the microadjust mechanism 1500 to the wafer tape conveyor frame 1406 with an appropriate fastener (not shown).

The actuator 1502 is disposed on the actuator flange 1504 such that, when assembled, the body of the actuator 1502 is slidable in a single direction with respect to a surface along the actuator flange 1504. However, the actuator 1502 remains in a fixed orientation with respect to the distance from and direction of extension along the actuator flange 1504. It should be appreciated that, although depicted as a cylindrical body bolted to the actuator flange 1504 with socket head cap screws via the actuator bracket assembly 1510, the actuator 1502 may take many shapes other than the cylindrical form shown in FIG. 15A, and may be fastened to the actuator flange 1504 in any way such that the actuator flange 1504 and the actuator 1502 operate as a single unit with respect to one another.

The actuator 1502 may be a piezoelectric actuator. Piezoelectric actuators (also called piezoelectric transducers, translators, etc.) convert electrical energy into linear motion. Alternatively, the actuator 1502 may include a motion control actuator, other than a piezoelectric actuator, that may be configures to make fast and precise movements. Example alternative actuators include linear motors, servo or stepper motors with a ball screw, a voice coil, etc. Using a piezoelectric actuator for example, the actuator 1502 may apply a relatively large pushing force (e.g., 1000+N) at a first end of actuator 1502 in contact with wafer support block 1506, when a signal stimulation is applied via an electrical connector 1514 disposed at a second end of actuator 1502.

The actuator 1502 may connect to one or more system controllers via the electrical connector 1514. As previously discussed with respect to FIG. 7, several system control mechanisms may be configured to control the actuator 1502. The system controllers may control operational aspects of the actuator 1502, including a stroke distance of the first end of the actuator 1502 based on the signal stimulation. An exemplary controller system may be, for example, the sensor manager 720, the motion manager 722, the sensor manger 734, and/or the motion manager 736, as shown with respect to FIG. 7.

It should be appreciated by those skilled in the art of electromechanical control systems that actuator responses are routinely controllable via a single channel or multi-channel controller system in conjunction with one or more signal amplifiers. According to an embodiment, the actuator 1502 is controllable such that the first end of the actuator 1502 moves the position of the wafer tape holder frame 1408 and, thus, the wafer tape 218, when actuated. The wafer tape holder frame 1408 may be movable with respect to the actuator flange 1504 via the one or more spring members 1508 (in an embodiment having spring members). Alternatively, with other motion control actuators that can output force in more than one direction, the wafer tape holder frame 1408 may be movable without a spring member because the actuator itself is capable of causing motion in the return direction. Also, the actuator 1502 may be disposed in the structure of the system in a different position that is depicted. That is, it is contemplated that the position of the actuator 1502, relative to the coarse movement conveyance mechanism and the substrate or transfer mechanism that is being microadjusted, may be different. For example, the actuator 1502 may be in-plane with the microadjusted member (i.e., whichever component has the position thereof being adjusted, either the coarse conveyance mechanisms or the transfer mechanisms, or a combination thereof), stacked between the coarse movement conveyance mechanism and the microadjusted member, etc. Once the wafer tape holder frame 1408, wafer tape 218, and die 220 are collectively displaced to the intended location (i.e., an alignment position is attained), the transfer mechanism 206 (FIG. 14) may transfer the die 220 to the support substrate 210 with precise timing and location accuracy. An alignment position is precise when the die is positioned at the predetermined and intended location, where the actual location is within a predetermined range of error (i.e., the location is accurate within a predetermined tolerance). An example of a predetermined range of tolerance may be, for example, between 10-50 microns. Other tolerances are contemplated.

As indicated above, in an embodiment, the spring members 1508 connect the wafer support block 1506 and the actuator flange 1504 such that the first end of the actuator 1502 may apply an actuation force (illustrated as an arrow 1502A indicating the direction of the force). Actuation force 1502A displaces the wafer support block 1506, which translates to displacement of wafer tape holder frame 1408 from a first (resting) position, to a second position along the axis of actuation (depicted in FIG. 15A as the X-axis). The displacement is a predetermined distance from the first position with respect to the actuator flange 1504. The spring members 1508 may deform slightly to allow the displacement of the wafer tape holder frame 1408 by moving the wafer support block 1506 along the axis of the actuation force 1502A. By way of example, a displacement of the wafer tape, as used herein, may range from about 5 microns to about 200 microns. After application of the actuation force 1502A, a return force (illustrated as an arrow 1508A indicating the direction of the force) may be applied by the restoring force of the spring members 1508 such that the first end of the actuator 1502, if not already returned to the at rest position by other means, is forced back into the at rest position relative to the actuator flange 1504. Thus, the spring members may serve as return members.

The actuator flange 1504 (and particularly, the spring members 1508) may be constructed from suitable materials having satisfactory elastic mechanical properties, which may depend on the particular spring design. For example, in the illustrated embodiment, materials such as alloy steel, carbon steel, cobalt-nickel, a copper-based alloy, a nickel-based alloy, a titanium alloy, aluminum, etc. may be satisfactory. Additionally, and/or alternatively, plastics and other composition materials are contemplated. It should be appreciated the geometry of the microadjust mechanism 1500 and the construction material thereof may vary and are not be limited to those described herein.

According to one embodiment, the actuator flange 1504 and spring members 1508 (or portions thereof) may be unified in that they are manufactured from a single piece of material. In other aspects, they may be manufactured as separate components and fastened together (e.g., via welding or other fastening techniques) to form a unified (single-piece) microadjust mechanism 1500. For example, when manufactured from a single piece of stock, the plurality of spring members 1508 may be formed by removing (e.g., via machining, electro discharge machining (EDM), etc.) a portion of the actuator flange 1504 (where portions removed are shown as swirl-shaped cavities in FIG. 15A). Although depicted in FIGS. 15A-17 as arched spring arms, the spring members 1508 may be another form or shape suitable, such as coil springs, for returning the wafer tape holder frame 1408 to the first (resting) position after the actuation force 1502A is removed.

One of the possible benefits of a piezoelectric actuator is the variably controllable actuation and available pushing force of the actuator 1502. The strength of actuation coupled with the speed and precision of actuation may provide precision in locating adjustments that that may position die to be transferred. Another benefit is that the speed and precision of actuation provide micro-adjustments that counteract vibrations. For example, with respect to counteracting vibrational forces, the microadjust mechanism 1500 may be configured as shown with a single actuator 1502 to assist the system to counteract vibration caused by a quick acceleration of the masses associated with the support substrate conveyor frame 214 followed by an abrupt deceleration (i.e., stop), regardless of the direction of travel preceding the stop. Stated in another way, when actuating the actuator to counteract a vibration caused by a quick stop of the wafer tape conveyance mechanism 1404 on which the microadjust mechanism 1500 is connected, the direction of travel of the microadjust mechanism 1500 and wafer tape conveyance mechanism 1404 prior to the stop may not matter when considering the direction of actuation of the actuator 1502. At least some of any resultant vibrations caused by the stop may be counteracted with a single actuator.

Piezoelectric actuators may provide micro-adjustments by pushing (e.g., by applying linear force in one direction), but may not have equal pulling ability (e.g., applying linear force in the opposite direction). For example, a single-direction actuation may have physical limitations when being used for precise actuation (e.g., positional adjustment) in a situation in which in a system having movement capabilities in two directions (e.g., positive direction along the X axis and negative direction along the X axis). Accordingly, when using a piezoelectric actuator for the actuator 1502, it may be advantageous to provide a microadjust mechanism configured to actuate in more than one direction (discussed further herein with respect to FIGS. 16 and 17).

Figure 15B:
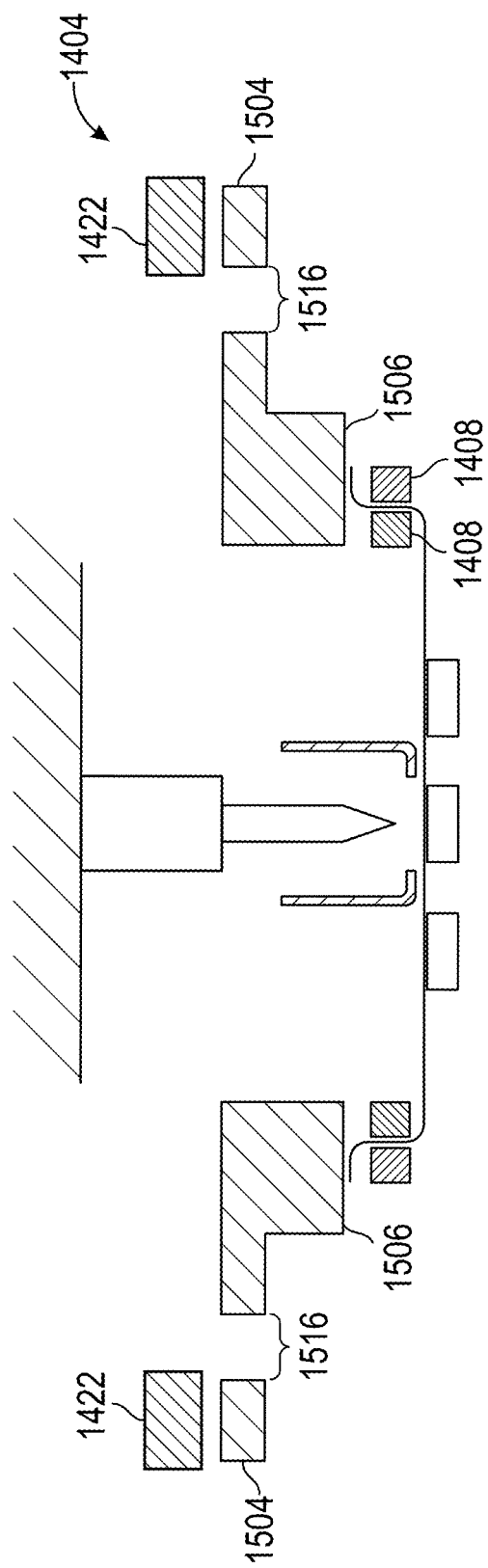
FIG. 15B illustrates a schematic cross-sectional view of the micro-adjustment assembly of FIG. 15A, according to an embodiment of the instant disclosure.

FIG. 15B illustrates a schematic cross-sectional view, taken approximately along line XVB-XVB shown in FIG.

15A, of the wafer tape conveyance mechanism 1404, including the micro-adjustment mechanism 1500, according to an embodiment of the present application. The needle 226 and needle retraction support 230 are shown for orientation of the wafer tape conveyor mechanism 1404. To be clear, FIG. 15A depicts the micro-adjustment assembly 1500 in an orientation upside down from that depicted in FIG. 15B. As depicted in FIG. 15B, wafer tape holder frame 1408 is configured to secure the wafer tape 218, and the micro-adjustment assembly 1500 may make micro adjustments to the position of the wafer tape 218. The wafer tape conveyor frame 1406 is mechanically coupled with the actuator flange 1504. Additionally, FIG. 15B depicts gaps 1516 in the actuator flange 1504. The gaps 1516 represent the cavity spaces from which portions of material was removed (i.e., as discussed above in an embodiment in which the actuator flange 1504 and wafer support block 1506 are created from a single stock piece) to form the spring members 1508. In general, gaps 1516 represent the maximum amount of space in which the micro adjustments to the position of the die 220 may be made. In an alternative embodiment (not shown), an actuator flange and a wafer support block may be two separate components that have been mechanically coupled by fasteners and springs other than those depicted and explicitly described herein, in which case, the gaps 1516 may still represent the space in which positional adjustment may be made between the alternatively coupled actuator flange and wafer support block.

Figure 15C:
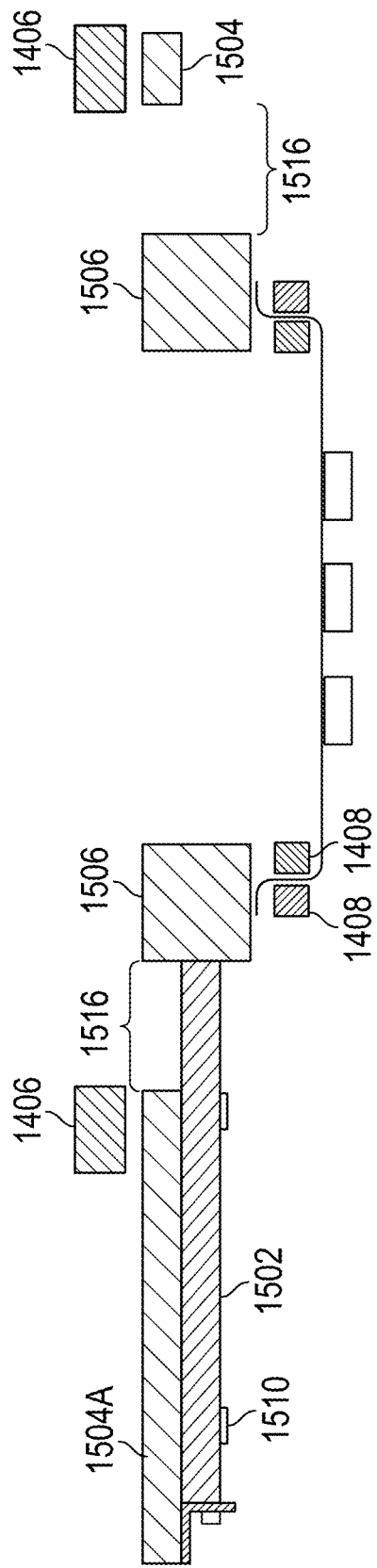
FIG. 15C illustrates another schematic cross-sectional view of the micro-adjustment assembly of FIG. 15A, according to an embodiment of the instant disclosure.

FIG. 15C illustrates another section view, taken approximately along line XVC-XVC shown in FIG. 15A, of the micro-adjustment assembly 1500, according to an embodiment. The needle and the retraction support are omitted in this view for clarity. Note, though the wafer tape conveyor frame 1406 is depicted as spaced slightly from actuator flange 1504 in order to clearly depict the distinction in components, it is understood by those skilled in the art that, in use, the wafer tape conveyor frame 1406 is mechanically coupled with the wafer tape holder frame 1408 via attachment to the actuator flange 1504. As depicted in FIG. 15C, the actuator 1502 may be mounted on or held in close proximity to the actuator flange 1504 with an actuator bracket assembly 1510, which may include bushings, gaskets, washers, brackets, etc. In an embodiment, maintaining an offset between actuator 1502 and actuator flange 1504 may minimize friction during movement, for example.

Figure 16:
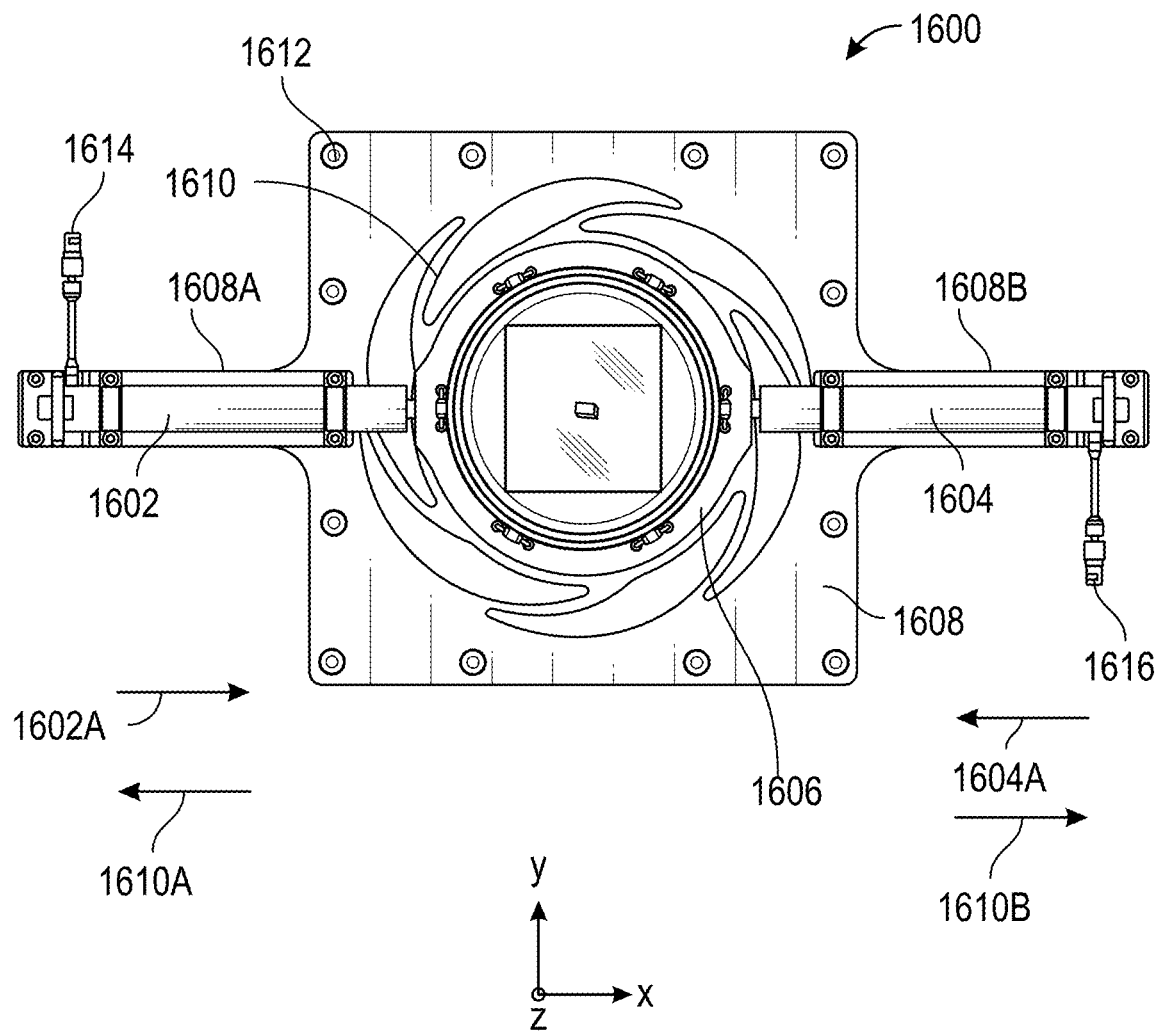
FIG. 16 illustrates a bottom view of a micro-adjustment assembly having two micro-adjustment actuators according to an embodiment of the instant disclosure.

Second Example Embodiment of a Direct Transfer Apparatus Having a Micro-Adjustment Assembly FIG. 16 illustrates a bottom view of a micro-adjustment mechanism 1600 (hereafter "microadjust mechanism 1600") having a first actuator 1602 and a second actuator 1604 for performing micro-adjustments of one or more components of the apparatus, according to another embodiment of the present application. While many features of microadjust mechanism 1600 may remain substantially similar to those of the microadjust mechanism 1500 in FIG. 15A, some distinctions are discussed herein below with respect to the second actuator 1604.

The microadjust mechanism 1600 includes the first actuator 1602 having a distal end positioned to contact a first side of a wafer support block 1606, which is configured to secure wafer tape holding frame for holding a wafer tape (not shown in FIG. 16). In addition, the microadjust mechanism 1600 includes a second actuator 1604 having a distal end in positioned to contact the wafer support block 1606 at a position 180 degrees opposite the distal end of the first actuator 1602. The proximity of the respective distal ends of the first actuator 1602 and second actuator 1604 to the wafer support block 1606 may include direct contact, indirect contact, abutment, adjacent, etc. The microadjust mechanism 1600 may include an actuator flange 1608 to which the support block 1606 is secured. Moreover, the actuator flange 1608 may include support arms 1608A and 1608B against which the first actuator 1602 and second actuator 1604 are secured. In an embodiment that may further implement a spring-based return system, such as is depicted in FIG. 16, the microadjust mechanism 1600 may also include a plurality of deformable spring members 1610 connecting the wafer support block 1606 to the actuator flange 1608. The microadjust mechanism 1600 may be securely fastened to the wafer tape conveyor frame 1406 via holes 1612 (in a similar manner as microadjust mechanism 1500 as depicted in FIG. 15B) such that the microadjust mechanism 1600 may move with the wafer tape conveyor frame (when attached thereto) and make micro adjustments to the position of the wafer tape.

Accordingly, the spring members 1610 connect the wafer support block 1606 and the actuator flange 1608 such that the distal end of the first actuator 1602 may apply an actuation force 1602A that displaces the wafer support block 1606 from a first (resting) position, to a second position along the axis of actuation (depicted in FIG. 16 as the X-axis). The displacement may be a variable, predetermined distance from the first position with respect to the actuator flange 1608. The spring members 1610 may temporarily deform slightly to allow the displacement of the wafer support block 1606 by moving the wafer support block 1606 along the axis of the actuation force 1602A. After application of the actuation force 1602A, the spring members 1610 may apply a return spring force 1610A such that the distal end of the first actuator 1602, if not already returned to the first position, is forced back into the first position relative to the actuator flange 1608.

Additionally, and/or alternatively, the second actuator 1604 may apply an actuation force 1604A to assist in returning the wafer support block 1606 to the first position. In the event that the embodiment includes a spring-based return system, the return spring force 1610A may act on the wafer support block 1606 to return the wafer support block 1606 to the first position. Moreover, the actuation force 1604A may be greater than a return spring force 1610B, and may provide additional control with respect to velocity of conveyance, acceleration of the conveyance relative to the actuator flange 1608, and other controllable factors that dictate a precise return of the wafer support block 1606 to the first position relative to the actuator flange 1608. The return force 1610B may also return the wafer support block 1606 to the first position when the second actuator 1604 is performing the micro-adjustment operation as described above. That is to say, the first position is the common resting position, and a third position may be reached when the second actuator 1604 pushes the wafer support block 1606 toward the first actuator 1602.

According to an embodiment, the precise actuation control for micro-adjustment of the wafer support block 1606, in two directions along a single axis, may provide greater optimization capabilities to the micro-adjustment movements when transferring die. Each of the first actuator 1602 and the second actuator 1604, respectively, may be connected to a control system (not shown) via a corresponding one of connectors 1614 and 1616, respectively. Thus, the embodiment such as that described with respect to FIG. 16 provides for alignment timing in two directions of travel along a single axis.

Third Example Embodiment of a Direct Transfer Apparatus Having a Micro-Adjustment Assembly Additionally, and/or alternatively, FIG. 17 illustrates a bottom view of an embodiment of a micro-adjustment mechanism 1700 having four micro actuators: first actuator 1702, second actuator 1704, third actuator 1706, and fourth actuator 1708. Many features of microadjust mechanism 1700 may remain substantially similar to those of the microadjust mechanisms 1500 and 1600, respectively in FIGS. 15 and 16. For example, first actuator 1702 and second actuator 1704 may be disposed against actuator flange 1710 on support arms 1710A and 1710B, respectively, in the micro-adjustment mechanism 1700 as described with respect to first actuator 1602 and second actuator 1604. However, actuator flange 1710 may have additional support arms 1710C and 1710D, on which may be supported, respectively, a third actuator 1706 and a fourth actuator 1708. As depicted, it is contemplated that the third actuator 1706 and the fourth actuator 1708 may be aligned collinearly opposite each other, positioned to contact the wafer support block 1712 at locations rotated 90 degrees from the first actuator 1702 and the second actuator 1704, respectively. That is, the third actuator 1706 and the fourth actuator 1708 may be oriented perpendicularly with respect to the collinear alignment of the first actuator 1702 and the second actuator 1704 to adjust the position of the die in a direction perpendicular to the line of direction in which the first actuator 1702 and the second actuator 1704 are able to make adjustments. Note, opposite facing actuators may serve as return members to reset the adjusted feature in a neutral state.

Figure 18:
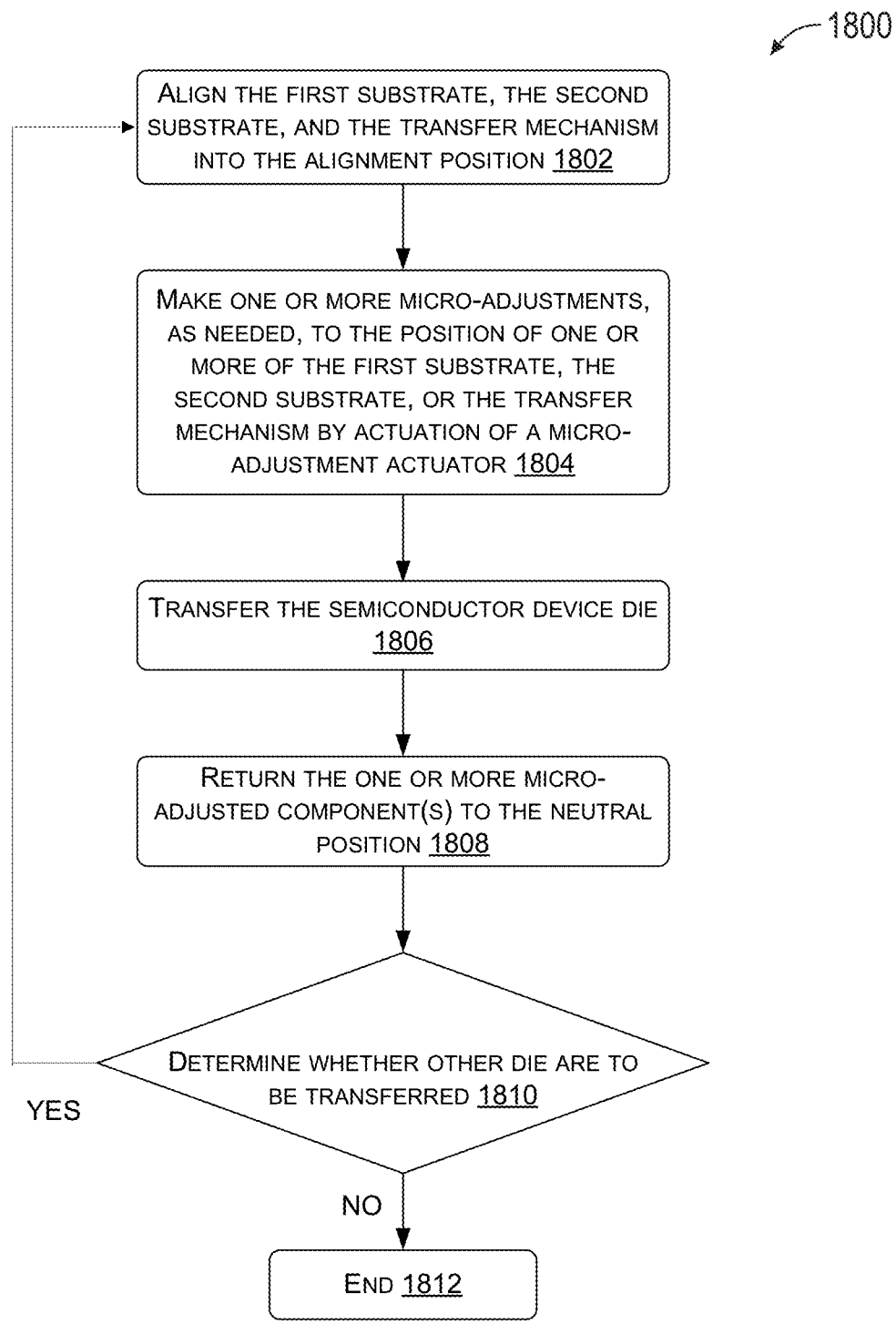
FIG. 18 illustrates a method for an example process of actuating a direct transfer apparatus according to an embodiment of the instant disclosure.

First Illustrative Example of a Method for Performing Direct Transfers Using a Direct Transfer Apparatus Having a Micro-Adjustment Assembly In an embodiment, as the frame holding the wafer tape is conveyed from location to location, the conveyance mechanism holding the wafer frame may move to the transfer location, and after coming to an abrupt stop or even slowing significantly, a micro-adjustment that fine-tunes the transfer location and/or removes system vibrations may be performed. Once adjusted, the system then transfers the die. FIG. 18 depicts a method 1800 of a direct transfer operation of an embodiment of a direct transfer apparatus with a micro-adjustment mechanism, in which the conveyance mechanisms may either stop at each transfer alignment or may not stop completely at each transfer alignment, but rather may merely slow down.

The steps of the method 1800 described herein may not be in any particular order and, as such, may be executed in any satisfactory order to achieve a desired product state. For ease of explanation, the method 1800 is described as being performed at least in part by a direct transfer apparatus with a micro-adjustment mechanism such as, for example, those depicted in FIGS. 14-17. Note, for the sake of convenience, the steps of method 1800 are described as if the micro-adjustment mechanism is disposed with the wafer substrate conveyance mechanism. However, it is contemplated that the principle of a micro-adjustment mechanism may be adapted to be implemented on other coarse movement mechanisms as indicated above. Therefore, it is also contemplated that the steps of method 1800 may also be applicable as adapted for an apparatus in which the micro-adjustment mechanism is disposed on a coarse movement mechanism other than as shown in FIGS. 14-17.

The example method 1800 of direct transfer operation (as well as each process described herein) is illustrated as a logical flow graph, where each respective operation may represent a sequence of operations that may be implemented by hardware, software, a combination thereof. In some situations, one or more of the operations may be implemented by one or more human users.

In the context of software, the operations may represent computer-executable instructions stored on one or more computer-readable media that, when executed by one or more processors, perform the recited operations. Generally, computer-executable instructions may include routines, programs, objects, components, data structures, and the like that perform particular functions or implement particular abstract data types.

The computer-readable media may include non-transitory computer readable storage media, which may include hard drives, floppy diskettes, optical disks, CD-ROMs, DVDs, read-only memories (ROMs), random access memories (RAMs), EPROMS, EEPROMS, flash memory, magnetic or optical cards, solid-state memory devices, or other types of storage media suitable for storing electronic instructions. In addition, in an embodiment, the computer-readable media may include a transitory computer-readable signal (in compressed or uncompressed form). Examples of computer-readable signals, whether modulated using a carrier or not, include, but are not limited to, signals that a computer system hosting or running a computer program may be configured to access, including signals downloaded through the Internet or other networks. Finally, unless otherwise noted, the order in which the operations are described is not intended to be construed as a limitation, and any number of the described operations may be combined in any order and/or in parallel to implement the process.

Now considering FIG. 18 in greater detail, at 1802, the PC (described herein above with respect to FIG. 7) may instruct the system to align a first substrate (e.g., a die carrying substrate such as a wafer tape on which die are secured), a second substrate (a transfer substrate to which the die are to be transferred such as a circuit board or other die, etc.), and a transfer mechanism into the alignment position (discussed further herein). That is, in an embodiment, the PC may instruct any one or all of a first substrate conveyance mechanism, a second substrate conveyance mechanism, or the transfer mechanism to move into a transfer alignment position, in which a die is to be transferred from the first substrate to a transfer location on the second substrate. Note, it is contemplated that at least one of the first substrate conveyance mechanism, the second substrate conveyance mechanism, or the transfer mechanism has implemented therewith a micro-adjustment mechanism to minimize misalignment that may result from coarse movement and/or other factors in the transfer process.

As used herein, an alignment position may be a position within a range of alignment distances between the moving components. For example, an alignment position may occur when all three components (e.g., the transfer mechanism, the first substrate carrying the die to be transferred, and the second substrate having the target transfer location for the die) are aligned such that any variance in alignment (i.e., misalignment) between the three components ranges from 10 microns to 75 microns. In an embodiment, an alignment position may include a smaller range of allowable misalignment such as 10 microns to 20 microns. Other misalignment tolerance ranges are contemplated, and thus, are not limited to ranges discussed explicitly herein.

With further respect to step 1802 above, in an embodiment, the system may align the substrates with the transfer mechanism to prepare for a die transfer using a full stop of the coarse movement(s) from the system component once the alignment position is attained. Upon stopping, a vibration of the structure may occur. For example, vibration may cause a shift in alignment as large as 30 microns to 50 microns as a result of the deceleration of moving masses.

Additionally, and/or alternatively, in an embodiment, the system may align the substrates with the transfer mechanism to prepare for a die transfer while one or more of the three components are in motion. For example, a conveyance mechanism conveying the first substrate may have instructions to maintain a deliberate, slow, continuous movement; or movement may be faster between coarse movements and then the system may reduce the velocity of the moving component as it approaches the desired transfer location. Thus, at a precise, determinable moment in time, the system may adjust the micro-adjustment mechanism in the axis of travel, for example, at 180 degrees from the direction of travel of the component in coarse movement at a speed such that the position of the die being transferred is motionless with respect to the target position on the support. That is, the relative velocity of the component being micro-adjusted becomes zero. At the instant that the die is most closely aligned with the target transfer position, the transfer mechanism is actuated to transfer the die off of the first substrate. A possible advantage of the embodiment implementing continuous movement may include manufacturing efficiencies gained from time saved compared to waiting for system vibrations to settle at each transfer location.

In either embodiment, to determine the timing of the actuation and determine the control parameters at which the actuator is to be actuated, the cell manager (discussed with respect to FIG. 7) may determine real-time operational factors including velocity, acceleration, position, alignment between moving components, time, and other factors. Accordingly, prior to each actuation the sensor manager, motion manager, and die manager determine the timing and rate of actuation for operating the actuator.

At 1804, the transfer apparatus makes one or more micro-adjustments to the position of one or more of the components, as needed, to improve the alignment position. The one or more micro-adjustments may be executed by displacing a component via actuation of at least one micro-adjustment actuator, thereby addressing any micro-sized misalignment. A displacement may include, for example, displacing the first substrate, with the micro-adjustment actuator, from a first position relative to the actuator flange to a second position relative to the actuator flange. The displacement may be variably controlled, and as such, may be a predetermined distance that aligns the die to be transferred from the first substrate to the transfer location on the second substrate with greater precision to ensure a valid placement. That is to say, the alignment position described with respect to 1802 may be improved in real-time during the transfer process by reducing and/or eliminating any die misalignment, despite the micro scale of action occurring due to vibrational movement or continuous movement.

At 1806, the apparatus transfers the semiconductor device die from the first substrate to the second substrate via actuation of the transfer mechanism (e.g., cycling a needle/pin/wire, pivoting collet, etc.).

At step 1808, the component(s) to which a micro-adjustment was made may be returned to the neutral position (at rest). For example, in an embodiment using spring members, the return force may occur automatically due to the nature of the spring members of a micro-adjustment mechanism; or in a different embodiment, the return force may be made by one or more of a second actuator, a third actuator, and/or a fourth actuator.

At 1810, the transfer apparatus determines whether other semiconductor device die are to be transferred. If no other die are to be transferred, the process ends at 1812. However, if it is determined that more die are to be transferred, the process may begin again at 1802.

Figure 19A:
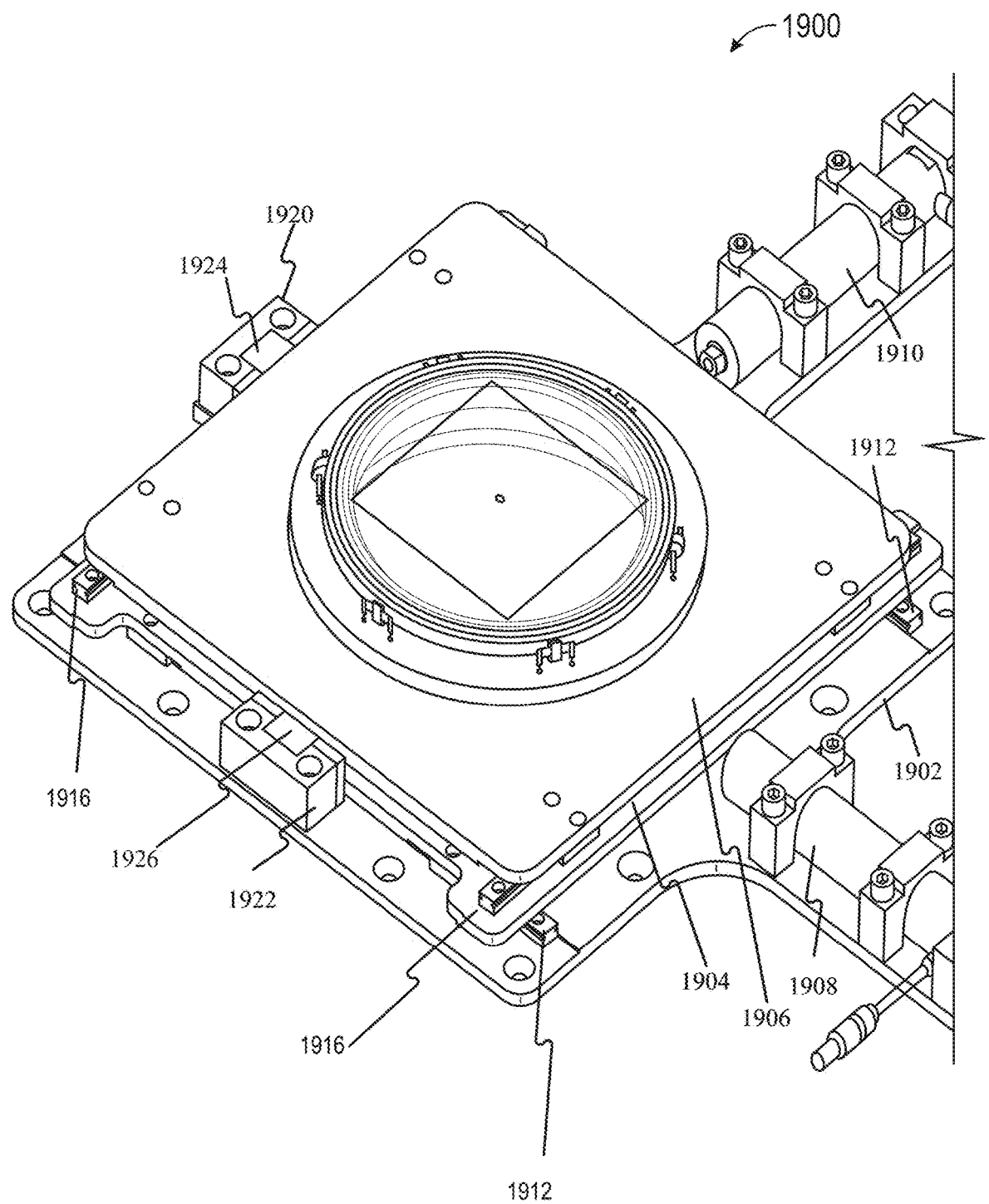
FIG. 19A illustrates an isometric view of a 2-axis rail micro-adjustment assembly having two micro actuators according to an embodiment of the instant disclosure.

Fourth Example Embodiment of a Direct Transfer Apparatus Having a Micro-Adjustment Assembly FIG. 19A illustrates an isometric view of a two-axis rail micro-adjustment assembly 1900 (hereafter rail assembly 1900) according to an embodiment of the present application. Here again, the micro-adjustment mechanism is implemented with the wafer tape conveyance mechanism, for example. However, as indicated above, it is contemplated that a similar micro-adjustment mechanism may be adapted to be implemented with the product substrate conveyance mechanism. Nevertheless, for convenience, FIGS. 19A-19C refer to a rail assembly 1900 adapted for adjusting the relative position of the wafer tape carrying the die to be transferred.

In an embodiment, the rail assembly 1900 may include a substage member 1902 (e.g., a plate, a frame, a rigid support structure, etc.) to which a plurality of rail-guided slide plates (e.g., a first axis slide plate 1904 and a second axis slide plate 1906) are slidably attached in series. The rail-guided slide plates 1904, 1906 may act as supports to convey the wafer tape carrying semiconductor device die along respective axes responsive to one or more actuations of micro-adjustment actuators 1908, 1910, respectively. Further, the rail assembly 1900 may include a first set of rails 1912 attached to the substage member 1902. The first set of rails 1912 are positioned to engage slide mechanisms 1914 that are attached to a side of the first axis slide plate 1904 that faces the substage member 1902. The first axis slide plate 1904 may be configured to slide along a single axis in a direction parallel to the direction of extension of the first set of rails 1912 when actuated by the micro-adjustment actuator 1908. Although the first set of rails 1912 is depicted as including two rails, other configurations are contemplated where there may be more than or fewer than two rails.

A second set of rails 1916 may be attached to a side of the first axis slide plate 1904 opposite the side to which the slide mechanisms 1914 are attached. The second set of rails 1916 may engage a second set of slide mechanisms 1918 attached to a side of the second axis slide plate 1906 facing the first slide plate 1904. The second axis slide plate 1906 may convey the wafer tape carrying semiconductor device die along an axis parallel to the second set of rails 1916 when actuated by the micro-adjustment actuator 1910. Although FIGS. 19A-19C depict the first set of rails 1912 and the second set of rails 1916 as perpendicular to one another, it is contemplated that the first set of rails 1912 and the second set of rails 1916 may be oriented with respect to each other in different orientations than that depicted.

The rail assembly 1900 may include a first stop block 1920 and a second stop block 1922 to provide a stop point for the edge of the first axis slide plate 1904 and the second axis slide plate 1906, respectively. Moreover, the first stop block 1920 and the second stop block 1922 may have secured within respective cavities a compressive bumper 1922, 1924, respectively, against which the plurality of rail-guided slide plates may abut without damage upon being displaced by micro-adjustment actuators 1908, 1910. The compressive bumpers 1922, 1924 may be formed of a deformable, resilient material such as rubberized polymer, polymer, rubber, or other suitable material (e.g., soft silicone, sponge, foam, rubber, plastic, etc.). Thus, the compressive bumpers 1922, 1924 may serve as return members to reset the wafer holder or substrate holder in a neutral position.

Figure 19B:
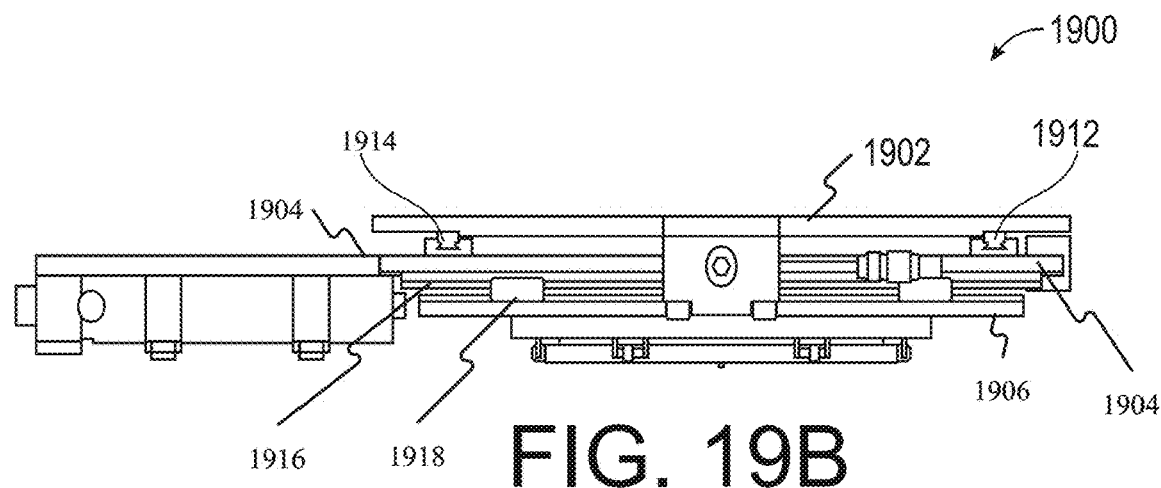
FIG. 19B illustrates a side view of the 2-axis rail micro-adjustment assembly of FIG. 19A according to an embodiment of the instant disclosure.
Figure 19C:
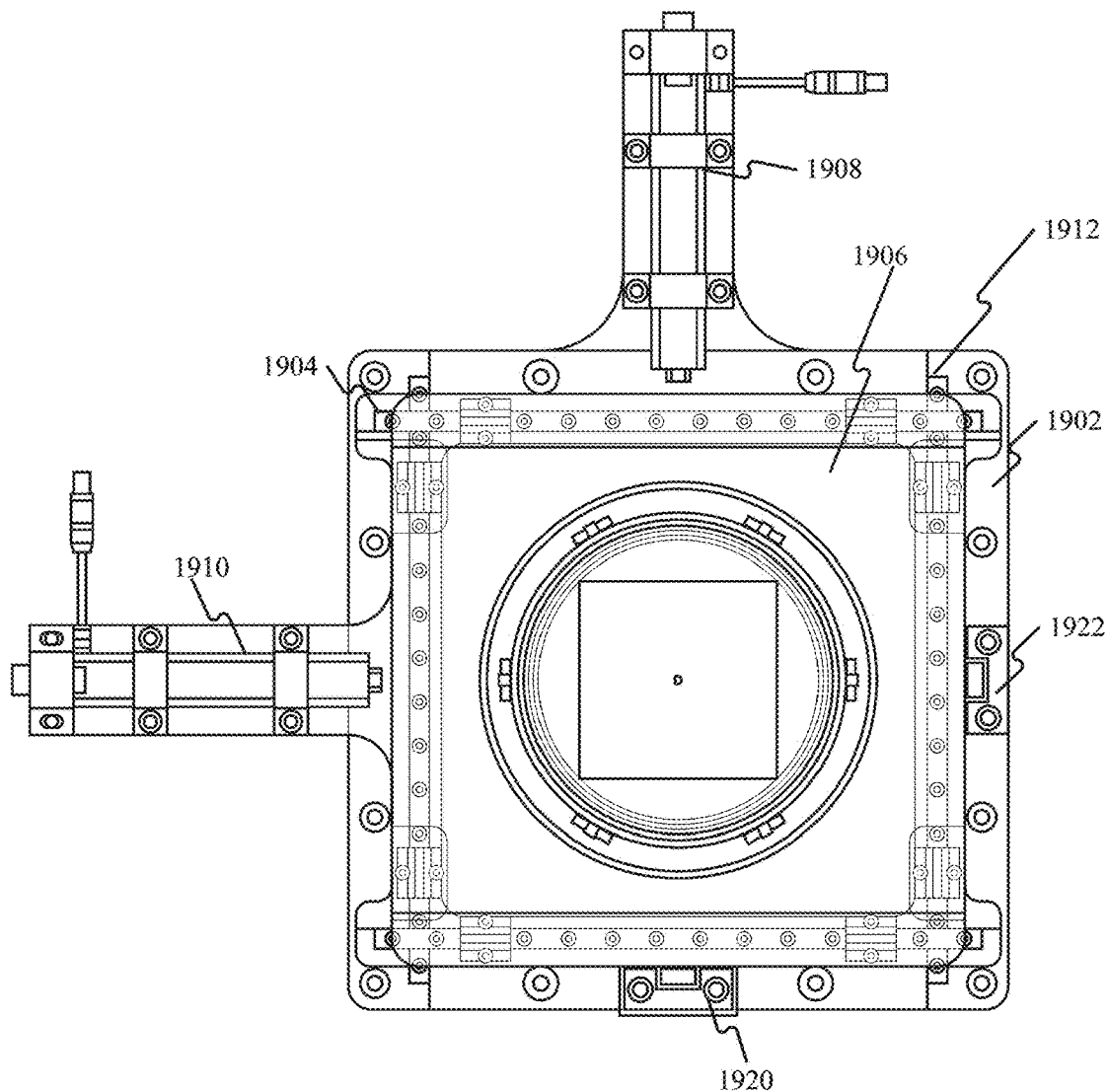
FIG. 19C illustrates a bottom view of the 2-axis rail micro-adjustment assembly of FIG. 19A according to an embodiment of the instant disclosure.

FIG. 19B illustrates a side view and FIG. 19C illustrates a bottom view of the two-axis rail micro-adjustment assembly 1900.

Figure 20:
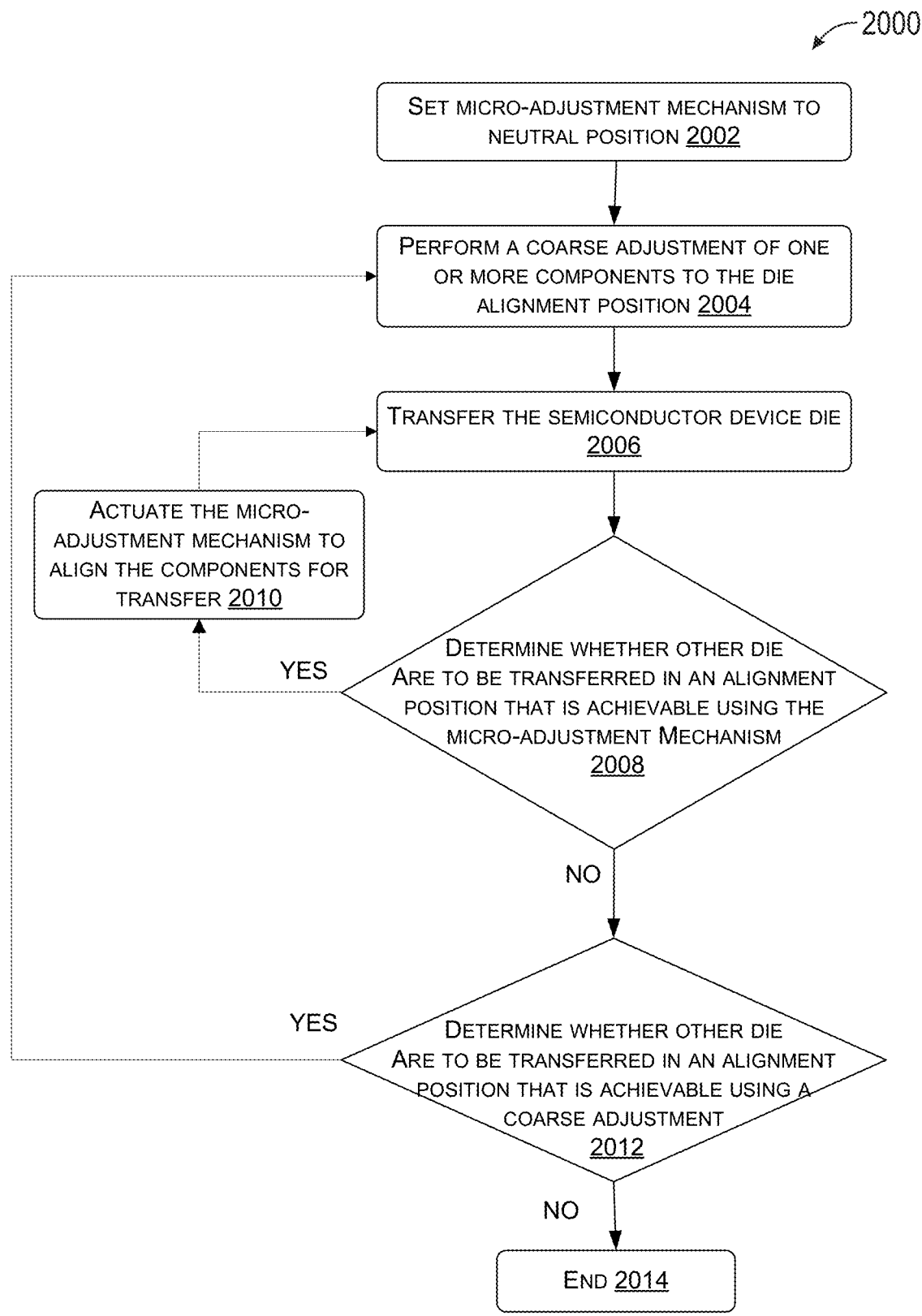
FIG. 20 illustrates another method for an example process of performing a direct transfer with an apparatus having a micro-adjustment assembly according to an embodiment of the instant disclosure.

Second Illustrative Example of a Method for Performing Direct Transfers Using a Direct Transfer Apparatus Having a Micro-Adjustment Assembly FIG. 20 illustrates an embodiment of a method 2000 for transferring a semiconductor device die using a micro-adjustment mechanism. While an apparatus for transferring die may implement a coarse adjustment that spans a relatively great distance (which may be, for example, 1 mm, 2 mm, etc.) for some die transfers, as discussed above, at times a misalignment may occur, for which the micro-adjustment mechanism may be advantageous. Furthermore, in some instances, a series of die are to be transferred and though the coarse positional adjustment might be used, due to the relatively close proximity of adjacent die, a coarse adjustment may be impractical. In such a situation, the micro-adjustment mechanism may be advantageous again.

According to the method 2000, a die transfer sequence may be as follows. In step 2002, the system may set the micro-adjustment mechanism to a neutral position. In step 2004, the system may perform a coarse adjustment by actuating one or more system components such as a conveyance mechanism, for example, to place the components in a transfer alignment position. Assuming, the coarse adjustment placed the components satisfactorily in the transfer alignment position, method 2000 proceeds with step 2006 by transferring the die. In step 2008, the system determines whether there are other die to be transferred in an alignment position that can be achieved by using the micro-adjustment. mechanism actuates the micro-adjustment mechanism to shift one or more of the components to the next transfer alignment position. If the determination in step 2008 is positive, the system proceeds to step 2010 to actuate the micro-adjustment mechanism to place the components in the next alignment position. If the determination in step 2008 is negative, the system proceeds to step 2012 to determine whether there are other die to be transferred in an alignment position that can be achieved using a coarse adjustment. If the determination in step 2012 is positive, then the method reverts to step 2004. If the determination in step 2012 is negative, then the method ends at step 2014.

Note, at step 2006, the system may be requested to transfer more than one die simultaneously and/or sequentially. In the situation where an alignment position exceeds the stroke length available to one or more needles of the transfer mechanism, micro-adjustment actuators may be actuated in order to allow the one or more transfers to occur either simultaneously when possible or sequentially very rapidly, thereby avoiding a coarse adjustment. Moreover, because a die transfer head may include multiple pins configured in an array that approximately matches the pitch between un-transferred die, multiple die may be transferred simultaneously by actuating two or more of the pins on the die transfer head simultaneously (see FIG. 21, for example).

Figure 21:
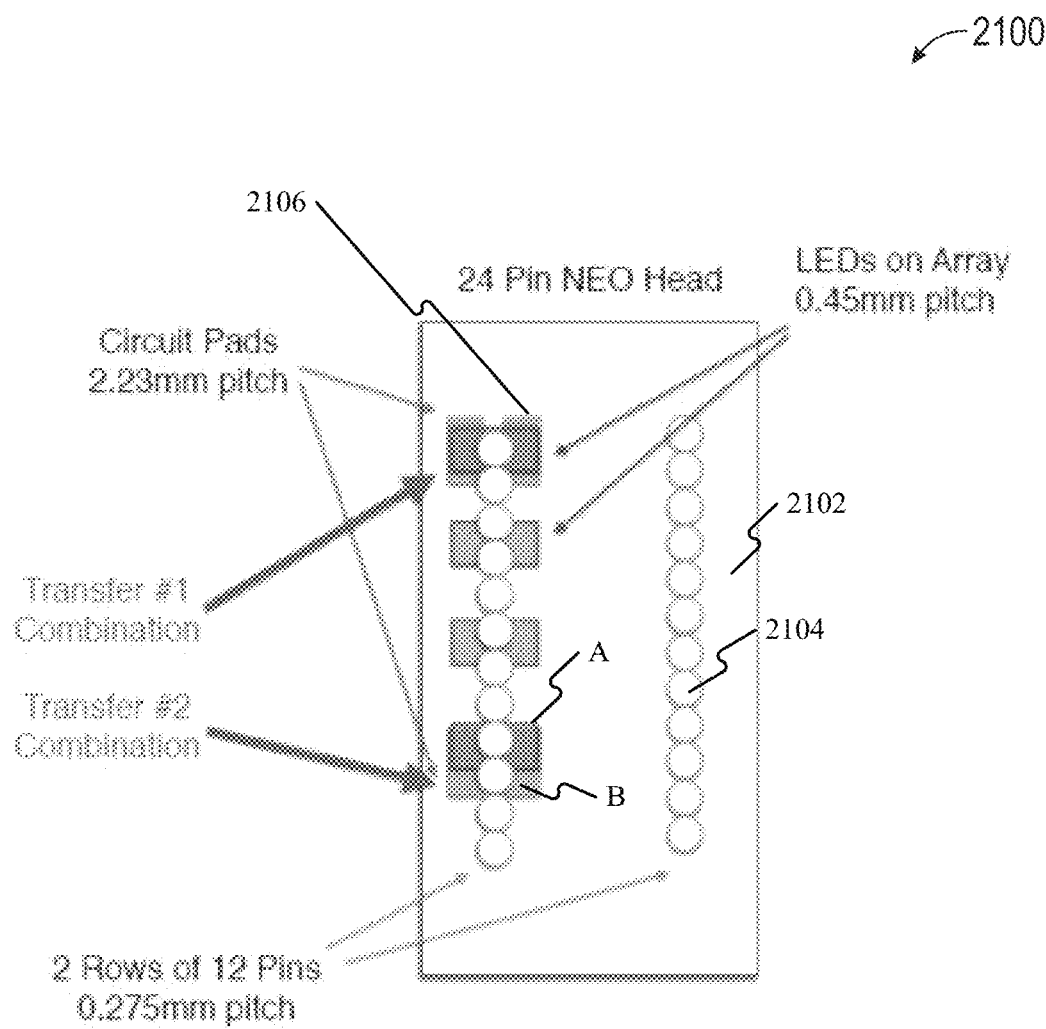
FIG. 21 illustrates a partial schematic view of a direct die transfer head having multiple pins/needles for use with an apparatus having a micro-adjustment assembly according to an embodiment of the instant disclosure.

FIG. 21 illustrates a die transfer head 2102 having multiple pins 2104. In the example shown, the die transfer head 2102 includes 24 pins 2104 arranged as two rows of 12 pins at 0.275 mm pitch. The pins 2104 may be configured for transferring die according to one or more embodiments of the instant application as described above. As shown in FIG. 21, circuit pads 2106 may be configured on a circuit substrate at a predetermined pitch (e.g., 2.23 mm). The configuration of the known pitch may allow for multi-pin die transfer using heads having the same (or similar) pin pitch as the predetermined die pitch. For example, a single multi-pin device die transfer head may transfer two or more device die (transfer combination #1 and #2, respectively) using only a micro-adjustment that displaces the transfer head from position A to position B without a coarse adjustment.

CONCLUSION

Although several embodiments have been described in language specific to structural features and/or methodological acts, it is to be understood that the claims are not necessarily limited to the specific features or acts described. Rather, the specific features and acts are disclosed as illustrative forms of implementing the claimed subject matter. Furthermore, the use of the term "may" herein is used to indicate the possibility of certain features being used in one or more various embodiments, but not necessarily in all embodiments.

What is claimed is:

1. An apparatus for executing a direct transfer of a semiconductor device die disposed on a first substrate to a second substrate, the apparatus comprising:
    a substrate conveyance mechanism to make macro positional adjustments of the first substrate;
    a micro-adjustment mechanism coupled with the substrate conveyance mechanism, the micro-adjustment mechanism configured to hold the first substrate and to make micro positional adjustments of the first substrate, and the micro-adjustment mechanism including:
    a micro-adjustment actuator having a movable distal end, and
    a substrate holder frame configured to secure the first substrate, and the substrate holder frame being secured to a slide plate that is movable via contact with the distal end of the micro-adjustment actuator;
    a substrate frame configured to secure the second substrate such that a transfer surface of the second substrate is disposed facing the semiconductor device die disposed on the first substrate; and
    a transfer mechanism configured to press on the first substrate and transfer the semiconductor device die to the second substrate.

2. The apparatus according to claim 1, wherein the micro-adjustment actuator is a first a micro-adjustment actuator,
    wherein the slide plate is a first slide plate of the micro-adjustment mechanism and is positionally adjustable in a first direction, and
    wherein the micro-adjustment mechanism further includes:
    a second slide plate that is positionally adjustable in a second direction that is transverse to the first direction, and
    a second micro-adjustment actuator having a movable distal end that is disposed to contact and adjust a position of the second slide plate.

3. The apparatus according to claim 2, wherein the first slide plate and the second slide plate are interconnected by a pair of parallel rails such that the second slide plate is movable with respect to the first slide plate in a linear direction.

4. The apparatus according to claim 2, wherein the micro-adjustment mechanism further includes:
    a first compressive bumper disposed on a side of the first slide plate opposite the first micro-adjustment actuator to stop the first slide plate after actuation of the first micro-adjustment actuator, and a second compressive bumper disposed on a side of the second slide plate opposite the second micro-adjustment actuator to stop the second slide plate after actuation of the second micro-adjustment actuator.

5. The apparatus according to claim 1, wherein the substrate conveyance mechanism is movable in at least two directions.

6. The apparatus according to claim 1, wherein the micro-adjustment actuator is configured to make positional adjustments ranging between 0.5 micron to 5000 microns.

7. The apparatus according to claim 1, wherein the micro-adjustment actuator is configured to make positional adjustments ranging between 1 micron to 1000 microns.

8. The apparatus according to claim 1, wherein the micro-adjustment actuator is configured to make positional adjustments ranging between 5 microns to 50 microns.

9. An apparatus for executing a direct transfer of a semiconductor device die disposed on a first substrate to a second substrate, the apparatus comprising:
- a substrate conveyance mechanism configured to move in one or more directions to convey the first substrate in macro positional adjustments;
- a micro-adjustment mechanism coupled with the substrate conveyance mechanism, the micro-adjustment mechanism configured to further convey the first substrate in micro positional adjustments with respect to the substrate conveyance mechanism, and the micro-adjustment mechanism including:
  - one or more micro-adjustment actuators having a movable distal end, and
  - a substrate holder frame configured to secure the first substrate to be movable via actuation of the one or more micro-adjustment actuators;
- a substrate frame configured to secure the second substrate such that a transfer surface of the second substrate is disposed facing the semiconductor device die disposed on the first substrate; and
- a transfer member that is actuatable to press on the first substrate and transfer the semiconductor device die to the second substrate.

10. The apparatus according to claim 9, wherein the one or more micro-adjustment actuators are controlled to counteract locational inaccuracies of the macro positional adjustments.

11. The apparatus according to claim 9, wherein the micro-adjustment mechanism is configured to adjust a position of the first substrate with respect to the substrate conveyance mechanism while the substrate conveyance mechanism is in motion.

12. The apparatus according to claim 11, wherein the motion of the substrate conveyance mechanism is vibrational motion created when the substrate conveyance mechanism stops after a macro positional adjustment.

13. The apparatus according to claim 11, wherein the motion of the substrate conveyance mechanism is motion created when the substrate conveyance mechanism moves continuously in during the macro positional adjustments.

* * * * *